(12) United States Patent
Shibata et al.

(10) Patent No.: US 12,103,292 B2
(45) Date of Patent: Oct. 1, 2024

(54) LAMINATE AND IMAGE DISPLAY DEVICE

(71) Applicant: FUJIFILM Corporation, Tokyo (JP)

(72) Inventors: Naoya Shibata, Kanagawa (JP); Yuya Hamaguchi, Kanagawa (JP); Takehiro Kasahara, Kanagawa (JP); Naoki Koito, Kanagawa (JP)

(73) Assignee: FUJIFILM Corporation, Toyko (JP)

( * ) Notice: Subject to any disclaimer, the term of this patent is extended or adjusted under 35 U.S.C. 154(b) by 555 days.

(21) Appl. No.: 17/368,034

(22) Filed: Jul. 6, 2021

(65) Prior Publication Data

US 2021/0347149 A1 Nov. 11, 2021

Related U.S. Application Data

(63) Continuation of application No. PCT/JP2020/001185, filed on Jan. 16, 2020.

(30) Foreign Application Priority Data

Jan. 17, 2019 (JP) .............................. JP2019-006448
Feb. 1, 2019 (JP) .............................. JP2019-016664
(Continued)

(51) Int. Cl.
*H10K 50/00* (2023.01)
*B32B 7/023* (2019.01)
(Continued)

(52) U.S. Cl.
CPC .............. *B32B 7/023* (2019.01); *B32B 27/00* (2013.01); *G02B 5/30* (2013.01); *H10K 50/00* (2023.02); *H10K 59/00* (2023.02)

(58) Field of Classification Search
CPC ... B23B 7/023; C09J 7/38; G02B 5/30; G02B 5/3016; G02B 5/3083; G02F 1/13363;
(Continued)

(56) References Cited

U.S. PATENT DOCUMENTS

2002/0140882 A1* 10/2002 Kitagawa .......... G02F 1/133528
349/96
2012/0147304 A1* 6/2012 Yanai ................ G02F 1/133634
349/96
(Continued)

FOREIGN PATENT DOCUMENTS

CN 101236269 A 8/2008
CN 102870039 A 1/2013
(Continued)

OTHER PUBLICATIONS

English Translation for JP-2020106824-A (Jul. 9, 2020) 2020.*
(Continued)

*Primary Examiner* — Omar F Mojaddedi
(74) *Attorney, Agent, or Firm* — Edwards Neils LLC; Jean C. Edwards, Esq.

(57) ABSTRACT

The present invention provides: a laminate which has excellent moisture-heat resistance and includes a light-absorbing anisotropic layer sandwiched between pressure sensitive adhesive layers; and an image display device using the same. The laminate includes a pressure sensitive adhesive layer, a light-absorbing anisotropic layer, and a pressure sensitive adhesive layer in this order, in which the light-absorbing anisotropic layer contains an organic dichroic substance, a thickness of the light-absorbing anisotropic layer is 5 μm or less, the pressure sensitive adhesive layer and the pressure sensitive adhesive layer are each a pressure sensitive adhesive layer at a closest position as viewed from the light-absorbing anisotropic layer in the laminate, and H represented by Expression (I) is 10.0 or less. H=(thickness of pressure sensitive adhesive layer+thickness of pressure sensitive adhesive layer)/total thickness of layers on inner side than pressure sensitive adhesive layer and pressure sensitive adhesive layer.

21 Claims, 1 Drawing Sheet

(30) Foreign Application Priority Data

Jun. 4, 2019 (JP) .............................. JP2019-104483
Jan. 10, 2020 (JP) .............................. JP2020-002941

(51) Int. Cl.

| | | |
|---|---|---|
| B32B 27/00 | (2006.01) | |
| G02B 5/30 | (2006.01) | |
| G02F 1/133 | (2006.01) | |
| H10K 59/00 | (2023.01) | |

(58) Field of Classification Search

CPC . H10K 50/00; H10K 509/00; H10K 509/8792

See application file for complete search history.

(56) References Cited

U.S. PATENT DOCUMENTS

| | | | |
|---|---|---|---|
| 2016/0077267 A1* | 3/2016 | Inagaki | G02F 1/13363 |
| | | | 359/489.07 |
| 2016/0102229 A1* | 4/2016 | Takarada | C09J 7/38 |
| | | | 156/60 |
| 2016/0195660 A1* | 7/2016 | Nakao | G02B 5/3033 |
| | | | 427/164 |
| 2017/0123124 A1 | 5/2017 | Hatanaka et al. | |
| 2018/0348419 A1 | 12/2018 | Iida | |
| 2019/0193374 A1 | 6/2019 | Yamasaki et al. | |
| 2019/0322937 A1 | 10/2019 | Matsuyama et al. | |

FOREIGN PATENT DOCUMENTS

| | | | | |
|---|---|---|---|---|
| CN | 105378519 A | | 3/2016 | |
| JP | 2002-214438 A | | 7/2002 | |
| JP | 2010-150513 A | | 7/2010 | |
| JP | 2012-226343 A | | 11/2012 | |
| JP | 5437744 B2 | | 3/2014 | |
| JP | 2017-083843 A | | 5/2017 | |
| JP | 2017-107177 A | | 6/2017 | |
| JP | 2018-028573 A | | 2/2018 | |
| JP | 2020106824 A | * | 7/2020 | ........... G02B 5/3033 |
| WO | 2013/111672 A1 | | 8/2013 | |
| WO | 2014/065001 A1 | | 5/2014 | |
| WO | 2014/185389 A1 | | 11/2014 | |
| WO | 2018/003416 A1 | | 1/2018 | |
| WO | 2018/124198 A1 | | 7/2018 | |

OTHER PUBLICATIONS

Office Action, issued by the State Intellectual Property Office on Aug. 23, 2023, in connection with Chinese Patent Application No. 202080009110.8.

Office Action, issued by the State Intellectual Property Office on Apr. 24, 2023, in connection with Chinese Patent Application No. 202080009110.8.

Office Action, issued by the Japanese Patent Office on Jul. 5, 2022, in connection with Japanese Patent Application No. 2020-566461.

International Search Report issued in PCT/JP2020/001185 on Mar. 17, 2020.

Written Opinion issued in PCT/JP2020/001185 on Mar. 17, 2020.

International Preliminary Report on Patentability completed by WIPO on Jun. 16, 2021 in connection with International Patent Application No. PCT/JP2020/001185.

Office Action, issued by the State Intellectual Property Office on Sep. 30, 2022, in connection with Chinese Patent Application No. 202080009110.8.

Office Action, issued by the Japanese Patent Office on Apr. 4, 2023, in connection with Japanese Patent Application No. 2020-566461.

Office Action, issued by the State Intellectual Property Office on Nov. 16, 2023, in connection with Chinese Patent Application No. 202080009110.8.

\* cited by examiner

LAMINATE AND IMAGE DISPLAY DEVICE

CROSS-REFERENCE TO RELATED APPLICATIONS

This application is a Continuation of PCT International Application No. PCT/JP2020/001185 filed on Jan. 16, 2020, which was published under PCT Article 21(2) in Japanese, and which claims priority under 35 U.S.C. § 119(a) to Japanese Patent Application No. 2019-006448 filed on Jan. 17, 2019, Japanese Patent Application No. 2019-016664 filed on Feb. 1, 2019, Japanese Patent Application No. 2019-104483 filed on Jun. 4, 2019 and Japanese Patent Application No. 2020-002941 filed on Jan. 10, 2020. The above applications are hereby expressly incorporated by reference, in their entirety, into the present application.

BACKGROUND OF THE INVENTION

1. Field of the Invention

The present invention relates to a laminate and an image display device.

2. Description of the Related Art

In recent years, the thinning of an organic electroluminescent (hereinafter, abbreviated as "EL") display device has been in progress, and further thinning is required for respective members used.

Since the organic EL display device has a high reflectivity, a circularly polarizing plate consisting of a λ/4 plate and a polarizer is used from the viewpoint of preventing the reflection of external light, but thinning is also required for this circularly polarizing plate.

However, an iodine polarizer commonly used for the circularly polarizing plate was produced by dissolving or adsorbing iodine in or onto a high-molecular material such as polyvinyl alcohol to stretch the film at a high ratio in one direction into a shape of a film, and it was difficult to achieve sufficient thinning.

In this regard, a polarizing element in which a dichroic azo coloring agent is applied onto a substrate such as a transparent film and aligned using an intermolecular interaction or the like has been studied.

For example, JP5437744B proposes a polarizing element which has a high concentration of a dichroic azo coloring agent, is a thin film, and has a high degree of polarization.

Moreover, WO2018/124198A proposes a polarizing element having a high degree of alignment by increasing crystallinity of a dichroic azo coloring agent compound using a specific liquid crystalline compound.

SUMMARY OF THE INVENTION

The present inventors have clarified that in a case where a laminate having a layer configuration in which a light-absorbing anisotropic layer is sandwiched between two pressure sensitive adhesive layers is produced in order to adhere the polarizing element (hereinafter, also referred to as a "light-absorbing anisotropic layer") described in JP5437744B, WO2018/124198A, and the like to an image display element or the like, and the laminate is exposed to an environment of a high temperature and a high humidity, wrinkles are generated in the light-absorbing anisotropic layer.

Therefore, an object of the present invention is to provide: a laminate which has excellent moisture-heat resistance and includes a light-absorbing anisotropic layer sandwiched between pressure sensitive adhesive layers; and an image display device using the same.

The present inventors have conducted extensive studies to achieve the object, and as a result, have found that in a configuration in which a light-absorbing anisotropic layer containing an organic dichroic substance is sandwiched between pressure sensitive adhesive layers, by appropriately controlling a total thickness of the pressure sensitive adhesive layers and a total thickness of the layers sandwiched between the pressure sensitive adhesive layers, the object of the present invention can be achieved.

That is, the present inventors have found that the object can be achieved by the following configuration.

[1] A laminate comprising, in the following order: a pressure sensitive adhesive layer 1; a light-absorbing anisotropic layer; and a pressure sensitive adhesive layer 2,
in which the light-absorbing anisotropic layer contains an organic dichroic substance,
a thickness of the light-absorbing anisotropic layer is 5 μm or less,
the pressure sensitive adhesive layer 1 and the pressure sensitive adhesive layer 2 are each a pressure sensitive adhesive layer at a closest position as viewed from the light-absorbing anisotropic layer in the laminate, and
H represented by Expression (1) is 10.0 or less.

$H=$(thickness of pressure sensitive adhesive layer 1+thickness of pressure sensitive adhesive layer 2)/total thickness of layers on inner side than pressure sensitive adhesive layer 1 and pressure sensitive adhesive layer 2     Expression (1)

[2] The laminate as described in [1], in which H represented by Expression (I) is 6.0 or less.
[3] The laminate as described in [1] or [2], in which H represented by Expression (I) is 4.0 or less.
[4] The laminate as described in any one of [1] to [3], in which a storage elastic modulus of at least one of the pressure sensitive adhesive layer 1 or the pressure sensitive adhesive layer 2 is 0.1 MPa or greater.
[5] The laminate as described in [4], in which the storage clastic moduli of both the pressure sensitive adhesive layer 1 and the pressure sensitive adhesive layer 2 are each 0.1 MPa or greater.
[6] The laminate as described in [4] or [5], in which the storage elastic modulus of at least one of the pressure sensitive adhesive layer 1 or the pressure sensitive adhesive layer 2 is 0.5 MPa or greater.
[7] The laminate as described in [6], in which the storage elastic modulus of the pressure sensitive adhesive layer 1 is 0.5 MPa or greater.
[8] The laminate as described in [6], in which the storage elastic moduli of both the pressure sensitive adhesive layer 1 and the pressure sensitive adhesive layer 2 are each 0.5 MPa or greater.
[9] The laminate as described in any one of [1] to [8], in which the thickness of the pressure sensitive adhesive layer 1 is 8 μm or less.
[10] The laminate as described in any one of [1] to [9], in which the thickness of the light-absorbing anisotropic layer is 0.8 μm or less.
[11] The laminate as described in any one of [1] to [10], in which at least one of the pressure sensitive adhesive layer 1 or the pressure sensitive adhesive layer 2 contains a polymer having a repeating unit represented by Formula (A).

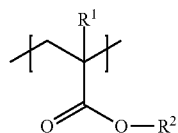
(A)

In Formula (A), $R^1$ represents a hydrogen atom or a methyl group, and $R^2$ represents an alkyl group having 1 to 6 carbon atoms.

[12] The laminate as described in any one of [1] to [11], in which the pressure sensitive adhesive layer 1, the light-absorbing anisotropic layer, a curing-type adhesive layer, an optically anisotropic layer, and the pressure sensitive adhesive layer 2 are provided in this order.

[13] The laminate as described in any one of [1] to [12], in which the pressure sensitive adhesive layer 1, an oxygen shielding layer, a cured layer, the light-absorbing anisotropic layer, a curing-type adhesive layer, an optically anisotropic layer, and the pressure sensitive adhesive layer 2 are provided in this order.

[14] The laminate as described in [13], in which the pressure sensitive adhesive layer 1, the oxygen shielding layer, the cured layer, the light-absorbing anisotropic layer, the curing-type adhesive layer, the optically anisotropic layer, and the pressure sensitive adhesive layer 2 are adjacently provided in this order.

[15] The laminate as described in [13] or [14], in which the curing-type adhesive layer is an ultraviolet ray curing-type adhesive layer.

[16] The laminate as described in any one of [1] to [15], further comprising a surface protective layer which is provided on a side of the pressure sensitive adhesive layer 1 opposite to a side where the light-absorbing anisotropic layer is provided.

[17] An image display device comprising: the laminate as described in any one of [1] to [16]; and an image display element, in which the image display element is disposed on a side of the pressure sensitive adhesive layer 2 opposite to a side where the light-absorbing anisotropic layer is provided.

[18] The image display device as described in [17], in which the image display element is an organic EL display element.

According to the present invention, it is possible to provide: a laminate which has excellent moisture-heat resistance and includes a light-absorbing anisotropic layer sandwiched between pressure sensitive adhesive layers; and an image display device using the same.

DESCRIPTION OF THE PREFERRED EMBODIMENTS

Hereinafter, the present invention will be described in detail.

Description of configuration requirements described below may be made based on representative embodiments of the present invention, but the present invention is not limited to such an embodiment.

In addition, in the present specification, a numerical range expressed using "to" means a range which includes the preceding and succeeding numerical values of "to" as a lower limit value and an upper limit value, respectively.

In the present specification, being parallel, being orthogonal, being horizontal, and being perpendicular do not mean being parallel, being orthogonal, being horizontal, and being perpendicular, in strict meanings, respectively, but mean a range of being parallel±10°, a range of being orthogonal±10°, a range of being horizontal±10°, and a range of being perpendicular±10°, respectively.

In the present specification, as each component, a substance corresponding to each component may be used alone or in combination of two or more kinds thereof. Here, in a case where two or more kinds of substances are used in combination for each component, a content of the component refers to a total content of the substances used in combination unless otherwise specified.

Moreover, in the present specification, "(meth)acrylate" is a notation representing "acrylate" or "methacrylate", "(meth)acryl" is a notation representing "acryl" or "methacryl", and "(meth)acryloyl" is a notation representing "acryloyl" or "methacryloyl".

(Method for Measuring In-Plane Average Refractive Index)

An in-plane average refractive index is measured using a spectroscopic ellipsometer M-2000U manufactured by J. A. Woollam. A direction in which a refractive index is maximum in the plane is defined as an x axis, a direction orthogonal to the direction is defined as a y axis, a normal direction with respect to the in-plane is defined as a z axis, and refractive indices in the respective directions are defined as $n_x$, $n_y$, and $n_z$. The in-plane average refractive index ($n_{ave}$) in the present invention is represented by Expression (1).

$$n_{ave}=(n_x+n_y)/2 \quad \text{Expression (1)}$$

[Laminate]

Figure 1:
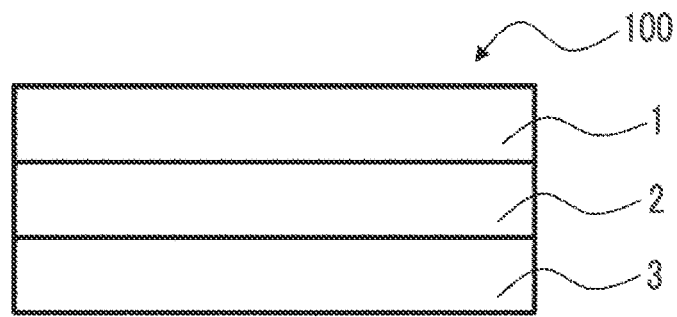
FIG. 1 is a schematic cross-sectional view showing an example of a laminate according to an embodiment of the present invention.

A laminate (100) according to the embodiment of the present invention is a laminate (100) including a pressure sensitive adhesive layer 1 (1), a light-absorbing anisotropic layer (2), and a pressure sensitive adhesive layer 2 (3) in this order, as shown in FIG. 1, in which the light-absorbing anisotropic layer (2) contains an organic dichroic substance, a thickness of the light-absorbing anisotropic layer (2) is 5 µm or less, the pressure sensitive adhesive layer 1 (1) and the pressure sensitive adhesive layer 2 (3) are each a pressure sensitive adhesive layer at a closest position as viewed from the light-absorbing anisotropic layer (2) in the laminate (100), and H (hereinafter, also simply abbreviated as an "H value") represented by Expression (I) is 10.0 or less.

$$H=(\text{thickness of pressure sensitive adhesive layer 1+thickness of pressure sensitive adhesive layer 2})/\text{total thickness of layers on inner side than pressure sensitive adhesive layer 1 and pressure sensitive adhesive layer 2} \quad \text{Expression (1)}$$

Here, the expression "the pressure sensitive adhesive layer 1 and the pressure sensitive adhesive layer 2 are each at a closest position as viewed from the light-absorbing anisotropic layer in the laminate" means that other pressure sensitive adhesive layers are not provided between the pressure sensitive adhesive layer 1 and the pressure sensitive adhesive layer 2. Therefore, for example, in a case where the laminate according to the embodiment of the present invention has three or more pressure sensitive adhesive layers, the pressure sensitive adhesive layer 1 is a pressure sensitive adhesive layer present at a position closest to a side of the light-absorbing anisotropic layer opposite to a side where a pressure sensitive adhesive layer 2 is provided, and the pressure sensitive adhesive layer 2 is a pressure sensitive adhesive layer present at a position closest to a side of the light-absorbing anisotropic layer opposite to a side where a pressure sensitive adhesive layer 1 is provided.

In the present invention, for a reason that the moisture-heat resistance is improved, the H value is preferably 6.0 or less and more preferably 4.0 or less. The lower limit is not particularly limited, but is generally 0.1 or greater.

For a reason that the H value can be reduced, a laminate (200) according to the embodiment of the present invention is preferably the laminate including the pressure sensitive adhesive layer 1, the light-absorbing anisotropic layer, a curing-type adhesive layer, an optically anisotropic layer, and the pressure sensitive adhesive layer 2 in this order.

Figure 2:
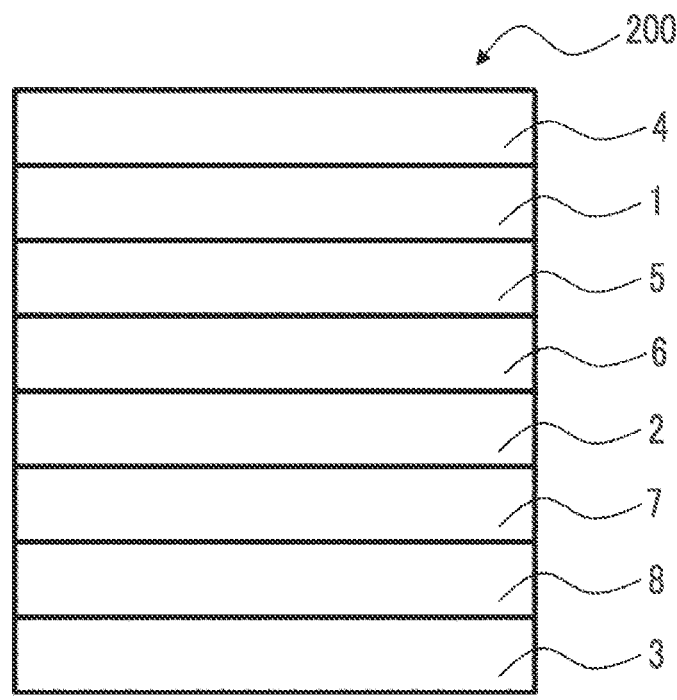
FIG. 2 is a schematic cross-sectional view showing another example of the laminate according to the embodiment of the present invention.

Moreover, for a reason that the H value can be reduced, the laminate (200) according to the embodiment of the present invention is preferably a laminate including the pressure sensitive adhesive layer 1 (1), an oxygen shielding layer (5), a cured layer (6), the light-absorbing anisotropic layer (2), a curing-type adhesive layer (7), an optically anisotropic layer (8), and the pressure sensitive adhesive layer 2 (3) in this order, as shown in FIG. 2, and more preferably a laminate including these layers adjacent to each other.

Furthermore, for a reason that scratch resistance of the surface is improved, it is preferable that the laminate (200) according to the embodiment of the present invention further includes a surface protective layer (4) on a side of the pressure sensitive adhesive layer 1 (1) opposite to a side where the light-absorbing anisotropic layer (2) is provided, as shown in FIG. 2.

[Light-Absorbing Anisotropic Layer]

The light-absorbing anisotropic layer included in the laminate according to the embodiment of the present invention is a light-absorbing anisotropic layer containing an organic dichroic substance and having a thickness of 5 μm or less.

In the present invention, the thickness of the light-absorbing anisotropic layer is preferably 0.1 to 5 μm and more preferably 0.1 to 3 μm. In particular, for a reason that the effect of the present invention is remarkable, the thickness is preferably 0.8 μm or less and more preferably 0.1 to 0.8 μm.

Furthermore, in the present invention, the light-absorbing anisotropic layer is preferably formed of a composition (hereinafter, also referred to as a "composition for forming a light-absorbing anisotropic layer") containing an organic dichroic substance.

<Organic Dichroic Substance>

The organic dichroic substance used in the present invention is not particularly limited.

As the organic dichroic substance, a dichroic azo coloring agent compound is preferable, and a dichroic azo coloring agent compound generally used for a so-called coating-type polarizer can be used. The dichroic azo coloring agent compound is not particularly limited, dichroic coloring agents well known in the related art can be used, but the following compounds are preferably used.

In the present invention, the dichroic azo coloring agent compound means a coloring agent having different absorbancies depending on a direction.

The dichroic azo coloring agent compound may or may not exhibit liquid crystallinity.

In a case where the dichroic am coloring agent compound exhibits the liquid crystallinity, the liquid crystallinity may exhibit any one of nematicity or smecticity. A temperature range showing the liquid crystal phase is preferably room temperature (about 20° C. to 28° C.) to 300° C., and from the viewpoints of handleability and manufacturing suitability, is more preferably 50° C. to 200° C.

In the present invention, from the viewpoint of adjusting a tint, it is preferable that the light-absorbing anisotropic layer at least has at least one kind of coloring agent compound (hereinafter, also simply referred to as a "first dichroic azo coloring agent compound") having a maximum absorption wavelength in a wavelength range of 560 to 700 nm, and at least one kind of coloring agent compound (hereinafter, also simply referred to as a "second dichroic azo coloring agent compound") having a maximum absorption wavelength in a wavelength range of 455 nm or greater and less than 560 nm, and specifically, it is more preferable that the light-absorbing anisotropic layer at least has a dichroic azo coloring agent compound represented by Formula (1) and a dichroic azo coloring agent compound represented by Formula (2).

In the present invention, three or more kinds of dichroic azo coloring agent compounds may be used in combination, and for example, from the viewpoint that a color of the light-absorbing anisotropic layer is close to black, it is preferable that the first dichroic azo coloring agent compound, the second dichroic azo coloring agent compound, and at least one kind of coloring agent compound (hereinafter, also simply referred to as a "third dichroic azo coloring agent compound") having a maximum absorption wavelength in a wavelength range of 380 nm or greater and less than 455 nm (preferably, a wavelength range of 380 to 454 nm) are used in combination.

In the present invention, for a reason that pressing resistance is improved, it is preferable that the dichroic azo coloring agent compound has a crosslinkable group.

Specific examples of the crosslinkable group include a (meth)acryloyl group, an epoxy group, an oxetanyl group, and a styryl group, and among them, a (meth)acryloyl group is preferable.

(First Dichroic Azo Coloring Agent Compound)

The first dichroic azo coloring agent compound is preferably a compound having a chromophore as a core, and a side chain bonded to the end of the chromophore.

Specific examples of the chromophore include an aromatic ring group (for example, an aromatic hydrocarbon group and an aromatic heterocyclic group), and an azo group, a structure having both an aromatic ring group and an azo group is preferable, and a bisazo structure having an aromatic heterocyclic group (preferably, a thienothiazole group) and two azo groups is more preferable.

The side chain is not particularly limited, and examples thereof include a group represented by R2 in Formula (1).

From the viewpoint of adjusting the tint of the polarizer, the first dichroic azo coloring agent compound is preferably a dichroic azo coloring agent compound having a maximum absorption wavelength in a wavelength range of 560 un to 700 nm (more preferably 560 to 650 nm and particularly preferably 560 to 640 nm).

The maximum absorption wavelength (nm) of the dichroic azo coloring agent compound in the present specification is obtained from an ultraviolet-visible light spectrum in a wavelength range of 380 to 800 nm, as measured by a spectrophotometer using a solution obtained by dissolving a dichroic azo coloring agent compound in a good solvent.

In the present invention, for a reason that the degree of alignment of the formed light-absorbing anisotropic layer is further improved, the first dichroic azo coloring agent compound is preferably a compound represented by Formula (1).

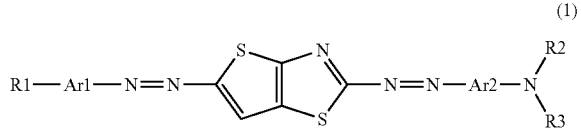

(1)

Ar1 and Ar2 in Formula (1) each independently represent a phenylene group which may have a substituent, or a naphthylene group which may have a substituent, and are preferably phenylene groups.

R1 in Formula (1) represents a hydrogen atom, a linear or branched alkyl group which has 1 to 20 carbon atoms and may have a substituent, an alkoxy group, an alkylthio group, an alkylsulfonyl group, an alkylcarbonyl group, an alkyloxycarbonyl group, an acyloxy group, an alkyl carbonate group, an alkylamino group, an acylamino group, an alkylcarbonylamino group, an alkoxycarbonylamino group, an alkylsulfonylamino group, an alkylsulfamoyl group, an alkylcarbamoyl group, an alkylsulfinyl group, an alkylureido group, an alkyl phosphoric acid amide group, an alkylimino group, or an alkylsilyl group.

—CH$_2$— constituting the alkyl group may be substituted with —O—, —CO—, —C(O)—O—, —O—C(O)—, —Si(CH$_3$)$_2$—O—Si(CH$_3$)$_2$—, —N(R1')—, —N(R1')-CO—, —CO—N(R1')—, —N(R1')—C(O)—O—, —O—C(O)—N(R1')—, —N(R1')—C(O)—N(R1')—, —CH=CH—, —C≡C—, —N=N—, —C(R1')=CH—C(O)—, or —O—C(O)—O—.

In a case where R1 is a group other than a hydrogen atom, a hydrogen atom of the corresponding group may be substituted with a halogen atom, a nitro group, a cyano group, —N(R1')$_2$, an amino group, —C(R1')=C(R1')—NO$_2$, —C(R1')=C(R1')—CN, or —C(R1')=C(CN)$_2$.

R1' represents a hydrogen atom or a linear or branched alkyl group having 1 to 6 carbon atoms. In a case where a plurality of R1''s are present in the corresponding group, the plurality of R1''s may be the same as or different from each other.

R2 and R3 in Formula (1) each independently represent a hydrogen atom, a linear or branched alkyl group which has 1 to 20 carbon atoms and may have a substituent, an alkoxy group, an acyl group, an alkyloxycarbonyl group, an alkylamide group, an alkylsulfonyl group, an aryl group, an arylcarbonyl group, an arylsulfonyl group, an aryloxycarbonyl group, or an arylamide group.

—CH$_2$— constituting the alkyl group may be substituted with —O—, —S—, —C(O)—, —C(O)—O—, —O—C(O)—, —C(O)—S—, —S—C(O)—, —Si(CH$_3$)$_2$—O—Si(CH$_3$)$_2$—, —NR2'—, —NR2'-CO—, —CO—NR2'-, —NR2'-C(O)—O—, —O—C(O)—NR2'-, —NR2'-C(O)—NR2'-, —CH=CH—, —C≡C—, —N=N—, —C(R2')=CH—C(O)—, or —O—C(O)—O—.

In a case where R2 and R3 are each a group other than a hydrogen atom, a hydrogen atom of the corresponding group may be substituted with a halogen atom, a nitro group, a cyano group, an —OH group, —N(R2')$_2$, an amino group, —C(R2')=C(R2')—NO$_2$, —C(R2')=C(R2')—CN, or —C(R2')=C(CN)$_2$.

R2' represents a hydrogen atom or a linear or branched alkyl group having 1 to 6 carbon atoms. In a case where a plurality of R2''s are present in the corresponding group, the plurality of R2''s may be the same as or different from each other.

R2 and R3 may be bonded to each other to form a ring, and R2 or R3 may be bonded to Ar2 to form a ring.

From the viewpoint of light resistance, R1 is preferably an electron-withdrawing group, and R2 and R3 each are preferably a group having low electron-donating properties.

Specific examples of such a group include: as R1, an alkylsulfonyl group, an alkylcarbonyl group, an alkyloxycarbonyl group, an acyloxy group, an alkylsulfonylamino group, an alkylsulfamoyl group, an alkylsulfinyl group, and an alkylureido group; and as R2 and R3, groups having the following structures. Furthermore, the groups having the following structures are shown in a form of including a nitrogen atom to which R2 and R3 are bonded in Formula (1).

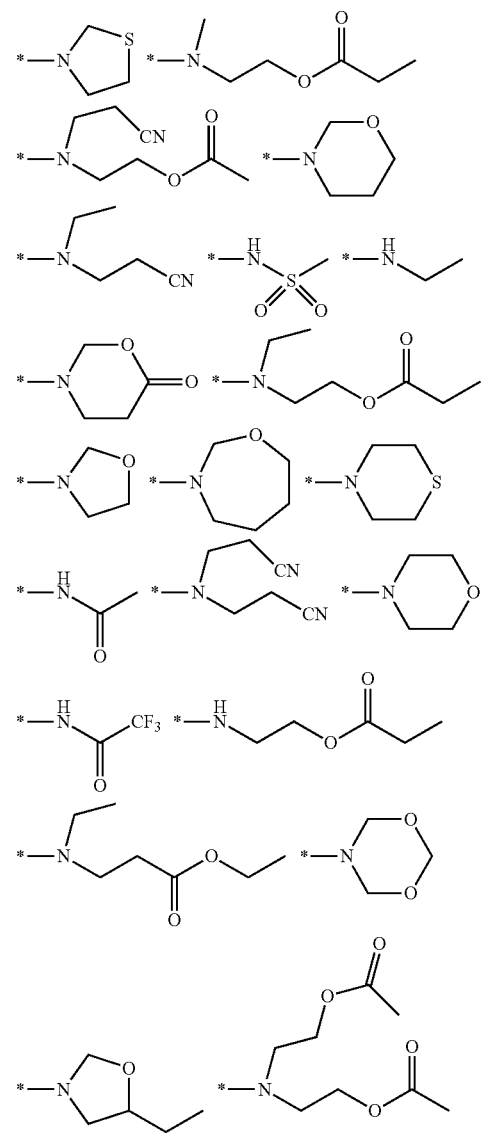

Specific examples of the first dichroic azo coloring agent compound are shown below, but the present invention is not limited to these examples.

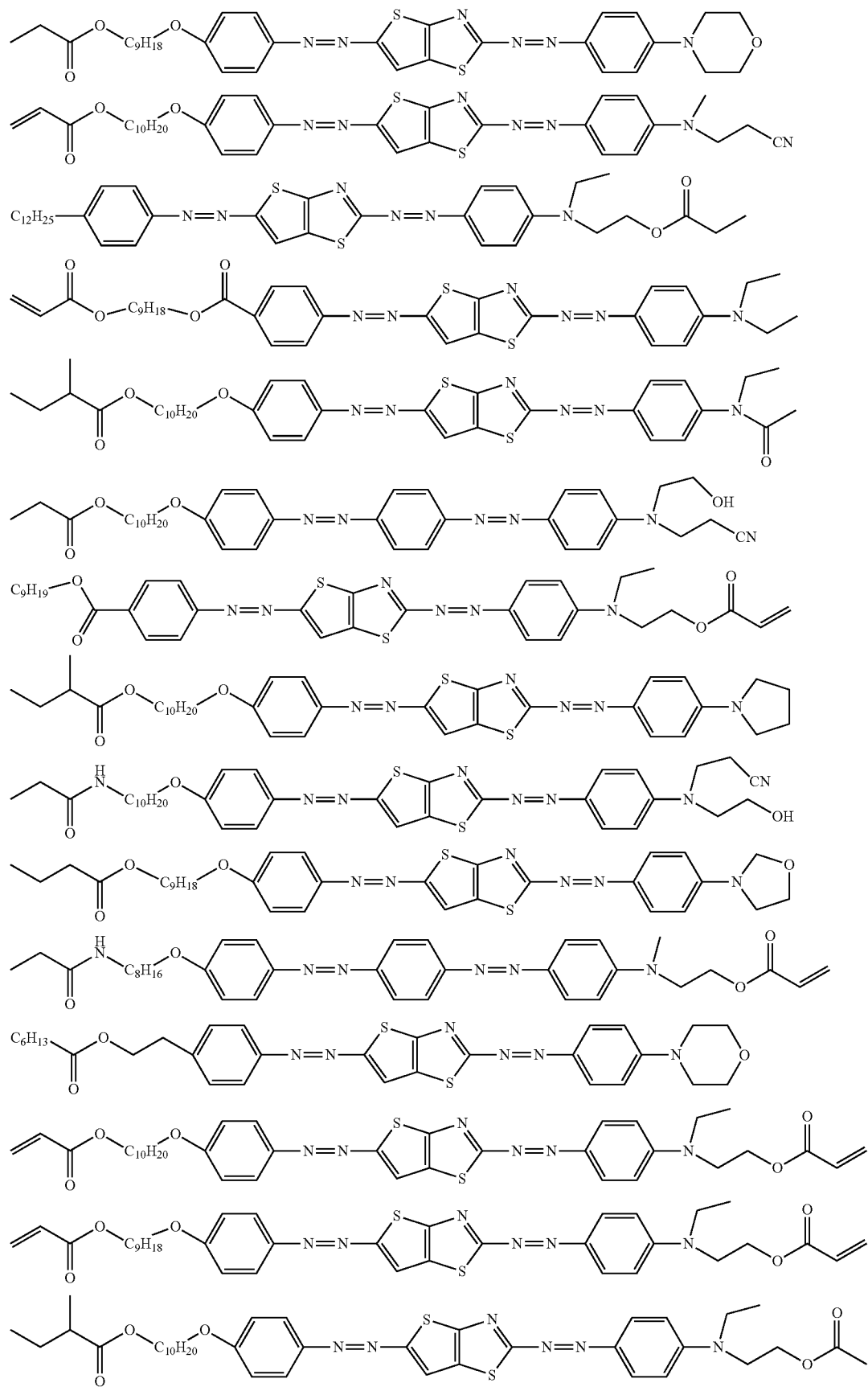

-continued

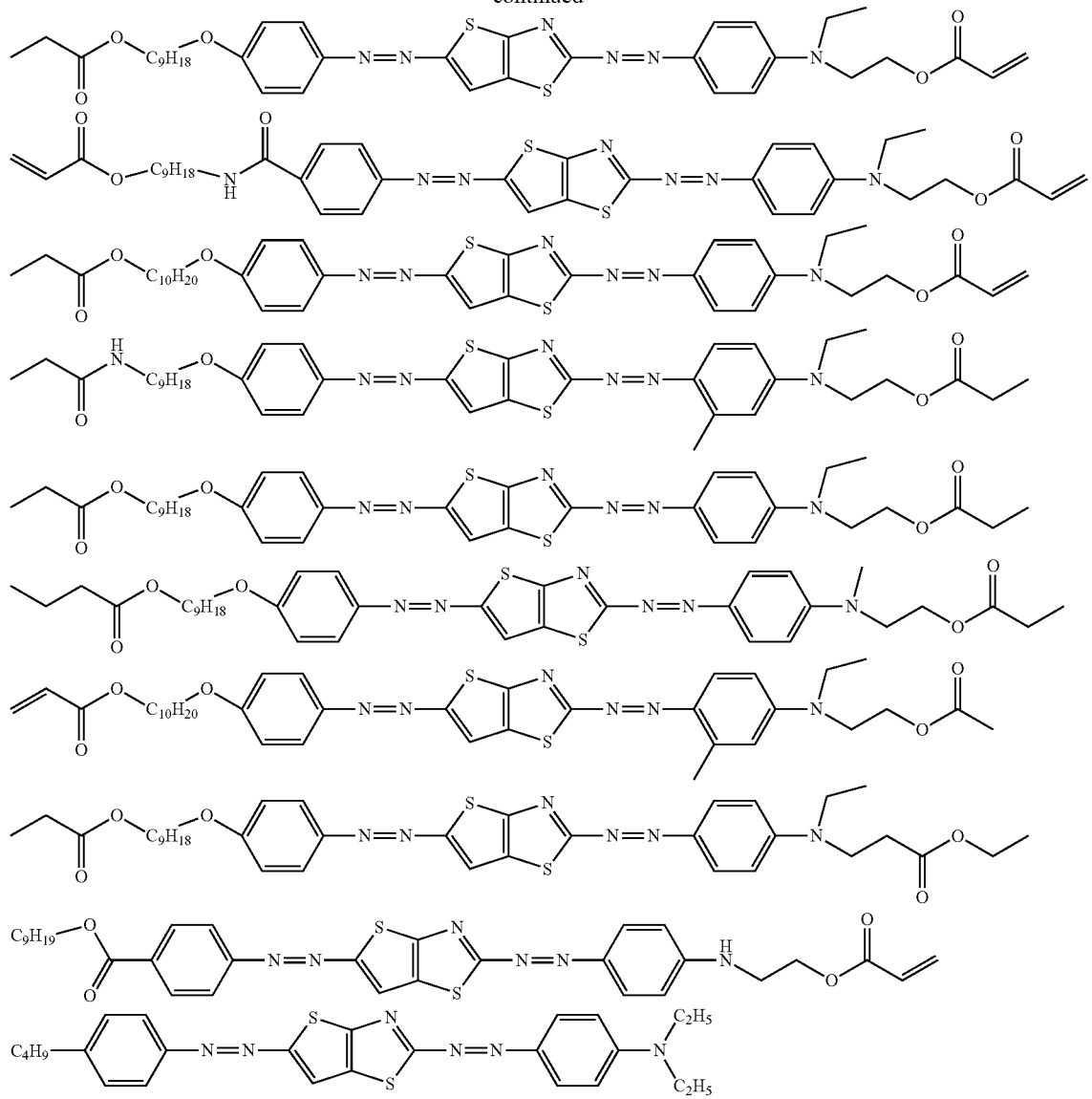

(Second Dichroic Azo Coloring Agent Compound)

The second dichroic azo coloring agent compound is a compound different from the first dichroic azo coloring agent compound, and specifically, chemical structures thereof are different.

The second dichroic azo coloring agent compound is preferably a compound having a chromophore as a core of the dichroic azo coloring agent compound, and a side chain bonded to the end of the chromophore.

Specific examples of the chromophore include an aromatic ring group (for example, an aromatic hydrocarbon group and an aromatic heterocyclic group), and an azo group, a structure having both an aromatic hydrocarbon group and an azo group is preferable, and a bisazo or trisazo structure having an aromatic hydrocarbon group and two or three azo groups is more preferable.

The side chain is not particularly limited, and examples thereof include a group represented by R4, R5, or R6 in Formula (2).

The second dichroic azo coloring agent compound is a dichroic azo coloring agent compound having a maximum absorption wavelength in a wavelength range of 455 nm or greater and less than 560 nm, and from the viewpoint of adjusting a tint of a polarizer, is preferably a dichroic azo coloring agent compound having a maximum absorption wavelength in a wavelength range of 455 to 555 nm and more preferably a dichroic azo coloring agent compound having a maximum absorption wavelength in a wavelength range of 455 to 550 nm.

In particular, in a case where the first dichroic azo coloring agent compound having a maximum absorption wavelength of 560 to 700 nm, and the second dichroic azo coloring agent compound having a maximum absorption wavelength of 455 nm or greater and less than 560 nm are used, the tint of the polarizer is more easily adjusted.

The second dichroic azo coloring agent compound is preferably a compound represented by Formula (2) from the viewpoint that the degree of alignment of the polarizer is further improved.

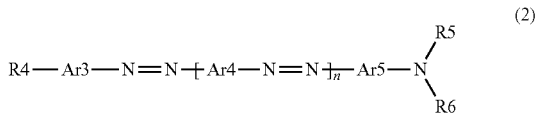 (2)

n in Formula (2) represents 1 or 2.

Ar3, Ar4, and Ar5 in Formula (2) each independently represent a phenylene group which may have a substituent, a naphthylene group which may have a substituent, or a heterocyclic group which may have a substituent.

The heterocyclic group may either aromatic or non-aromatic.

Examples of atoms which constitute the aromatic heterocyclic group and are other than carbon include a nitrogen atom, a sulfur atom, and an oxygen atom. In a case where the aromatic heterocyclic group has a plurality of atoms which constitute a ring and are other than carbon, these atoms may be the same as or different from each other.

Specific examples of the aromatic heterocyclic group include a pyridylene group (pyridine-diyl group), a pyridazine-diyl group, an imidazole-diyl group, a thienylene group (thiophene-diyl group), a quinolylene group (quinoline-diyl group), an isoquinolylene group (isoquinoline-diyl group), an oxazole-diyl group, a thiazole-diyl group, an oxadiazole-diyl group, a benzothiazole-diyl group, a benzothiadiazole-diyl group, a phthalimido-diyl group, a thienothiazole-diyl group, a thiazolothiazole-diyl group, a thienothiophene-diyl group, and a thienooxazole-diyl group.

R4 in Formula (2) has the same definition as R1 in Formula (1).

R5 and R6 in Formula (2) have the same definitions as R2 and R3 in Formula (1), respectively.

From the viewpoint of light resistance, R4 is preferably an electron-withdrawing group, and R5 and R6 each are preferably a group having low electron-donating properties.

Among such groups, the specific example of a case where R4 is an electron-withdrawing group is the same as the specific example of a case where R1 is an electron-withdrawing group, and the specific example of a case where R5 and R6 each are a group having low electron-donating properties is the same as the specific example of a case where R2 and R3 each are a group having low electron-donating properties.

Specific examples of the second dichroic azo coloring agent compound are shown below, but the present invention is not limited to these examples.

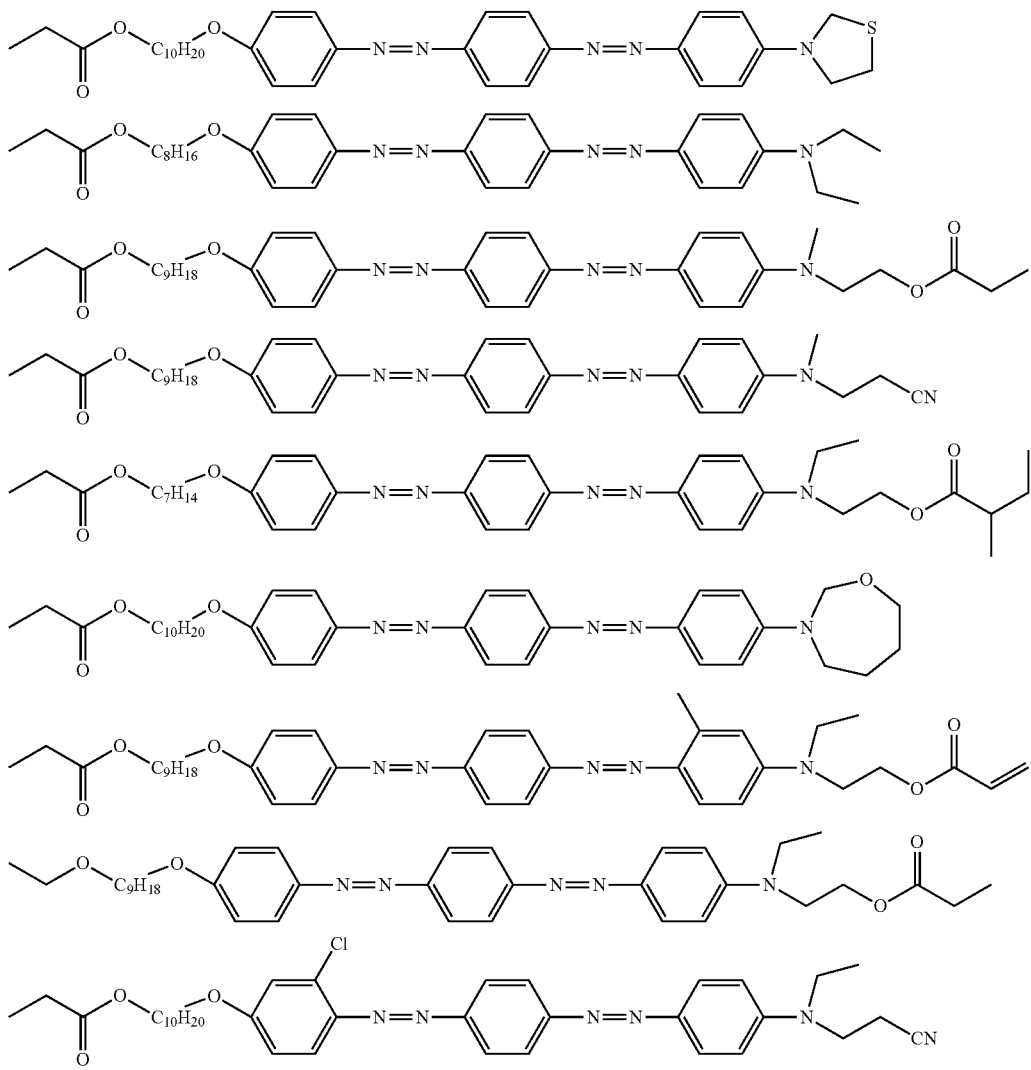

-continued
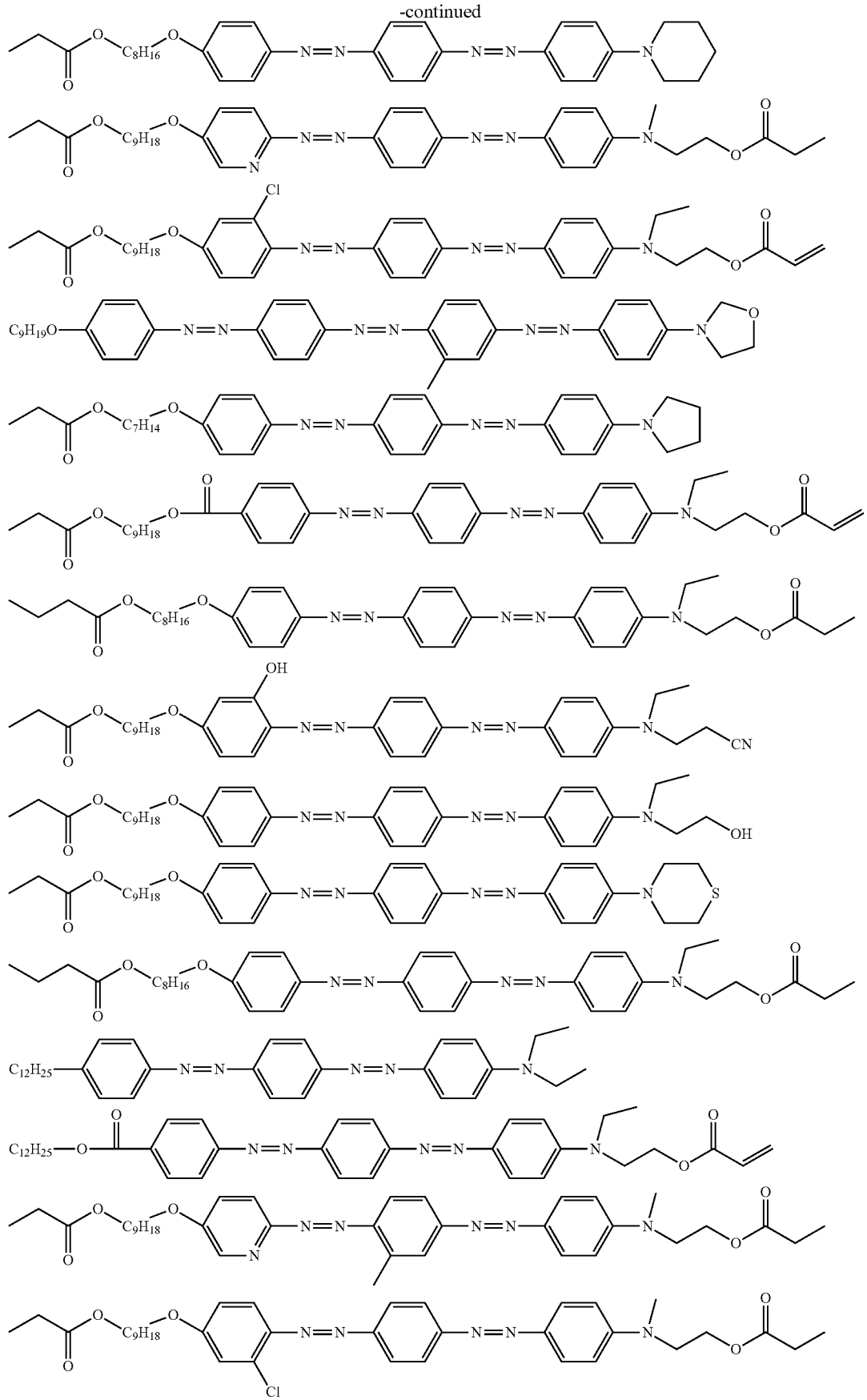

-continued
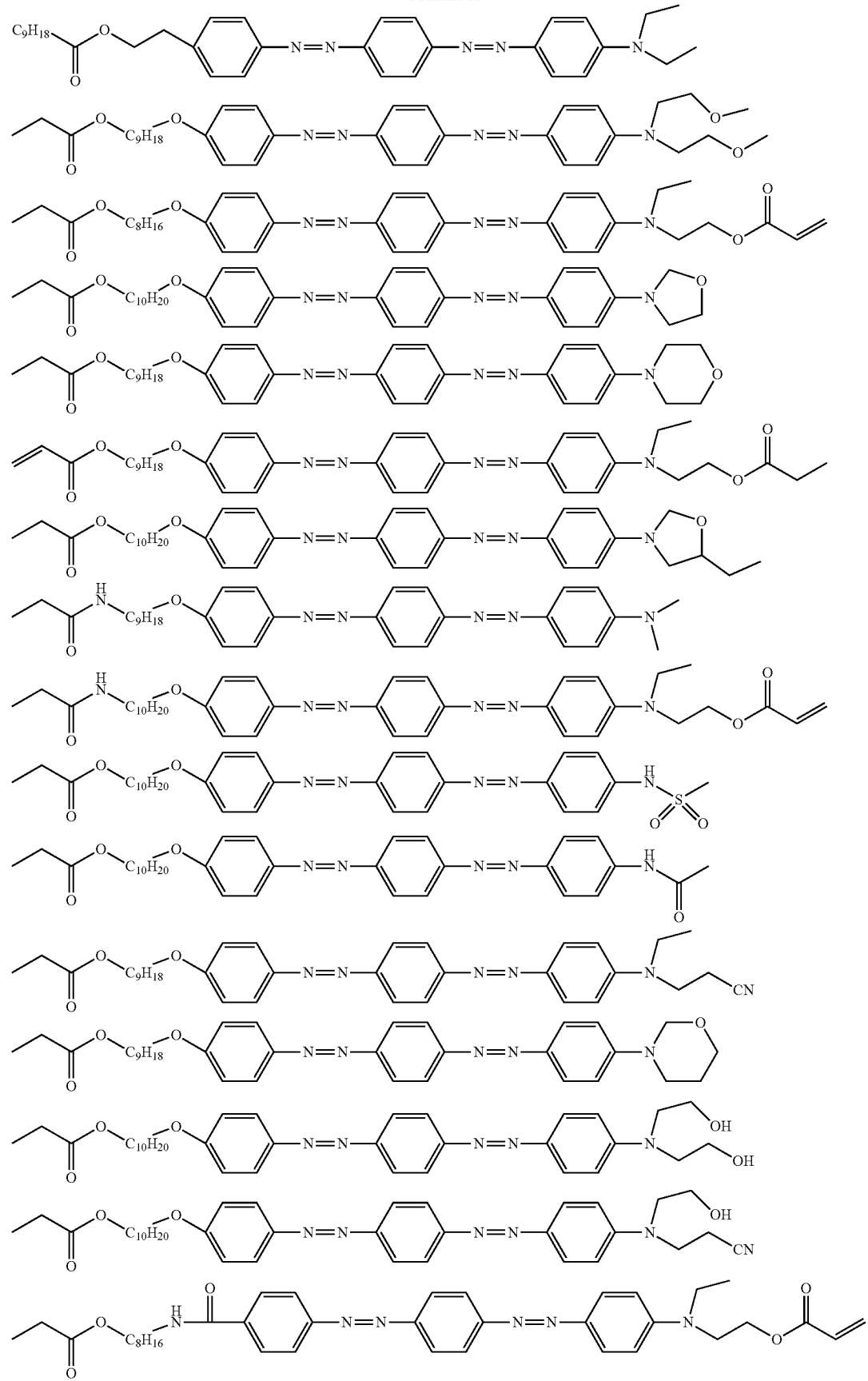

-continued

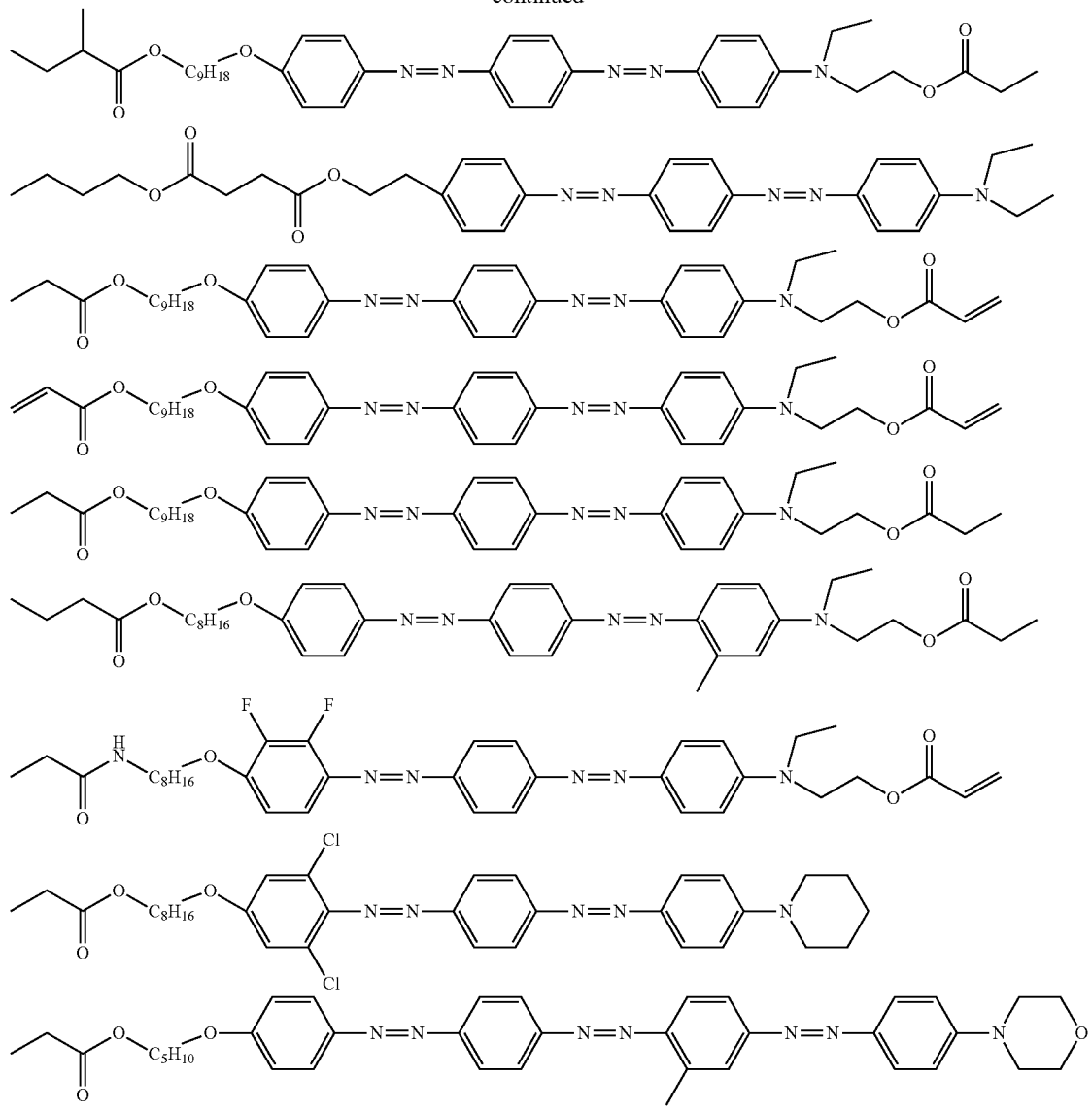

(Difference in Log P Value)

A log P value is an index expressing properties of hydrophilicity and hydrophobicity of a chemical structure. An absolute value (hereinafter, also referred to as a "log P difference") of a difference between a log P value of the side chain of the first dichroic azo coloring agent compound and a log P value of the side chain of the second dichroic azo coloring agent compound is preferably 2.30 or less, more preferably 2.0 or less, still more preferably 1.5 or less, and particularly preferably 1.0 or less. In a case where the log P difference is 2.30 or less, an affinity between the first dichroic azo coloring agent compound and the second dichroic azo coloring agent compound is increased, an arrangement structure is more easily formed, and thus the degree of alignment of the light-absorbing anisotropic layer is further improved.

Furthermore, in a case where a plurality of the side chains of the first dichroic azo coloring agent compound or the second dichroic azo coloring agent compound are present, it is preferable that at least one log P difference satisfies the above value.

Here, each side chain of the first dichroic azo coloring agent compound and the second dichroic azo coloring agent compound means a group bonded to the end of the above-mentioned chromophore. For example, in a case where the first dichroic azo coloring agent compound is the compound represented by Formula (1), R1, R2, and R3 in Formula (1) are side chains, and in a case where the second dichroic azo coloring agent compound is the compound represented by Formula (2), R4, R5, and R6 in Formula (2) are side chains. In particular, in a case where the first dichroic azo coloring agent compound is the compound represented by Formula (1), and the second dichroic azo coloring agent compound is the compound represented by Formula (2), it is preferable that among a difference between log P values of R1 and R4, a difference between log P values of R1 and R5, a difference between log P values of R2 and R4, and a difference between log P values of R2 and R5, at least one log P difference satisfies the above value.

Here, the log P value is an index expressing properties of hydrophilicity and hydrophobicity of a chemical structure, and may be called a hydrophilic-hydrophobic parameter. The log P value can be calculated using software such as ChemBioDraw Ultra or HSPiP (Ver. 4.1.07). Moreover, the log P value can also be obtained experimentally by a method of OECD Guidelines for the Testing of Chemicals, Sections 1, Test No. 117 or the like. In the present invention, unless otherwise specified, a value calculated by inputting a structural formula of a compound into HSPiP (Ver. 4.1.07) is employed as a log P value.

(Third Dichroic Azo Coloring Agent Compound)

The third dichroic azo coloring agent compound is a dichroic azo coloring agent compound other than the first dichroic azo coloring agent compound and the second dichroic azo coloring agent compound, and specifically, has a chemical structure different from those of the first dichroic azo coloring agent compound and the second dichroic azo coloring agent compound. In a case where the light-absorbing anisotropic layer contains the third dichroic azo coloring agent compound, there is an advantage that the tint of the light-absorbing anisotropic layer is easily adjusted.

The maximum absorption wavelength of the third dichroic azo coloring agent compound is 380 nm or greater and less than 455 nm, and is preferably 385 to 454 nm.

Specific examples of the third dichroic azo coloring agent compound include compounds other than the first dichroic azo coloring agent compound and the second dichroic azo coloring agent compound, among compounds represented by Formula (1) described in WO2017/195833A.

Specific examples of the third dichroic azo coloring agent compound are shown below, but the present invention is not limited to these examples. Moreover, in the following specific examples, n represents an integer of 1 to 10.

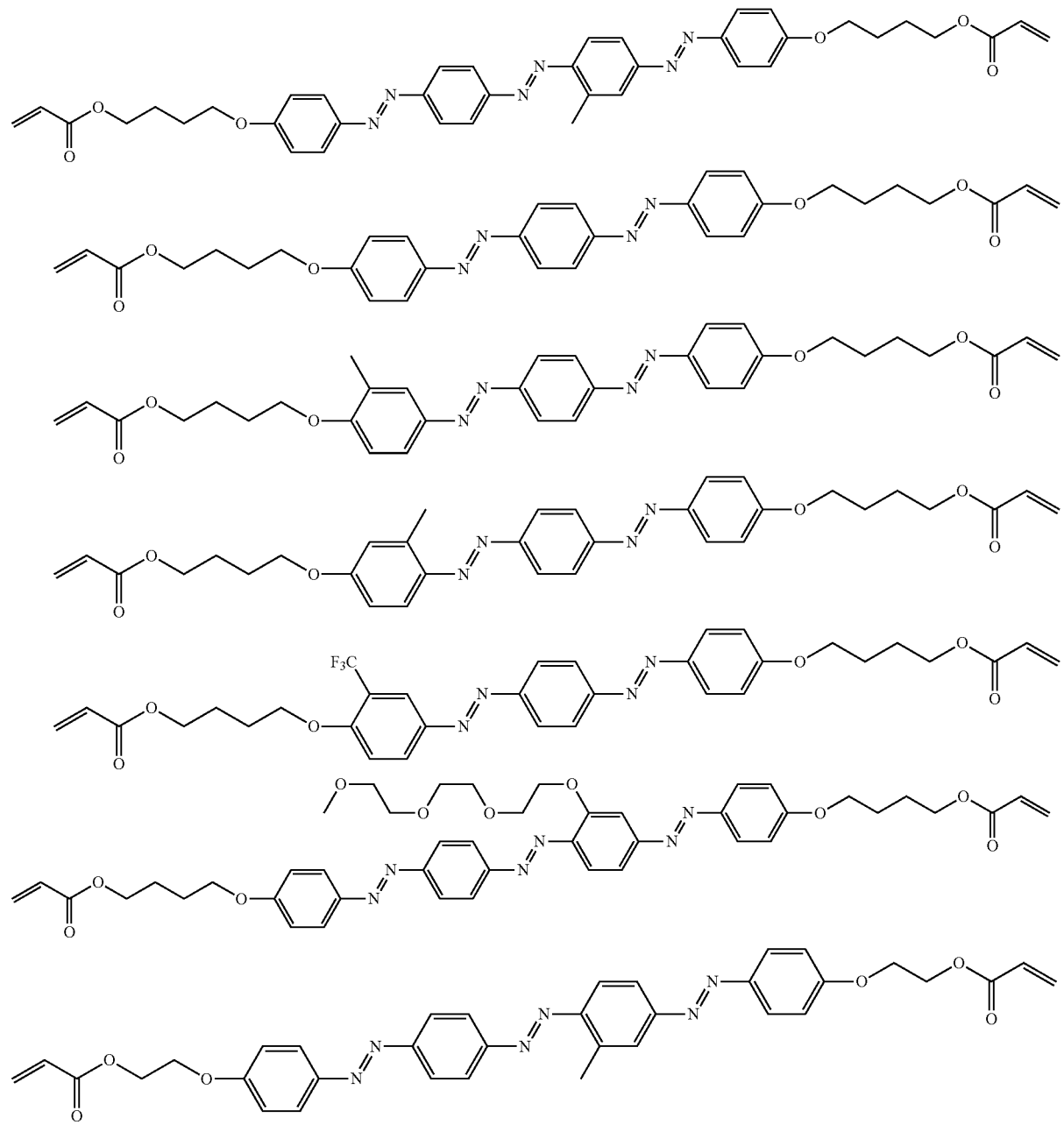

-continued
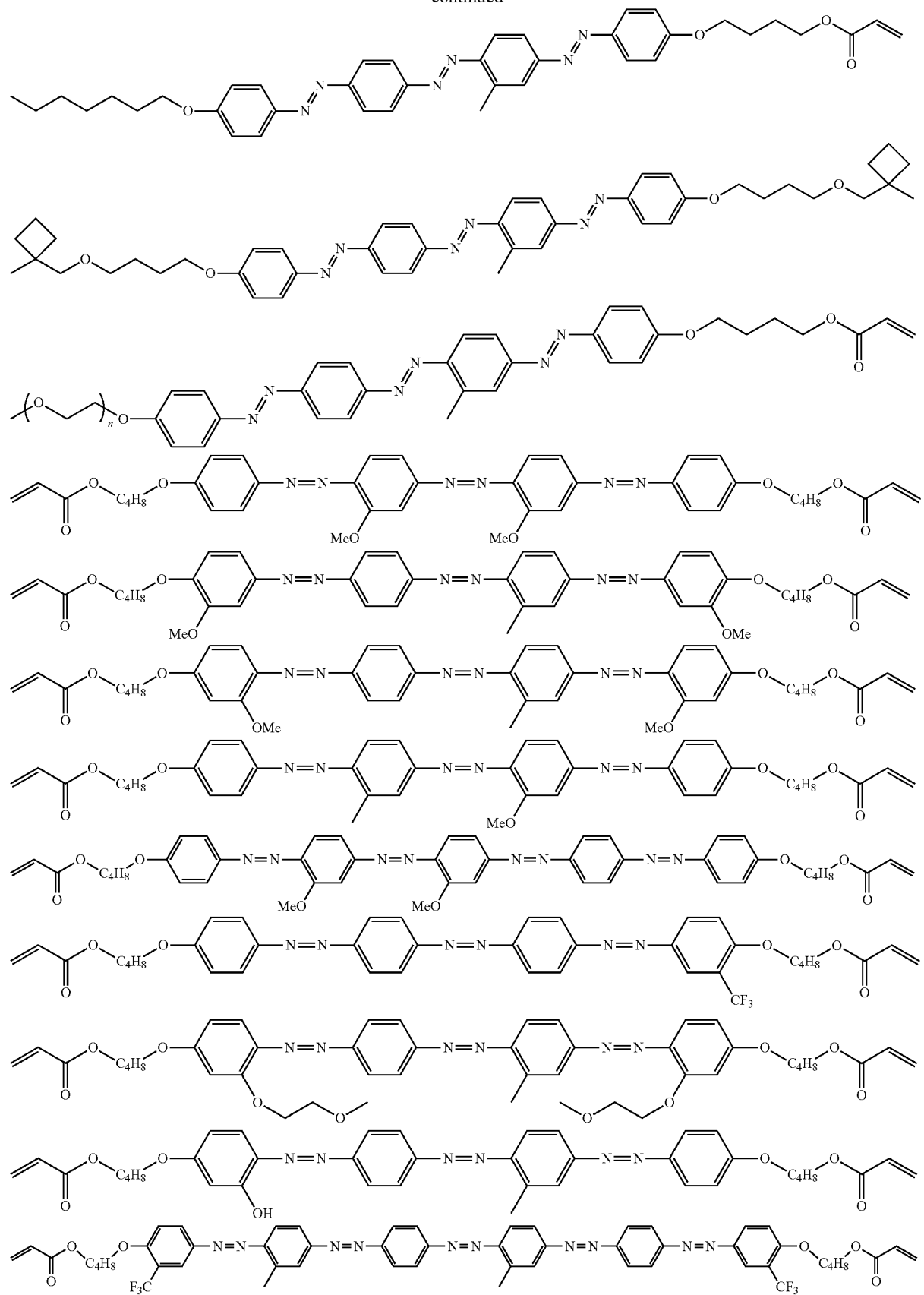

(Content of Dichroic Azo Coloring Agent Compound)

The content of the dichroic azo coloring agent compound is preferably 15% to 30% by mass, more preferably 18% to 28% by mass, and still more preferably 20% to 26% by mass, with respect to the mass of the total solid content of the light-absorbing anisotropic layer. In a case where the content of the dichroic azo coloring agent compound is within the above range, a light-absorbing anisotropic layer having a high degree of alignment can be obtained even in a case where the light-absorbing anisotropic layer is formed into a thin film. Therefore, a light-absorbing anisotropic layer having excellent flexibility is easily obtained. Moreover, in a case where the content is more than 30% by mass, the suppression of the internal reflection by a refractive index-adjusting layer is less likely to occur.

The content of the first dichroic azo coloring agent compound is preferably 40 to 90 parts by mass and more preferably 45 to 75 parts by mass, with respect to 100 parts by mass of the content of all the dichroic azo coloring agent compounds in the composition for forming a light-absorbing anisotropic layer.

The content of the second dichroic azo coloring agent compound is preferably 6 to 50 parts by mass and more preferably 8 to 35 parts by mass, with respect to 100 parts by mass of the content of all the dichroic azo coloring agent compounds in the composition for forming a light-absorbing anisotropic layer.

The content of the third dichroic azo coloring agent compound is preferably 3 to 35 parts by mass and more preferably 5 to 30 parts by mass, with respect to 100 parts by mass of the content of the dichroic azo coloring agent compounds in the composition for forming a light-absorbing anisotropic layer.

The content ratio among the first dichroic azo coloring agent compound, the second dichroic azo coloring agent compound, and the third dichroic azo coloring agent compound used as needed can be optionally set in order to adjust the tint of the light-absorbing anisotropic layer. Here, the content ratio (second dichroic azo coloring agent compound/first dichroic azo coloring agent compound) of the second dichroic azo coloring agent compound to the first dichroic azo coloring agent compound is preferably 0.1 to 10, more preferably 0.2 to 5, and particularly preferably 0.3 to 0.8, in terms of mole. In a case where the content ratio of the second dichroic azo coloring agent compound to the first dichroic azo coloring agent compound is within the above range, the degree of alignment is increased.

<Liquid Crystalline Compound>

The composition for forming a light-absorbing anisotropic layer may contain a liquid crystalline compound. By containing the liquid crystalline compound, the organic dichroic substance (particularly, the dichroic azo coloring agent compound) can be aligned at a high degree of alignment while restraining the organic dichroic substance (particularly, the dichroic azo coloring agent compound) from being precipitated.

The liquid crystalline compound is a liquid crystalline compound that does not exhibit dichroism.

As the liquid crystalline compound, both a low-molecular liquid crystalline compound and a high-molecular liquid crystalline compound can be used, but the high-molecular liquid crystalline compound is more preferable in order to obtain a high degree of alignment. Here, the "low-molecular liquid crystalline compound" refers to a liquid crystalline compound having no repeating unit in the chemical structure. Moreover, the "high-molecular liquid crystalline compound" refers to a liquid crystalline compound having a repeating unit in the chemical structure.

Examples of the low-molecular liquid crystalline compound include the liquid crystalline compound described in JP2013-228706A.

Examples of the high-molecular liquid crystalline compound include the thermotropic liquid crystalline polymer described in JP2011-237513A. Moreover, the high-molecular liquid crystalline compound may have a crosslinkable group (for example, an acryloyl group and a methacryloyl group) at the terminal.

The liquid crystalline compound may be used alone or in combination of two or more kinds thereof.

A content of the liquid crystalline compound is preferably 100 to 600 parts by mass, more preferably 200 to 450 parts by mass, and still more preferably 250 to 400 parts by mass, with respect to 100 parts by mass of the content of the organic dichroic substances (particularly, the dichroic azo coloring agent compounds) in the composition for forming a light-absorbing anisotropic layer. By setting the content of the liquid crystalline compound to be within the above range, a degree of alignment of the light-absorbing anisotropic layer is further improved.

For a reason that the degree of alignment of the organic dichroic substance (particularly, the dichroic azo coloring agent compound) is superior, the liquid crystalline compound is preferably a high-molecular liquid crystalline compound containing a repeating unit (hereinafter, also referred to as a "repeating unit (3-1)") represented by Formula (3-1).

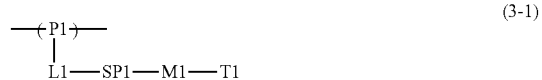

(3-1)

In Formula (3-1), P1 represents a main chain of the repeating unit, L1 represents a single bond or a divalent linking group, SP1 represents a spacer group, M1 represents a mesogenic group, and T1 represents a terminal group.

In the repeating unit (3-1), the difference between the log P value of P1, L1, and SP1 and the log P value of M1 is preferably 4 or greater. The difference is more preferably 4.5 or greater. Since the log P value of the main chain, L1, and the spacer group is separated from the log P value of the mesogenic group by a predetermined value or greater, compatibility between a structure from the main chain to the spacer group, and the mesogenic group is low. Thereby, crystallinity of the high-molecular liquid crystalline compound is increased and it is presumed to be in a state where the degree of alignment of the high-molecular liquid crystalline compound is high. As described above, in a case where the degree of alignment of the high-molecular liquid crystalline compound is high, it is presumed that compatibility between the high-molecular liquid crystalline compound and the organic dichroic substance (particularly, the dichroic azo coloring agent compound) is reduced (that is, crystallinity of the dichroic azo coloring agent compound is improved), and a degree of alignment of the dichroic azo coloring agent compound is improved. As a result, it is thought that the degree of alignment of the obtained light-absorbing anisotropic layer is increased.

Specific examples of the main chain of the repeating unit represented by P1 include groups represented by Formulae (P1-A) to (P1-D), and among them, from the viewpoints of a diversity of monomers used as raw materials and easy handling, a group represented by Formula (P1-A) is preferable.

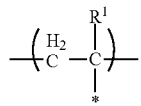 (P1-A)

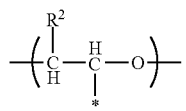 (P1-B)

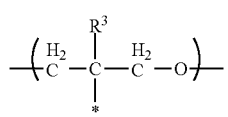 (P1-C)

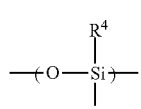 (P1-D)

In Formulae (P1-A) to (P1-D), "*" represents a bonding position to L1 in Formula (3-1).

In Formulae (P1-A) to (P1-D), $R^1$, $R^2$, $R^3$, and $R^4$ each independently represent a hydrogen atom, a halogen atom, a cyano group, an alkyl group having 1 to 10 carbon atoms, or an alkoxy group having 1 to 10 carbon atoms. The alkyl group may be a linear or branched alkyl group, or may be an alkyl group (cycloalkyl group) having a cyclic structure. Moreover, the number of carbon atoms in the alkyl group is preferably 1 to 5.

A group represented by Formula (P1-A) is preferably one unit of a partial structure of poly(meth)acrylic acid ester obtained by polymerization of (meth)acrylic acid ester.

A group represented by Formula (P1-B) is preferably an ethylene glycol unit formed by ring-opening polymerization of an epoxy group of a compound having the epoxy group.

A group represented by Formula (P1-C) is preferably a propylene glycol unit formed by ring-opening polymerization of an oxetane group of a compound having the oxetane group.

A group represented by Formula (P1-D) is preferably a siloxane unit of a polysiloxane obtained by condensation polymerization of a compound having at least one group of an alkoxysilyl group or a silanol group. Here, examples of the compound having at least one group of an alkoxysilyl group or a silanol group include a compound having a group represented by a formula of $SiR^{14}(OR^{15})_2$—. In the formula, $R^{14}$ has the same definition as $R^{14}$ in Formula (P1-D), and a plurality of $R^{15}$'s each independently represent a hydrogen atom or an alkyl group having 1 to 10 carbon atoms.

L1 is a single bond or a divalent linking group.

Examples of the divalent linking group represented by L1 include —C(O)O—, —OC(O)—, —O—, —S—, —C(O)NR$^3$—, —NR$^3$C(O)—, —SO$_2$—, and —NR$^3$R$^4$—. In the formulae, $R^3$ and $R^4$ each independently represent a hydrogen atom, or an alkyl group which has 1 to 6 carbon atoms and may have a substituent.

In a case where P1 is a group represented by Formula (P1-A), for a reason that the degree of alignment of the light-absorbing anisotropic layer is superior, L1 is preferably a group represented by —C(O)O—.

In a case where P1 is a group represented by each of Formulae (P1-B) to (P1-D), for a reason that the degree of alignment of the light-absorbing anisotropic layer is superior, L1 is preferably a single bond.

For a reason of easy exhibition of liquid crystallinity or availability of a raw material, the spacer group represented by SP1 preferably contains at least one kind of structure selected from the group consisting of an oxyethylene structure, an oxypropylene structure, a polysiloxane structure, and an alkylene fluoride structure.

Here, the oxyethylene structure represented by SP1 is preferably a group represented by *—$(CH_2$—$CH_2O)_{n1}$—*. In the formula, n1 represents an integer of 1 to 20, and * represents a bonding position to L1 or M1 in Formula (3-1). For a reason that the degree of alignment of the light-absorbing anisotropic layer is superior, n1 is preferably an integer of 2 to 10, more preferably an integer of 2 to 4, and most preferably 3.

For a reason that the degree of alignment of the light-absorbing anisotropic layer is superior, the oxypropylene structure represented by SP1 is preferably a group represented by *—$(CH(CH_3)$—$CH_2O)_{n2}$—*. In the formula, n2 represents an integer of 1 to 3, and * represents a bonding position to L1 or M1.

For a reason that the degree of alignment of the light-absorbing anisotropic layer is superior, the polysiloxane structure represented by SP1 is preferably a group represented by *—$(Si(CH_3)_2$—$O)_{n3}$—*. In the formula, n3 represents an integer of 6 to 10, and * represents a bonding position to L1 or M1.

For a reason that the degree of alignment of the light-absorbing anisotropic layer is superior, the alkylene fluoride structure represented by SP1 is preferably a group represented by *—$(CF_2$—$CF_2)_{n4}$—*. In the formula, n4 represents an integer of 6 to 10, and * represents a bonding position to L1 or M1.

The mesogenic group represented by M1 is a group indicating a main skeleton of a liquid crystal molecule which contributes to liquid crystal formation. The liquid crystal molecule exhibits liquid crystallinity which is an intermediate state (mesophase) between a crystalline state and an isotropic liquid state. The mesogenic group is not particularly limited, and reference can be made to, for example, "Flussige Kristalle in Tabellen II" (VEB Deutsche Verlag fur Grundstoff Industrie, Leipzig, published in 1984), particularly the descriptions on pages 7 to 16, and Editorial committee of Liquid Crystal Handbook, liquid crystal handbook (Maruzen Publishing Co., Ltd., published in 2000), particularly the descriptions in Chapter 3.

As the mesogenic group, for example, a group having at least one kind of cyclic structure selected from the group consisting of an aromatic hydrocarbon group, a heterocyclic group, and an alicyclic group is preferable.

For a reason that the degree of alignment of the light-absorbing anisotropic layer is superior, the mesogenic group preferably has aromatic hydrocarbon groups, more preferably has two to four aromatic hydrocarbon groups, and still more preferably has three aromatic hydrocarbon groups.

As the mesogenic group, from the viewpoints of exhibition of liquid crystallinity, adjustment of a liquid crystal phase transition temperature, availability of a raw material, and synthesis suitability, and for a reason that the degree of alignment of the light-absorbing anisotropic layer is superior, a group represented by Formula (M1-A) or Formula (M1-B) is preferable, and a group represented by Formula (M1-B) is more preferable.

(M1-A)

(M1-B)

In Formula (M1-A), A1 is a divalent group selected from the group consisting of an aromatic hydrocarbon group, a heterocyclic group, and an alicyclic group. These groups may be substituted with an alkyl group, an alkyl fluoride group, an alkoxy group, or a substituent.

The divalent group represented by A1 is preferably a 4- to 6-membered ring. Moreover, the divalent group represented by A1 may be monocyclic or condensed cyclic.

* represents a bonding position to SP1 or T1.

Examples of the divalent aromatic hydrocarbon group represented by A1 include a phenylene group, a naphthylene group, a fluorene-diyl group, an anthracene-diyl group, and a tetracene-diyl group, and from the viewpoint of a diversity of design of a mesogenic skeleton, availability of a raw material, or the like, a phenylene group or a naphthylene group is preferable and a phenylene group is more preferable.

The divalent heterocyclic group represented by A1 may be either aromatic or non-aromatic, but is preferably a divalent aromatic heterocyclic group from the viewpoint that the degree of alignment is further improved.

Examples of atoms which constitute the divalent aromatic heterocyclic group and are other than carbon include a nitrogen atom, a sulfur atom, and an oxygen atom. In a case where the aromatic heterocyclic group has a plurality of atoms which constitute a ring and are other than carbon, these atoms may be the same as or different from each other.

Specific examples of the divalent aromatic heterocyclic group include a pyridylene group (pyridine-diyl group), a pyridazine-diyl group, an imidazole-diyl group, a thienylene group (thiophene-diyl group), a quinolylene group (quinoline-diyl group), an isoquinolylene group (isoquinoline-diyl group), an oxazole-diyl group, a thiazole-diyl group, an oxadiazole-diyl group, a benzothiazole-diyl group, a benzothiadiazole-diyl group, a phthalimido-diyl group, a thienothiazole-diyl group, a thiazolothiazole-diyl group, a thienothiophene-diyl group, and a thienooxazole-diyl group.

Specific examples of the divalent alicyclic group represented by A1 include a cyclopentylene group and a cyclohexylene group.

In Formula (M1-A), a1 represents an integer of 1 to 10. In a case where a1 is 2 or more, a plurality of A1's may be the same as or different from each other.

In Formula (M1-B), A2 and A3 are each independently a divalent group selected from the group consisting of an aromatic hydrocarbon group, a heterocyclic group, and an alicyclic group. Specific examples and suitable aspects of A2 and A3 are the same as those of A1 in Formula (M1-A), and thus descriptions thereof will be omitted.

In Formula (M1-B), a2 represents an integer of 1 to 10, and in a case where a2 is 2 or more, a plurality of A2's may be the same as or different from each other, a plurality of A3's may be the same as or different from each other, and a plurality of LA1's may be the same as or different from each other. For a reason that the degree of alignment of the light-absorbing anisotropic layer is superior, a2 is preferably an integer of 2 or more and more preferably 2.

In Formula (M1-B), in a case where a2 is 1, LA1 is a divalent linking group. In a case where a2 is 2 or more, the plurality of LA1's are each independently a single bond or a divalent linking group, and at least one among the plurality of LA1's is a divalent linking group. In a case where a2 is 2, for a reason that the degree of alignment of the light-absorbing anisotropic layer is superior, it is preferable that one of two LA1's is a divalent linking group and the other is a single bond.

In Formula (M1-B), examples of the divalent linking group represented by LA1 include —O—, —(CH$_2$)$_g$—, —(CF$_2$)$_g$—, —Si(CH$_3$)$_2$—, —(Si(CH$_3$)$_{20}$)$_g$—, —(OSi(CH$_3$)$_2$)$_g$— (g represents an integer of 1 to 10), —N(Z)—, —C(Z)=C(Z')—, —C(Z)=N—, —N—C(Z)—, —C(Z)$_2$—C(Z')$_2$—, —C(O)—, —OC(O)—, —C(O)O—, —O—C(O)O—, —N(Z)C(O)—, —C(O)N(Z)—, —C(Z)=C(Z')—C(O)O—, —O—C(O)—C(Z)=C(Z')—, —C(Z)—N—, —N=C(Z)—, —C(Z)=C(Z')—C(O)N(Z'')—, —N(Z'')—C(O)—C(Z)—C(Z')—, —C(Z)—C(Z')—C(O)—S—, —S—C(O)—C(Z)—C(Z')—, —C(Z)=N—N=C(Z')— (Z, Z', and Z'' independently represent hydrogen, a C1 to C4 alkyl group, a cycloalkyl group, an aryl group, a cyano group, or a halogen atom), —C≡C—, —N=N—, —S—, —S(O)—, —S(O)(O)—, —(O)S(O)O—, —O(O)S(O)O—, —SC(O)—, and —C(O)S—.

Among them, for a reason that the degree of alignment of the light-absorbing anisotropic layer is superior, —C(O)O— is preferable.

LA1 may be a group obtained by combining two or more of these groups.

Specific examples of M1 include the following structures. Moreover, in the following specific examples, "Ac" represents an acetyl group.

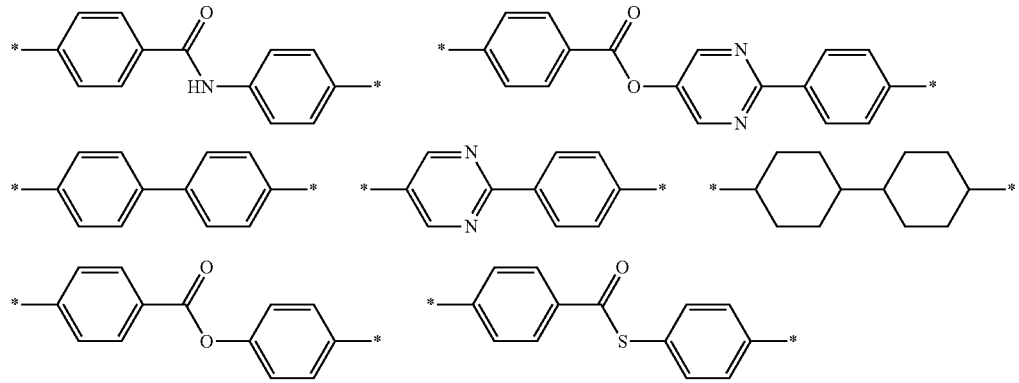

-continued
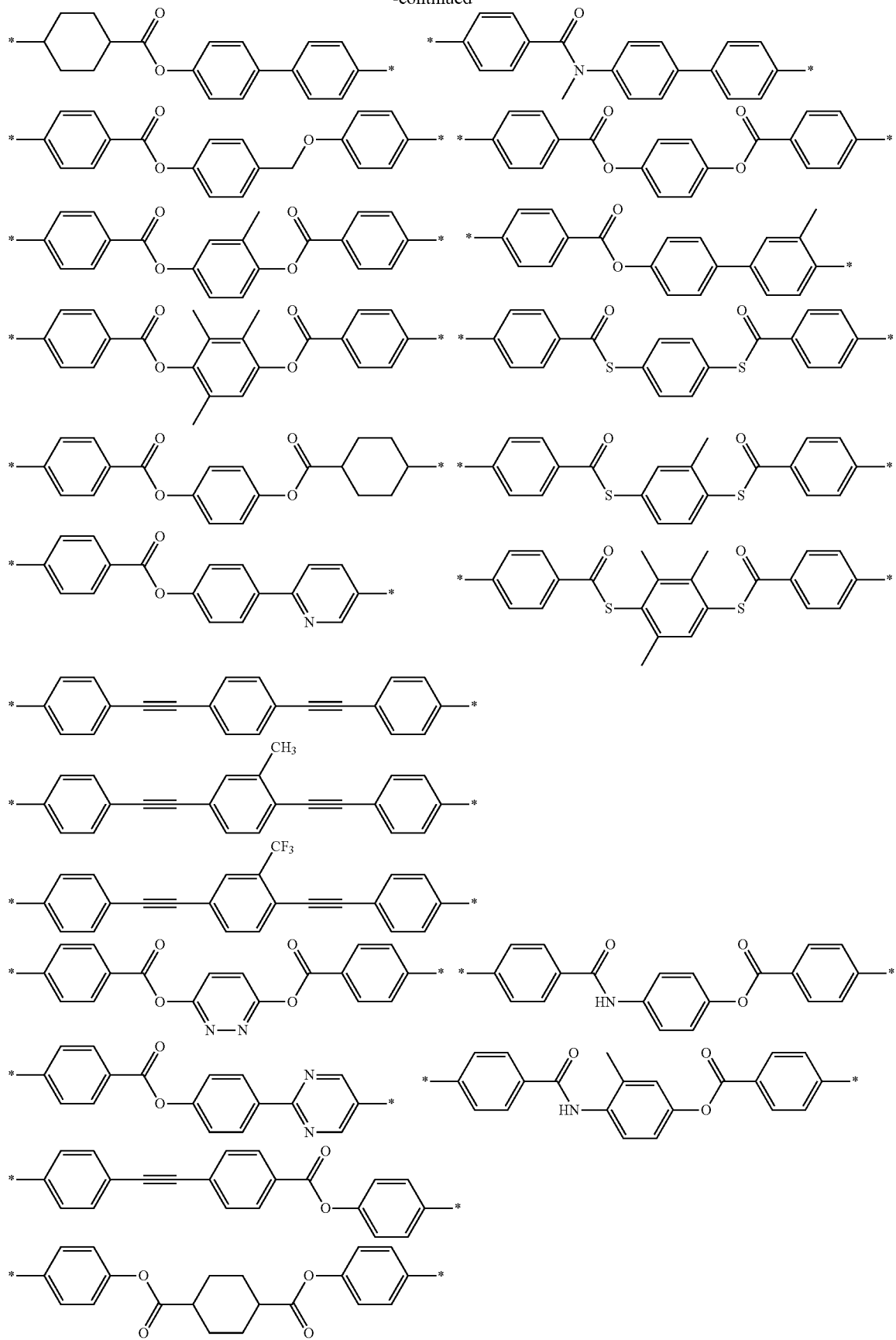

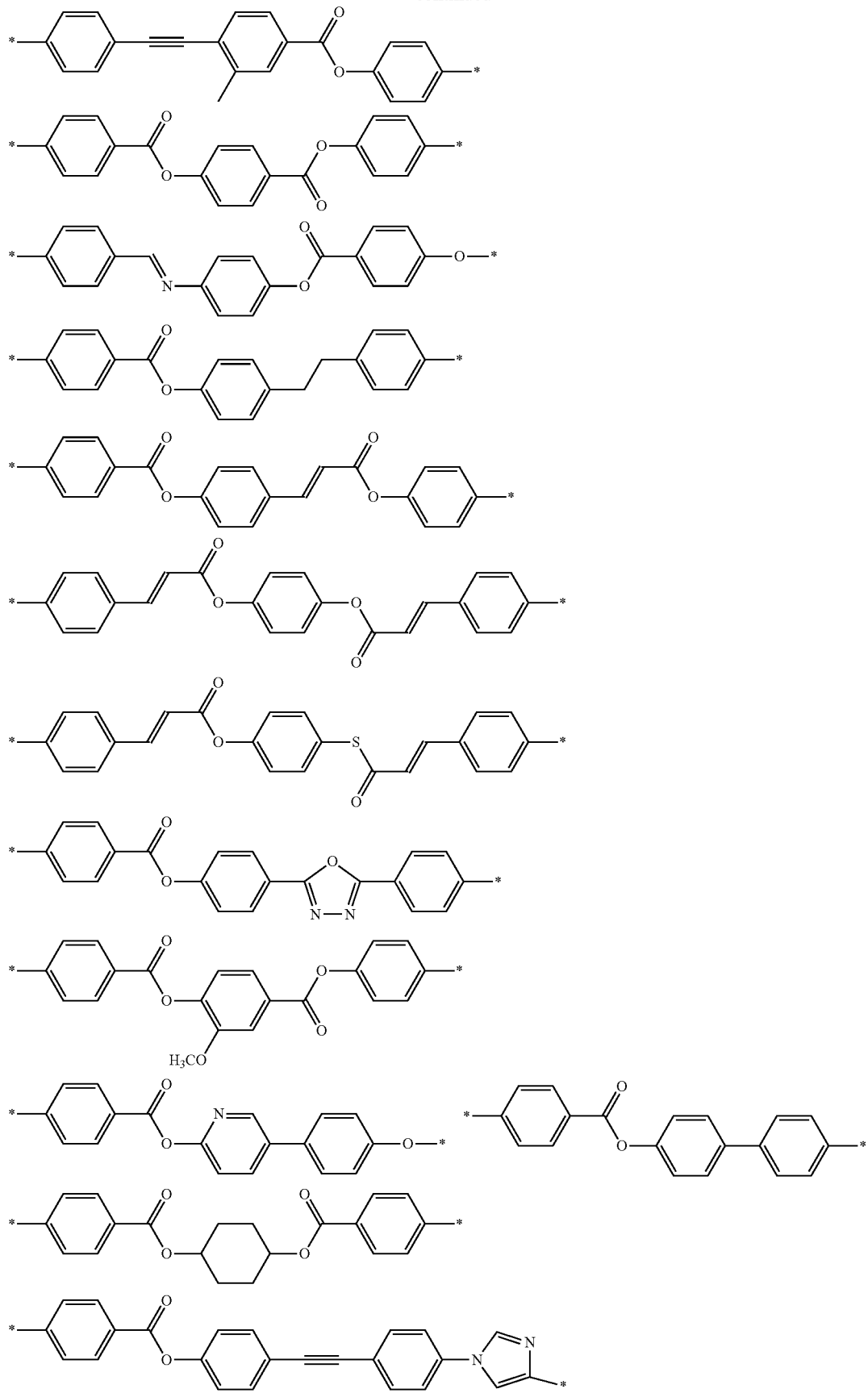

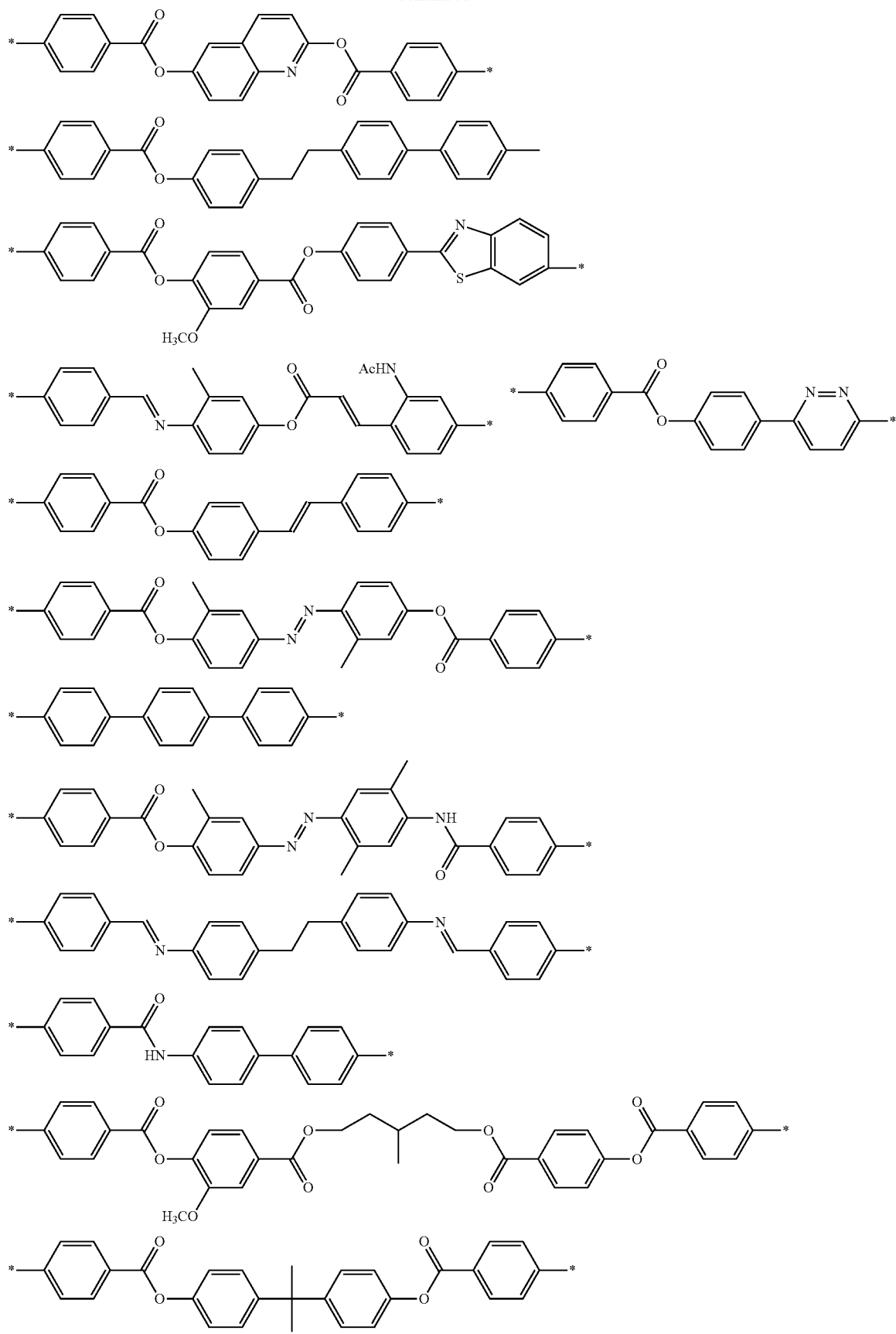

-continued
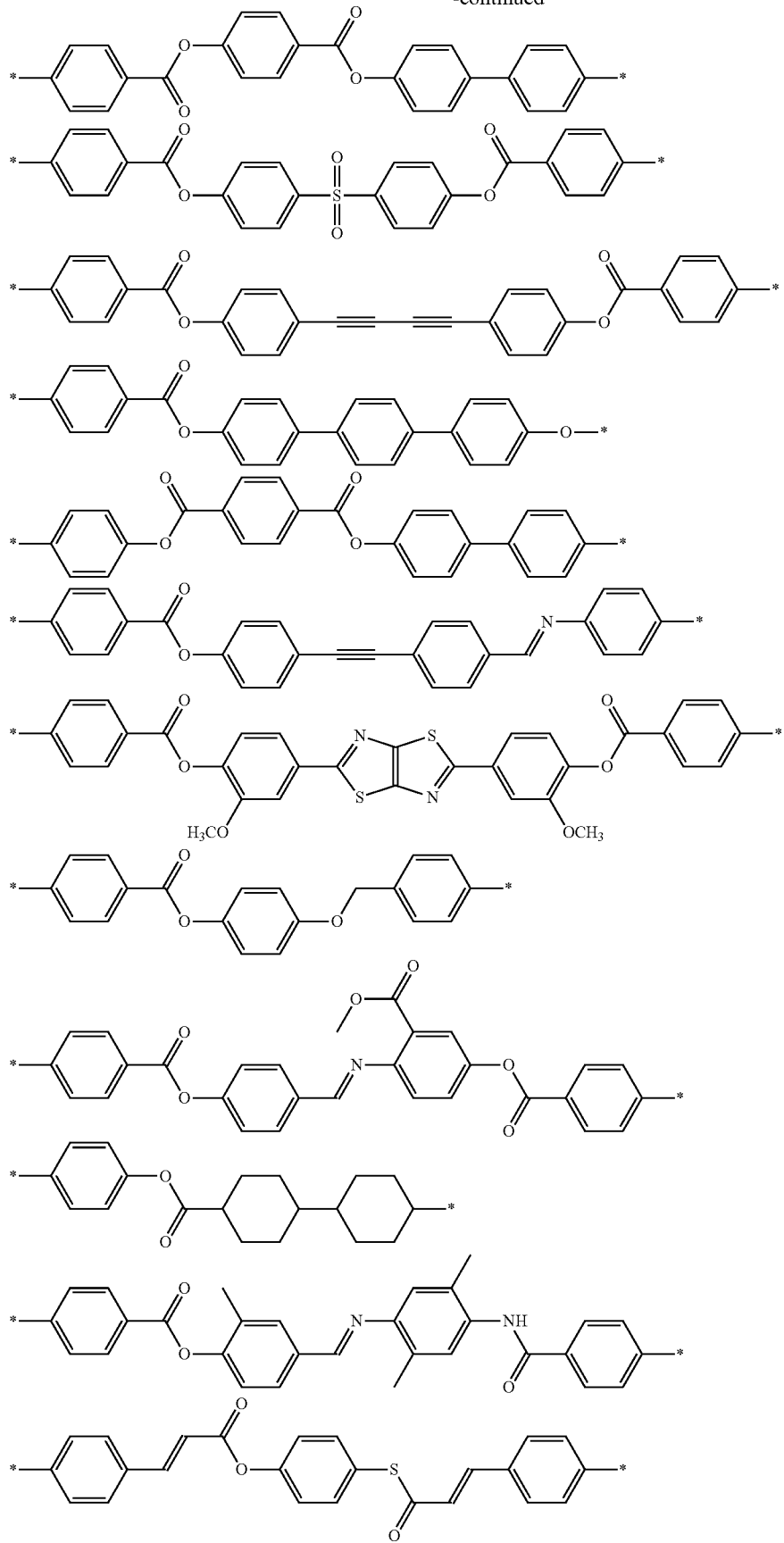

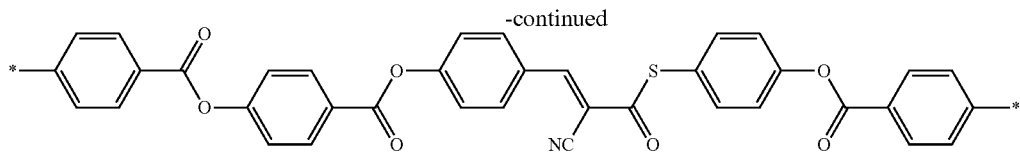

Examples of the terminal group represented by T1 include a hydrogen atom, a halogen atom, a cyano group, a nitro group, a hydroxy group, an alkyl group having 1 to 10 carbon atoms, an alkoxy group having 1 to 10 carbon atoms, an alkylthio group having 1 to 10 carbon atoms, an alkoxycarbonyloxy group having 1 to 10 carbon atoms, an alkoxycarbonyl group (ROC(O)—: R is an alkyl group) having 1 to 10 carbon atoms, an acyloxy group having 1 to 10 carbon atoms, an acylamino group having 1 to 10 carbon atoms, an alkoxycarbonylamino group having 1 to 10 carbon atoms, a sulfonylamino group having 1 to 10 carbon atoms, a sulfamoyl group having 1 to 10 carbon atoms, a carbamoyl group having 1 to 10 carbon atoms, a sulfinyl group having 1 to 10 carbon atoms, a ureido group having 1 to 10 carbon atoms, and a (meth)acryloyloxy group-containing group. Examples of the (meth)acryloyloxy group-containing group include a group represented by -L-A (L represents a single bond or a linking group; specific examples of the linking group are the same as those of L1 and SP1; and A represents a (meth)acryloyloxy group).

For a reason that the degree of alignment of the light-absorbing anisotropic layer is superior, T1 is preferably an alkoxy group having 1 to 10 carbon atoms, more preferably an alkoxy group having 1 to 5 carbon atoms, and still more preferably a methoxy group. These terminal groups may be further substituted with these groups or the polymerizable group described in JP2010-244038A.

For a reason that the degree of alignment of the light-absorbing anisotropic layer is superior, the number of atoms in the main chain of T1 is preferably 1 to 20, more preferably 1 to 15, still more preferably 1 to 10, and particularly preferably 1 to 7. In a case where the number of atoms in the main chain of T1 is 20 or less, the degree of alignment of the light-absorbing anisotropic layer is further improved. Here, the "main chain" in T1 means the longest molecular chain bonded to M1, and the number of hydrogen atoms is not counted as the number of atoms in the main chain of T1. For example, in a case where T1 is an n-butyl group, the number of atoms in the main chain is 4, and in a case where T1 is a sec-butyl group, the number of atoms in the main chain is 3.

A content of the repeating unit (3-1) is preferably 20% to 100% by mass with respect to 100% by mass of all the repeating units in the high-molecular liquid crystalline compound, for a reason that the degree of alignment of the light-absorbing anisotropic layer is superior.

In the present invention, a content of each repeating unit contained in the high-molecular liquid crystalline compound is calculated based on a charged amount (mass) of each monomer used to obtain each repeating unit.

The high-molecular liquid crystalline compound may contain one kind of repeating unit (3-1) alone, or two or more kinds thereof. In a case where the high-molecular liquid crystalline compound contains two or more kinds of the repeating units (3-1), there are advantages such as improvement in a solubility of the high-molecular liquid crystalline compound in a solvent and easy adjustment of the liquid crystal phase transition temperature. In a case where two or more kinds of the repeating units (3-1) are contained, a total amount thereof is preferably within the above range.

In a case where the high-molecular liquid crystalline compound contains two kinds of the repeating units (3-1), for a reason that the degree of alignment of the light-absorbing anisotropic layer is superior, it is preferable that the terminal group represented by T1 in one repeating unit (repeating unit A) is an alkoxy group, and the terminal group represented by T1 in the other repeating unit (repeating unit B) is a group other than an alkoxy group.

For a reason that the degree of alignment of the light-absorbing anisotropic layer is superior, the terminal group represented by T1 in the repeating unit B is preferably an alkoxycarbonyl group, a cyano group, or a (meth)acryloyloxy group-containing group, and more preferably an alkoxycarbonyl group or a cyano group.

A ratio (A/B) of the content of the repeating unit A in the high-molecular liquid crystalline compound to the content of the repeating unit B in the high-molecular liquid crystalline compound is preferably 50150 to 95/5, more preferably 60/40 to 93/7, and still more preferably 70/30 to 90/10, for a reason that the degree of alignment of the light-absorbing anisotropic layer is superior.

<Repeating Unit (3-2)>

The high-molecular liquid crystalline compound of the present invention may further contain a repeating unit (in the present specification, also referred to as a "repeating unit (3-2)") represented by Formula (3-2). Thereby, there are advantages such as improvement in a solubility of the high-molecular liquid crystalline compound in a solvent and easy adjustment of the liquid crystal phase transition temperature.

The repeating unit (3-2) differs from the repeating unit (3-1) in that the repeating unit (3-2) has at least no mesogenic group.

In a case where the high-molecular liquid crystalline compound contains the repeating unit (3-2), the high-molecular liquid crystalline compound is a copolymer of the repeating unit (3-1) and the repeating unit (3-2) (furthermore, may be a copolymer containing the repeating units A and B), and may be any polymer such as a block polymer, an alternating polymer, a random polymer, and a graft polymer.

(3-2)

In Formula (3-2), P3 represents a main chain of the repeating unit, L3 represents a single bond or a divalent linking group, SP3 represents a spacer group, and T3 represents a terminal group.

Specific examples of P3, L3, SP3, and T3 in Formula (3-2) are the same as those of P1, L1, SP1, and T1 in Formula (3-1).

Here, T3 in Formula (3-2) preferably has a polymerizable group from the viewpoint that the hardness of the light-absorbing anisotropic layer is improved.

In a case where the repeating unit (3-2) is contained, a content thereof is preferably 0.5% to 40% by mass and more preferably 1% to 30% by mass, with respect to 100% by mass of all the repeating units in the high-molecular liquid crystalline compound.

The high-molecular liquid crystalline compound may contain one kind of repeating unit (3-2) alone, or two or more kinds thereof. In a case where two or more kinds of the repeating units (3-2) are contained, a total amount thereof is preferably within the above range.

(Weight-Average Molecular Weight)

A weight-average molecular weight (Mw) of the high-molecular liquid crystalline compound is preferably 1,000 to 500,000 and more preferably 2,000 to 300,000, for a reason that the degree of alignment of the light-absorbing anisotropic layer is superior. In a case where the Mw of the high-molecular liquid crystalline compound is within the above range, handling of the high-molecular liquid crystalline compound is easy.

In particular, from the viewpoint of suppression of cracks during application, the weight-average molecular weight (Mw) of the high-molecular liquid crystalline compound is preferably 10,000 or more and more preferably 10,000 to 300,000.

Furthermore, from the viewpoint of a temperature latitude of the degree of alignment, the weight-average molecular weight (Mw) of the high-molecular liquid crystalline compound is preferably less than 10,000 and more preferably 2,000 or more and less than 10,000.

Here, the weight-average molecular weight and the number-average molecular weight in the present invention are values measured by a gel permeation chromatography (GPC) method.

Solvent (eluent): N-Methylpyrrolidone
Device name: TOSOH HLC-8220GPC
Column: Three TOSOH TSKgel Super AWM-H (6 mm×15 cm) are connected and used
Column temperature: 25° C.
Sample concentration: 0.1% by mass
Flow rate: 0.35 mL/min
Calibration curve: Calibration curve obtained by seven samples, which have Mw of 2,800,000 to 1,050 (Mw/Mn=1.03 to 1.06), of TSK standard polystyrene produced by Tosoh Corporation is used

[Pressure Sensitive Adhesive Layer]

The pressure sensitive adhesive layer 1 and the pressure sensitive adhesive layer 2 (hereinafter, simply referred to as a "pressure sensitive adhesive layer" in a case where no distinction is made between these pressure sensitive adhesive layers) included in the laminate according to the embodiment of the present invention are not particularly limited as long as these pressure sensitive adhesive layers are generally used for adhesion of a phase difference film or a display element.

Moreover, the thicknesses, materials, and the like of the pressure sensitive adhesive layer 1 and the pressure sensitive adhesive layer 2 may be the same as or different from each other.

Here, the pressure sensitive adhesive contained in the pressure sensitive adhesive layer is a viscoelastic body which exhibits adhesiveness simply by applying force after adhesion, and does not include the following adhesive which exhibits adhesiveness by being dried or reacted after adhesion.

Examples of the pressure sensitive adhesive used for the pressure sensitive adhesive layer include a rubber-based pressure sensitive adhesive, an acrylic pressure sensitive adhesive, a silicone-based pressure sensitive adhesive, a urethane-based pressure sensitive adhesive, a vinylalkyl ether-based pressure sensitive adhesive, a polyvinylpyrrolidone-based pressure sensitive adhesive, a polyacrylamide-based pressure sensitive adhesive, and a cellulose-based pressure sensitive adhesive.

Among them, from the viewpoints of transparency, weather fastness, heat resistance, and the like, an acrylic pressure sensitive adhesive (pressure-sensitive adhesive) is preferable.

In the present invention, for a reason that moisture-heat resistance is improved, it is preferable that at least one of the pressure sensitive adhesive layer 1 or the pressure sensitive adhesive layer 2 contains a polymer having a repeating unit represented by Formula (A).

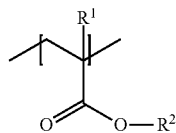

(A)

In Formula (A), $R^1$ represents a hydrogen atom or a methyl group, and $R^2$ represents an alkyl group having 1 to 6 carbon atoms.

Here, the alkyl group may be linear, branched, or cyclic, but specific examples of the linear alkyl group include a methyl group, an ethyl group, an n-propyl group, and a butyl group.

As the branched alkyl group, an alkyl group having 3 to 6 carbon atoms is preferable, and specific examples thereof include an isopropyl group and a tert-butyl group.

As the cyclic alkyl group, an alkyl group having 3 to 6 carbon atoms is preferable, and specific examples thereof include a cyclopropyl group, a cyclopentyl group, and a cyclohexyl group.

The pressure sensitive adhesive layer can be formed, for example, by a method in which a solution of the pressure sensitive adhesive is applied onto a release sheet and dried, and then the resultant is transferred to a surface of a transparent resin layer; a method in which a solution of the pressure sensitive adhesive is directly applied onto a surface of a transparent resin layer and dried; or the like.

For example, the solution of the pressure sensitive adhesive is prepared as a solution of about 10% to 40% by mass in which the pressure sensitive adhesive is dissolved or dispersed in a solvent such as toluene or ethyl acetate.

As a coating method, a roll coating method such as reverse coating and gravure coating, a spin coating method, a screen coating method, a fountain coating method, a dipping method, a spray method, and the like can be employed.

In addition, examples of a constituent material of the release sheet include appropriate thin leaf-like materials, for example, a film of a synthetic resin such as polyethylene, polypropylene, and polyethylene terephthalate; a rubber sheet; paper; a fabric; a non-woven fabric; a net; a foam sheet; and a metal foil.

A storage elastic modulus of the pressure sensitive adhesive layer used in the present invention is preferably 0.1 MPa or greater and more preferably 0.5 MPa or greater.

It is preferable that any one of the pressure sensitive adhesive layer 1 or the pressure sensitive adhesive layer 2 satisfies the above-mentioned storage elastic modulus, and more preferable that both thereof satisfy the above-mentioned storage elastic modulus.

In the present invention, for a reason that pencil hardness is improved, it is preferable that the storage elastic modulus of the pressure sensitive adhesive layer 1 is 0.5 MPa or greater.

<<Method for Measuring Storage Elastic Modulus>>

The storage elastic modulus in the present invention refers to a value measured under conditions of a frequency of 1 Hz and 25° C. using a dynamic viscoelasticity measuring device (DVA-200) manufactured by IT Measurement Control Co., Ltd.

In the present invention, a thickness of the pressure sensitive adhesive layer is not particularly limited, but is preferably 1 to 50 μm and more preferably 3 to 30 μm.

In particular, for a reason that pencil hardness is improved, the thickness of the pressure sensitive adhesive layer 1 is preferably 8 μm or less and more preferably 3 to 8 sm.

[Adhesive Layer]

The laminate according to the embodiment of the present invention may include an adhesive layer.

The adhesive is not particularly limited as long as the adhesive exhibits adhesiveness by being dried or reacted after adhesion.

A polyvinyl alcohol-based adhesive (PVA-based adhesive) exhibits adhesiveness by being dried, and thus enables the adhesion between materials.

Specific examples of a curing-type adhesive which exhibits adhesiveness by being reacted include an active energy ray curing-type adhesive such as a (meth)acrylate-based adhesive, and a cationic polymerization curing-type adhesive. Moreover, the (meth)acrylate means acrylate and/or methacrylate. Examples of a curable component in the (meth)acrylate-based adhesive include a compound having a (meth)acryloyl group and a compound having a vinyl group.

Furthermore, a compound having an epoxy group or an oxetanyl group can also be used as a cationic polymerization curing-type adhesive. The compound having an epoxy group is not particularly limited as long as the compound has at least two epoxy groups in a molecule, and various curable epoxy compounds generally known can be used. Preferred examples of the epoxy compound include a compound (aromatic epoxy compound) having at least two epoxy groups and at least one aromatic ring in the molecule and a compound (alicyclic epoxy compound) having at least two epoxy groups in the molecule, at least one of which is formed between two adjacent carbon atoms constituting an alicyclic ring.

[Optically Anisotropic Layer]

As described above, the laminate according to the embodiment of the present invention may include an optically anisotropic layer.

In the present invention, the laminate for imparting the antireflection function is the most preferred aspect, and in this case, the optically anisotropic layer is preferably a λ/4 plate.

The λ/4 plate is a plate having a function of converting linearly polarized light having a specific wavelength to circularly polarized light (or converting circularly polarized light to linearly polarized light), is a plate (phase difference film) whose in-plane retardation Re(λ) at a specific wavelength of λ nm satisfies Re(λ)=λ/4, and is preferably produced by adjusting Re of a positive A-plate to λ/4. In order to suppress the tint change in a case of being viewed from the oblique direction or the light leakage during black display, it is preferable to further combine a positive C-plate. At this time, the total Rth of the antireflection plate is preferably adjusted to be close to zero.

The antireflection plate is suitably used for antireflection application of image display devices such as a liquid crystal display device (LCD), a plasma display panel (PDP), an electroluminescent display (ELD), and a cathode ray tube display device (CRT), and can improve a contrast ratio of display light.

For example, the antireflection plate can be provided on a side of a light extraction surface of the organic EL display device. In this case, the external light is converted to linearly polarized light by the polarizer, and then is converted to circularly polarized light by passing through the phase difference plate. In a case where the light is reflected by a metal electrode or the like of the organic EL panel, the circular polarization state is inverted, and in a case where the light passes through the phase difference plate again, the light is converted to linearly polarized light which is inclined by 90° from the light at the time of incidence, reaches the polarizer, and is absorbed. As a result, the influence of external light can be suppressed.

The optically anisotropic layer used in the present invention may be provided between the light-absorbing anisotropic layer and the pressure sensitive adhesive layer 2, and may be provided on the outside of the pressure sensitive adhesive layer 2. In a case where the optically anisotropic layer is provided between the light-absorbing anisotropic layer and the pressure sensitive adhesive layer 2, for adhesion of the respective layers, it is preferable to use a curing-type adhesive layer, which will be described later, rather than the pressure sensitive adhesive layer.

The laminate according to the embodiment of the present invention can be manufactured, for example, by adhering the light-absorbing anisotropic layer to the λ/4 positive A-plate and the positive C-plate, which are optically anisotropic layers, with an adhesive or the like.

In a case where the optically anisotropic layer is configured with the λ/4 positive A-plate and the positive C-plate, the optically anisotropic layer may be adhered to the light-absorbing anisotropic layer on a surface on the positive C-plate side, and may be adhered to the light-absorbing anisotropic layer on a surface on an opposite side.

Alternatively, the laminate can be manufactured by directly forming the λ/4 positive A-plate and the positive C-plate on the light-absorbing anisotropic layer. As described in Example 19 of JP6243869B, it is also preferable that the alignment layer is provided between the light-absorbing anisotropic layer and the positive A-plate. Furthermore, as described in Example 1 of JP6123563B, a protective layer can also be provided between the light-absorbing anisotropic layer and the positive A-plate. Alternatively, a method for forming the λ/4 positive A-plate and the positive C-plate and then forming the light-absorbing anisotropic layer can also be used.

An angle formed by the slow axis direction of the positive A-plate of the antireflection plate and the absorption axis direction of the light-absorbing anisotropic layer is preferably in a range of 45°±10°. Regarding the optical characteristics of the positive A-plate and the positive C-plate, particularly from the viewpoint that the tint change is suppressed, it is preferable that wavelength dispersion of Re or Rth exhibits reciprocal wavelength dispersibility.

) In the manufacturing of the antireflection plate, for example, it is preferable to include a step of continuously laminating the light-absorbing anisotropic layer in a long state with the positive A-plate and the positive C-plate in a long state. The long antireflection plate is cut according to a size of a screen of an image display device to be used.

In a case where the optically anisotropic layer is formed of the liquid crystalline compound, the optically anisotropic layer can be made into a thin layer, which is preferable from the viewpoint of flexibility. Moreover, from the viewpoint of light durability, it is preferable to include a layer formed of a composition containing a polymerizable liquid crystalline compound represented by Formula (4).

In the following description, first, the components in the composition (hereinafter, also simply referred to as a "composition for forming an optically anisotropic layer") used for the formation of the optically anisotropic layer will be described in detail, and then the manufacturing method and the characteristics of the optically anisotropic layer will be described in detail.

(Polymerizable Liquid Crystalline Compound Represented by Formula (4))

The composition for forming an optically anisotropic layer contains the polymerizable liquid crystalline compound represented by Formula (4). The polymerizable liquid crystalline compound represented by Formula (4) is a compound exhibiting liquid crystallinity.

Examples of the monovalent organic group represented by $L^1$ and $L^2$ in Formula (4) include an alkyl group, an aryl group, and a heteroaryl group.

The alkyl group may be linear, branched, or cyclic, but is preferably linear. The number of carbon atoms in the alkyl group is preferably 1 to 30, more preferably 1 to 20, and still more preferably 1 to 10.

The aryl group may be monocyclic or polycyclic, but is preferably monocyclic. The number of carbon atoms in the aryl group is preferably 6 to 25 and more preferably 6 to 10.

The heteroaryl group may be monocyclic or polycyclic. The number of heteroatoms constituting the heteroaryl group is preferably 1 to 3. The heteroatom constituting the heteroaryl group is preferably a nitrogen atom, a sulfur atom, or an oxygen atom. The number of carbon atoms in the heteroaryl group is preferably 6 to 18 and more preferably 6 to 12.

The alkyl group, aryl group, and heteroaryl group may be unsubstituted or may have a substituent. Examples of the substituent include the same substituents as the substituents that $Y^1$ in Formula (Ar-1) may have.

The polymerizable group represented by at least one of $L^1$ or $L^2$ in Formula (4) is not particularly limited, but is preferably a polymerizable group capable of radical polymerization or cationic polymerization.

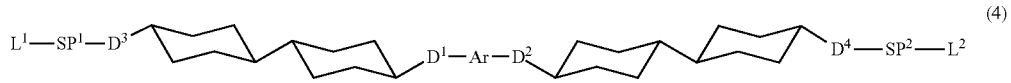

(4)

In Formula (4), $D^1$, $D^2$, $D^3$, and $D^4$ each independently represent a single bond, —CO—O—, —C(=S)O—, —CR$^1$R$^2$—, —CR$^1$R$^2$—CR$^3$R$^4$—, —O—CR$^1$R$^2$—, —CR$^1$R$^2$—O—CR$^3$R$^4$—, —CO—O—CR$^1$R$^2$—, —O—CO—CR$^1$R$^2$—, —CR$^1$R$^2$—O—CO—CR$^3$R$^4$—, —CR$^1$R$^2$—CO—O—CR$^3$R$^4$—, —NR$^1$—CR$^2$R$^3$—, or —CO—NR$^1$—. $R^1$, $R^2$, $R^3$, and $R^4$ each independently represent a hydrogen atom, a fluorine atom, or an alkyl group having 1 to 4 carbon atoms.

$SP^1$ and $SP^2$ in Formula (4) each independently represent a single bond, a linear or branched alkylene group having 1 to 12 carbon atoms, or a divalent linking group in which one or more —CH$_2$-'s constituting the linear or branched alkylene group having 1 to 12 carbon atoms are substituted with —O—, —S—, —NH—, —N(Q)-, or —CO—, and Q represents a substituent.

$L^1$ and $L^2$ in Formula (4) each independently represent a monovalent organic group, and at least one of $L^1$ or $L^2$ represents a polymerizable group, provided that in a case where Ar is an aromatic ring represented by Formula (Ar-3), at least one of $L^1$, $L^2$, or $L^3$ or $L^4$ in Formula (Ar-3) represents a polymerizable group.

As the linear or branched alkylene group which has 1 to 12 carbon atoms and is represented by $SP^1$ and $SP^2$ in Formula (4), for example, a methylene group, an ethylene group, a propylene group, a butylene group, a pentylene group, a hexylene group, a methylhexylene group, and a heptylene group are preferable. Moreover, as described above, $SP^1$ and $SP^2$ may each be a divalent linking group in which one or more —CH$_2$-'s constituting a linear or branched alkylene group having 1 to 12 carbon atoms are substituted with —O—, —S—, —NH—, —N(Q)-, or —CO—, and examples of the substituent represented by Q include the same substituents as the substituents that $Y^1$ in Formula (Ar-1) may have.

As a radically polymerizable group, generally known radically polymerizable groups can be used, and an acryloyl group or a methacryloyl group is preferable. In this case, it is known that the acryloyl group generally has a high polymerization rate, from the viewpoint of improvement in productivity, the acryloyl group is preferable, but the methacryloyl group can also be similarly used as the polymerizable group.

As a cationically polymerizable group, generally known cationically polymerizable groups can be used, and specific examples thereof include an alicyclic ether group, a cyclic acetal group, a cyclic lactone group, a cyclic thioether group, a spiroorthoester group, and a vinyloxy group. Among them, an alicyclic ether group or a vinyloxy group is preferable, and an epoxy group, an oxetanyl group, or a vinyloxy group is more preferable.

Particularly preferred examples of the polymerizable group include the following groups. Moreover, * in the following formulae represents a bonding position to the polymerizable group.

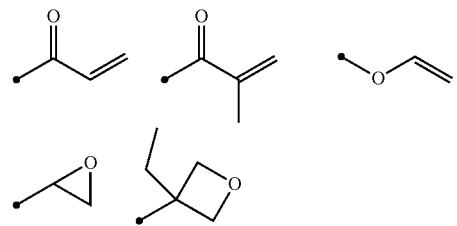

In Formula (4), from the viewpoint that thermal durability of the laminate is superior (hereinafter, also simply referred to as a "viewpoint that the effect of the present invention is superior"), it is preferable that both $L^1$ and $L^2$ in Formula (4) are polymerizable groups, and more preferable that $L^1$ and $L^2$ are each an acryloyl group or a methacryloyl group.

Meanwhile, Ar in Formula (4) represents any one aromatic ring selected from the group consisting of the groups represented by Formulae (Ar-1) to (Ar-5). Moreover, * in Formulae (Ar-1) to (Ar-5) represents a bonding position to $D^1$ or $D^2$ in Formula (4).

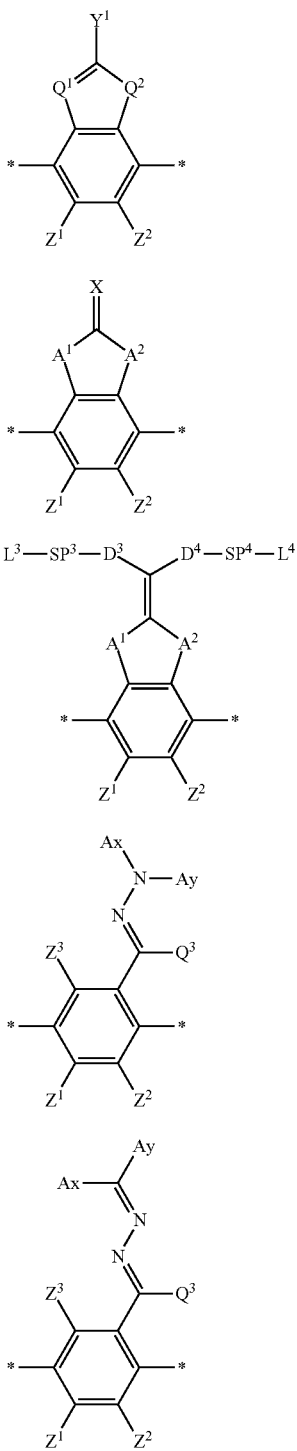

-continued

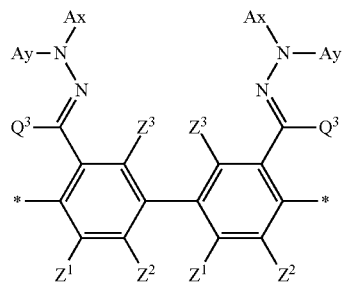

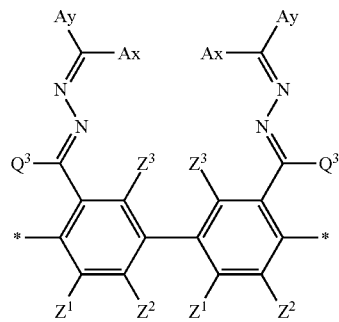

Here, in Formula (Ar-1), $Q^1$ represents N or CH, $Q^2$ represents —S—, —O—, or —N(R)—, $R^5$ represents a hydrogen atom or an alkyl group having 1 to 6 carbon atoms, and $Y^1$ represents an aromatic hydrocarbon group having 6 to 12 carbon atoms or an aromatic heterocyclic group having 3 to 12 carbon atoms, which may have a substituent.

Examples of the alkyl group which has 1 to 6 carbon atoms and is represented by $R^5$ include a methyl group, an ethyl group, a propyl group, an isopropyl group, an n-butyl group, an isobutyl group, a sec-butyl group, a tert-butyl group, an n-pentyl group, and an n-hexyl group.

Examples of the aromatic hydrocarbon group which has 6 to 12 carbon atoms and is represented by $Y^1$ include an aryl group such as a phenyl group, a 2,6-diethylphenyl group, and a naphthyl group.

Examples of the aromatic heterocyclic group which has 3 to 12 carbon atoms and is represented by $Y^1$ include a heteroaryl group such as a thienyl group, a thiazolyl group, a furyl group, and a pyridyl group.

Moreover, examples of the substituent that $Y^1$ may have include an alkyl group, an alkoxy group, and a halogen atom.

As the alkyl group, for example, a linear, branched, or cyclic alkyl group having 1 to 18 carbon atoms is preferable, an alkyl group having 1 to 8 carbon atoms (for example, a methyl group, an ethyl group, a propyl group, an isopropyl group, an n-butyl group, an isobutyl group, a sec-butyl group, a t-butyl group, a cyclohexyl group, and the like) is more preferable, an alkyl group having 1 to 4 carbon atoms is still more preferable, and a methyl group or an ethyl group is particularly preferable.

As the alkoxy group, for example, an alkoxy group having 1 to 18 carbon atoms is preferable, an alkoxy group having 1 to 8 carbon atoms (for example, a methoxy group, an ethoxy group, an n-butoxy group, a methoxyethoxy group, and the like) is more preferable, an alkoxy group having 1 to 4 carbon atoms is still more preferable, and a methoxy group or an ethoxy group is particularly preferable.

Examples of the halogen atom include a fluorine atom, a chlorine atom, a bromine atom, and an iodine atom, and among them, a fluorine atom or a chlorine atom is preferable.

In addition, in Formulae (Ar-1) to (Ar-7), $Z^1$, $Z^2$, and $Z^3$ each independently represent a hydrogen atom, a monovalent aliphatic hydrocarbon group having 1 to 20 carbon atoms, a monovalent alicyclic hydrocarbon group having 3 to 20 carbon atoms, a monovalent aromatic hydrocarbon group having 6 to 20 carbon atoms, a halogen atom, a cyano group, a nitro group, —$OR^6$, —$NR^7R^8$, or —$SR^9$, $R^6$ to $R^9$ each independently represent a hydrogen atom or an alkyl group having 1 to 6 carbon atoms, and $Z^1$ and $Z^2$ may be bonded to each other to form an aromatic ring.

As the monovalent aliphatic hydrocarbon group having 1 to 20 carbon atoms, an alkyl group having 1 to 15 carbon atoms is preferable, an alkyl group having 1 to 8 carbon atoms is more preferable, specifically, a methyl group, an ethyl group, an isopropyl group, a tert-pentyl group (1,1-dimethylpropyl group), a tert-butyl group, or a 1,1-dimethyl-3,3-dimethyl-butyl group is still more preferable, and a methyl group, an ethyl group, or a tert-butyl group is particularly preferable.

Examples of the monovalent alicyclic hydrocarbon group having 3 to 20 carbon atoms include a monocyclic saturated hydrocarbon group such as a cyclopropyl group, a cyclobutyl group, a cyclopentyl group, a cyclohexyl group, a cycloheptyl group, a cyclooctyl group, a cyclodecyl group, a methylcyclohexyl group, and an ethylcyclohexyl group; a monocyclic unsaturated hydrocarbon group such as a cyclobutenyl group, a cyclopentenyl group, a cyclohexenyl group, a cycloheptenyl group, a cyclooctenyl group, a cyclodecenyl group, a cyclopentadienyl group, a cyclohexadienyl group, a cyclooctadienyl group, and a cyclodecadiene group; and a polycyclic saturated hydrocarbon group such as a bicyclo[2.2.1]heptyl group, a bicyclo[2.2.2]octyl group, a tricyclo[5.2.1.0$^{2,6}$]decyl group, a tricyclo[3.3.1.1$^{3,7}$]decyl group, a tetracyclo[6.2.1.1$^{3,6}$.0$^{2,7}$]dodecyl group, and an adamantyl group.

Examples of the monovalent aromatic hydrocarbon group having 6 to 20 carbon atoms include a phenyl group, a 2,6-diethylphenyl group, a naphthyl group, and a biphenyl group, and an aryl group (particularly, a phenyl group) having 6 to 12 carbon atoms is preferable.

Examples of the halogen atom include a fluorine atom, a chlorine atom, a bromine atom, and an iodine atom, and a fluorine atom, a chlorine atom, or a bromine atom is preferable.

Meanwhile, examples of the alkyl groups which have 1 to 6 carbon atoms and are represented by $R^6$ to $R^9$ include a methyl group, an ethyl group, a propyl group, an isopropyl group, an n-butyl group, an isobutyl group, a sec-butyl group, a tert-butyl group, an n-pentyl group, and an n-hexyl group.

In Formulae (Ar-2) and (Ar-3), $A^1$ and $A^2$ each independently represent a group selected from the group consisting of —O—, —N($R^{10}$)—, —S—, and —CO—, and $R^{10}$ represents a hydrogen atom or a substituent.

Examples of the substituent represented by $R^{10}$ include the same substituents as the substituents that $Y^1$ in Formula (Ar-1) may have.

X in Formula (Ar-2) represents a non-metallic atom of Group 14 to Group 16, to which a hydrogen atom or a substituent may be bonded.

Moreover, examples of the non-metallic atom which belongs to Group 14 to Group 16 and is represented by X include an oxygen atom, a sulfur atom, a nitrogen atom having a substituent, and a carbon atom having a substituent, and examples of the substituent include an alkyl group, an alkoxy group, an alkyl-substituted alkoxy group, a cyclic alkyl group, an aryl group (for example, a phenyl group, a naphthyl group, and the like), a cyano group, an amino group, a nitro group, an alkylcarbonyl group, a sulfo group, and a hydroxyl group.

$D^3$ and $D^4$ in Formula (Ar-3) each independently represent a single bond, —CO—O—, —C(=S)O—, —$CR^1R^2$—, —$CR^1R^2$—$CR^3R^4$—, —O—$CR^1R^2$—, —$CR^1R^2$—O—$CR^3R^4$—, —CO—O—$CR^1R^2$—, —O—CO—$CR^1R^2$—, —$CR^1R^2$—O—CO—$CR^3R^4$—, —$CR^1R^2$—CO—O—$CR^3R^4$—, —$NR^1$—$CR^2R^3$—, or —CO—$NR^1$—. $R^1$, $R^2$, $R^3$, and $R^4$ each independently represent a hydrogen atom, a fluorine atom, or an alkyl group having 1 to 4 carbon atoms.

$SP^3$ and $SP^4$ in Formula (Ar-3) each independently represent a single bond, a linear or branched alkylene group having 1 to 12 carbon atoms, or a divalent linking group in which one or more —$CH_2$-'s constituting the linear or branched alkylene group having 1 to 12 carbon atoms are substituted with —O—, —S—, —NH—, —N(Q)-, or —CO—, and Q represents a substituent. Examples of the substituent include the same substituents as the substituents that $Y^1$ in Formula (Ar-1) may have.

$L^3$ and $L^4$ in Formula (Ar-3) each independently represent a monovalent organic group, and at least one of $L^3$, $L^4$, or $L^1$ or $L^2$ in Formula (4) represents a polymerizable group.

Examples of the monovalent organic group include the same groups as those described for $L^1$ and $L^2$ in Formula (4).

Moreover, examples of the polymerizable group include the same groups as those described for $L^1$ and $L^2$ in Formula (4).

Ax in Formulae (Ar-4) to (Ar-7) represents an organic group which has 2 to 30 carbon atoms and has at least one aromatic ring selected from the group consisting of an aromatic hydrocarbon ring and an aromatic heterocyclic ring.

Moreover, Ay in Formulae (Ar-4) to (Ar-7) represents a hydrogen atom, an alkyl group which has 1 to 12 carbon atoms and may have a substituent, or an organic group which has 2 to 30 carbon atoms and has at least one aromatic ring selected from the group consisting of an aromatic hydrocarbon ring and an aromatic heterocyclic ring.

Here, the aromatic rings in Ax and Ay may each have a substituent, and Ax and Ay may be bonded to each other to form a ring.

Moreover, $Q^3$ represents a hydrogen atom or an alkyl group which has 1 to 6 carbon atoms and may have a substituent.

Examples of Ax and Ay include those described in paragraphs [0039] to [0095] of WO2014/010325A.

Examples of the alkyl group which has 1 to 6 carbon atoms and is represented by $Q^3$ include a methyl group, an ethyl group, a propyl group, an isopropyl group, an n-butyl group, an isobutyl group, a sec-butyl group, a tert-butyl group, an n-pentyl group, and an n-hexyl group, and examples of the substituent include the same substituents as the substituents that $Y^1$ in Formula (Ar-1) may have.

Examples of such a polymerizable liquid crystalline compound (4) include the compound (particularly, the compound described in paragraphs [0067] to [0073]) represented by General Formula (1) described in JP2010-084032A, the compound (particularly, the compound described in paragraphs [0036] to [0043]) represented by General Formula (II) described in JP2016-053709A, and the compound (particularly, the compound described in paragraphs [0043] to [0055]) represented by General Formula (1) described in JP2016-081035A.

In addition, suitable examples of such a polymerizable liquid crystalline compound (4) include compounds represented by Formulae (1) and (22), and specifically, respective compounds having side chain structures shown in Tables 1 and 2 below as K (side chain structure) in Formulae (1) and (22) are mentioned.

Moreover, in Tables 1 and 2 below, "*" shown in the side chain structure as K represents a bonding position to an aromatic ring.

In addition, in the following description, a compound which is represented by Formula (1) and has a group shown in 1-1 in Table 1 below is referred to as a "compound (1-1-1)", and compounds having other structural formulae and groups are also referred to in the same manner. For example, a compound which is represented by Formula (2) and has a group shown in 2-3 in Table 2 below can be referred to as a "compound (2-2-3)".

Furthermore, in the side chain structures represented by 1-2 in Table 1 below and 2-2 in Table 2 below, each group adjacent to an acryloyloxy group and a methacryloyl group represents a propylene group (a group in which a methyl group is substituted with an ethylene group), and represents a mixture of positional isomers having methyl groups at different positions.

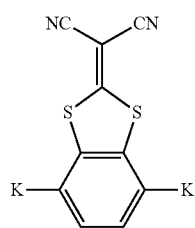
(1)

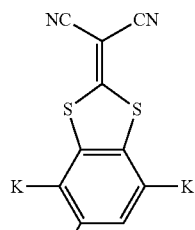
(2)

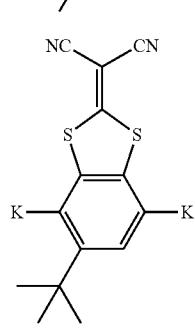
(3)

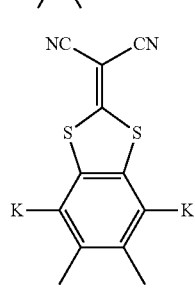
(4)

-continued

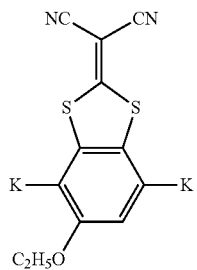
(5)

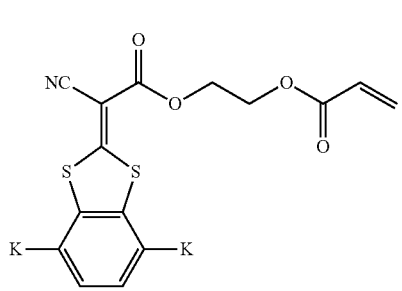
(6)

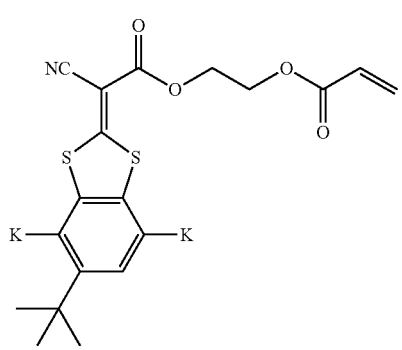
(7)

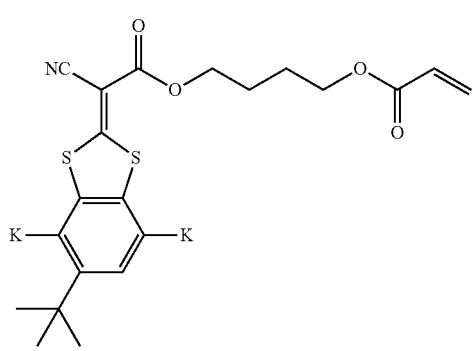
(8)

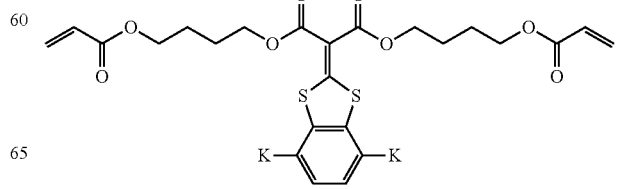
(9)

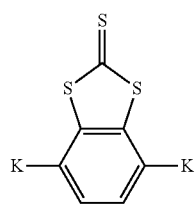
(10)
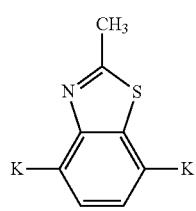
(11)
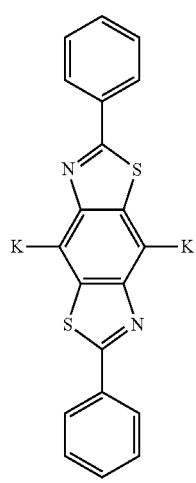
(12)
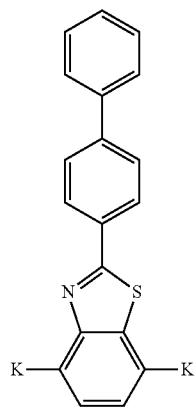
(13)
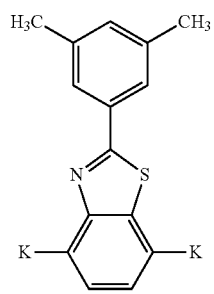
(14)
(15)
(16)
(17)
(18)

(19)
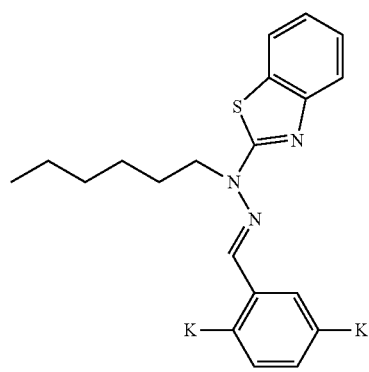
(20)
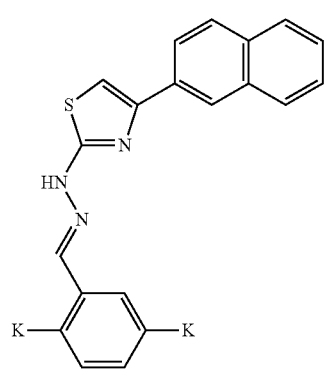
(21)
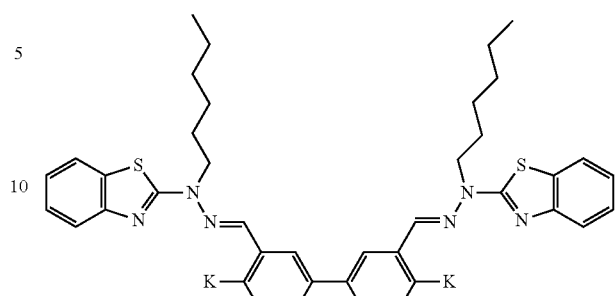
(22)
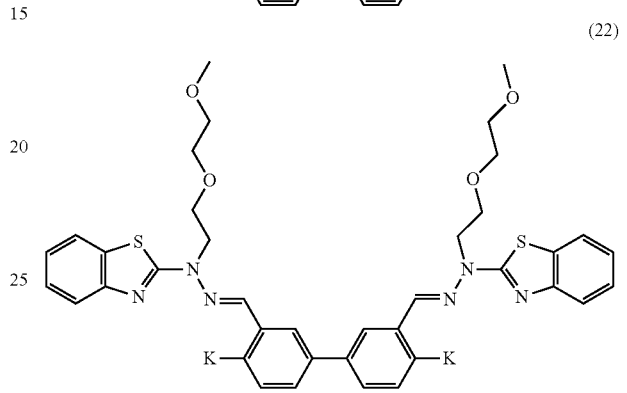
TABLE 1
| K (side chain structure) | |
|---|---|
| 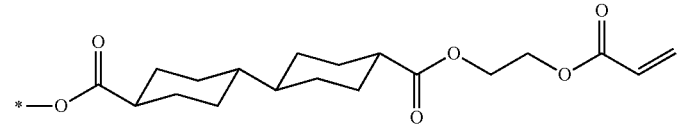 | 1-1 |
| 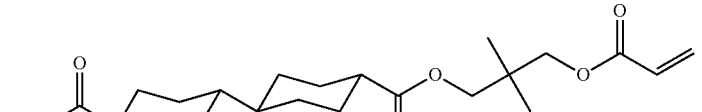 | 1-2 |
| 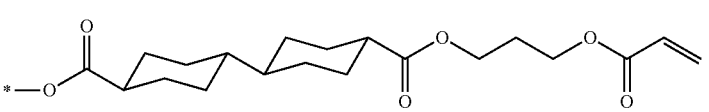 | 1-3 |
| 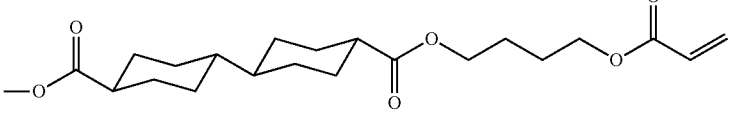 | 1-4 |
| 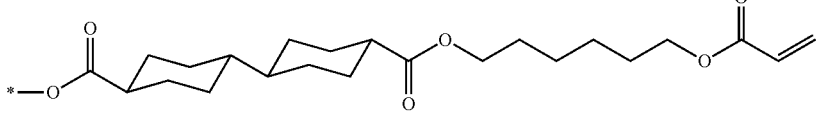 | 1-5 |
| 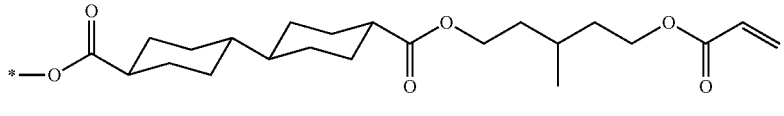 | 1-6 |

TABLE 1-continued
| K (side chain structure) | |
|---|---|
| 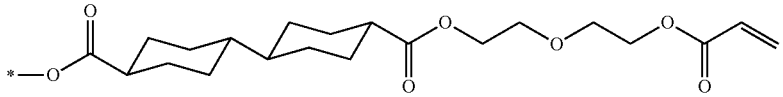 | 1-7 |
| 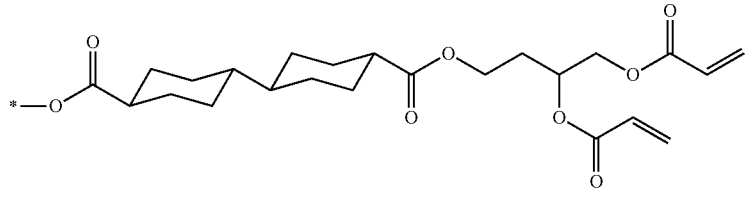 | 1-8 |
| 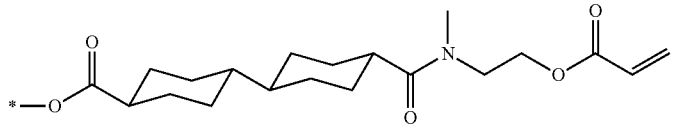 | 1-9 |
| 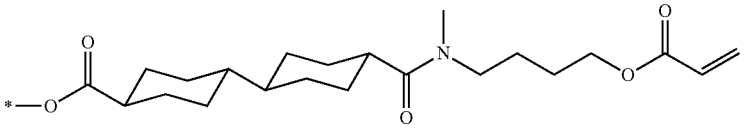 | 1-10 |
| 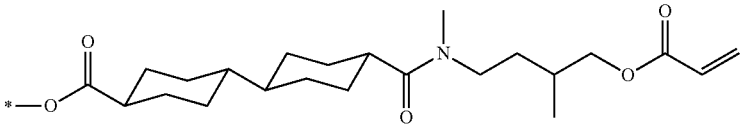 | 1-11 |
| 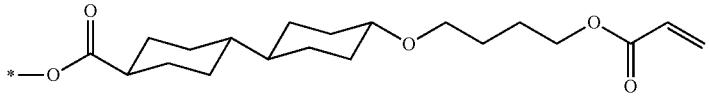 | 1-12 |
| 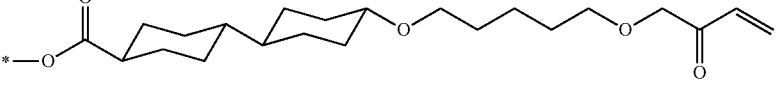 | 1-13 |
| 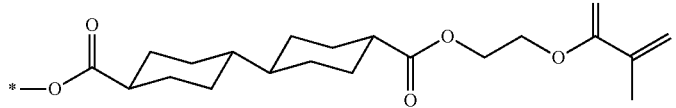 | 1-13 |
TABLE 2
| K (side chain structure) | |
|---|---|
| 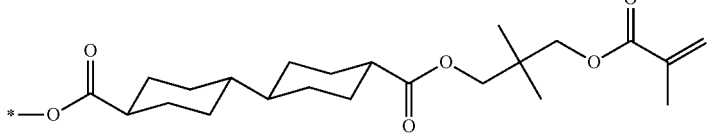 | 2-1 |
|  | 2-2 |

TABLE 2-continued

| K (side chain structure) | |
|---|---|
| [structure] | 2-3 |
| [structure] | 2-4 |
| [structure] | 2-5 |
| [structure] | 2-6 |
| [structure] | 2-7 |
| [structure] | 2-8 |
| [structure] | 2-9 |
| [structure] | 2-10 |
| [structure] | 2-11 |
| [structure] | 2-12 |

TABLE 2-continued

K (side chain structure)

2-13

2-14

A content of the polymerizable liquid crystalline compound represented by Formula (4) in the composition for forming an optically anisotropic layer is not particularly limited, but is preferably 50% to 100% by mass and more preferably 70% to 99% by mass, with respect to the total solid content in the composition for forming an optically anisotropic layer.

The solid content means other components excluding a solvent in the composition for forming an optically anisotropic layer, and the other components are calculated as the solid content even in a case where a property of the components is a liquid.

The composition for forming an optically anisotropic layer may contain other components in addition to the polymerizable liquid crystalline compound represented by Formula (4).

(Liquid Crystalline Compound)

The composition for forming an optically anisotropic layer may contain other liquid crystalline compounds in addition to the polymerizable liquid crystalline compound represented by Formula (4). As the other liquid crystalline compounds, well-known liquid crystalline compounds (rod-like liquid-crystalline compounds and disk-like liquid-crystalline compounds) are mentioned. The other liquid crystalline compounds may have a polymerizable group.

(Polymerizable Monomer)

The composition for forming an optically anisotropic layer may contain other polymerizable monomers in addition to the polymerizable liquid crystalline compound represented by Formula (4) and the other liquid crystalline compounds having a polymerizable group. Among them, from the viewpoint that hardness of the optically anisotropic layer is superior, a polymerizable compound (polyfunctional polymerizable monomer) having two or more polymerizable groups is preferable.

As the polyfunctional polymerizable monomer, a polyfunctional radically polymerizable monomer is preferable. Examples of the polyfunctional radically polymerizable monomer include the polymerizable monomer described in paragraphs [0018] to [0020] of JP2002-296423A.

Furthermore, in a case where the composition contains the polyfunctional polymerizable monomer, a content of the polyfunctional polymerizable monomer is preferably 1% to 50% by mass and more preferably 2% to 30% by mass, with respect to the total mass of the polymerizable liquid crystalline compound represented by Formula (4).

(Polymerization Initiator)

The composition for forming an optically anisotropic layer may contain a polymerization initiator.

The polymerization initiator is preferably a photopolymerization initiator capable of initiating a polymerization reaction upon irradiation with ultraviolet rays.

Examples of the photopolymerization initiator include the α-carbonyl compound (described in each of the specifications of U.S. Pat. Nos. 2,367,661A and 2,367,670A), the acyloin ether (described in the specification of U.S. Pat. No. 2,448,828A), the α-hydrocarbon-substituted aromatic acyloin compound (described in the specification of U.S. Pat. No. 2,722,512A), the polynuclear quinone compound (described in each of the specifications of U.S. Pat. Nos. 3,046,127A and 2,951,758A), the combination of a triarylimidazole dimer and p-aminophenyl ketone (described in the specification of U.S. Pat. No. 3,549,367A), the acridine and phenazine compounds (described in JP1985-105667A (JP-S60-105667A) and the specification of U.S. Pat. No. 4,239,850A), the oxadiazole compound (described in the specification of U.S. Pat. No. 4,212,970A), the O-acyloxime compound (described in paragraph [0065] of JP2016-027384A), and the acyl phosphine oxide compounds (described in JP1988-040799B (JP-S63-040799B), JP1993-029234B (JP-H05-029234B), JP1998-095788A (JP-H10-095788A), and JP1998-029997A (JP-H10-029997A)).

As the polymerization initiator, an oxime-type polymerization initiator is preferable.

(Solvent)

The composition for forming an optically anisotropic layer may contain a solvent from the viewpoint of operability for forming the optically anisotropic layer.

Examples of the solvent include ketones (for example, acetone, 2-butanone, methyl isobutyl ketone, cyclohexanone, and cyclopentanone), ethers (for example, dioxane and tetrahydrofuran), aliphatic hydrocarbons (for example, hexane and the like), alicyclic hydrocarbons (for example, cyclohexane), aromatic hydrocarbons (for example, toluene, xylene, and trimethylbenzene), halocarbons (for example, dichloromethane, dichloroethane, dichlorobenzene, and chlorotoluene), esters (for example, methyl acetate, ethyl acetate, and butyl acetate), water, alcohols (for example, ethanol, isopropanol, butanol, and cyclohexanol), cellosolves (for example, methyl cellosolve and ethyl cellosolve), cellosolve acetates, sulfoxides (for example, dimethyl sulfoxide), and amides (for example, dimethylformamide and dimethylacetamide).

These solvents may be used alone or in combination of two or more kinds thereof.

(Leveling Agent)

The composition for forming an optically anisotropic layer may contain a leveling agent from the viewpoint that the surface of the optically anisotropic layer is kept smooth.

As the leveling agent, for a reason of a high leveling effect on the addition amount, a fluorine-based leveling agent or a silicon-based leveling agent is preferable, and from the viewpoint that weeping (bloom or bleed) is less likely to be caused, a fluorine-based leveling agent is more preferable.

Examples of the leveling agent include the compound described in paragraphs [0079] to [0102] of JP2007-069471A, the polymerizable liquid crystalline compound (particularly, the compound described in paragraphs [0020] to [0032]) which is represented by General Formula (4) described in JP2013-047204A, the polymerizable liquid crystalline compound (particularly, the compound described in paragraphs [0022] to [0029]) which is represented by General Formula (4) described in JP2012-211306A, the liquid crystal alignment promoter (particularly, the compound described in paragraphs [0076] to [0078] and paragraphs [0082] to [0084]) which is represented by General Formula (4) described in JP2002-129162A, and the compounds (particularly, the compounds described in paragraphs [0092] to [0096]) which are represented by General Formulae (4), (II), and (III) described in JP2005-099248A. Furthermore, the leveling agent may also have a function as an alignment control agent which will be described later.

(Alignment Control Agent)

The composition for forming an optically anisotropic layer may contain an alignment control agent, as needed.

The alignment control agent can form various alignment states such as homeotropic alignment (vertical alignment), tilt alignment, hybrid alignment, and cholesteric alignment in addition to homogeneous alignment, and can realize a specific alignment state by more uniform and more precise control.

As an alignment control agent which promotes homogeneous alignment, for example, a low-molecular alignment control agent and a high-molecular alignment control agent can be used.

With regard to the low-molecular alignment control agent, reference can be made to the descriptions in, for example, paragraphs [0009] to [0083] of JP2002-020363A, paragraphs [0111] of JP2006-106662A, and paragraphs [0021] to [0029] of JP2012-211306A, the contents of which are incorporated herein by reference.

Furthermore, with regard to the high-molecular alignment control agent, reference can be made to, for example, paragraphs [0021] to [0057] of JP2004-198511A and paragraphs [0121] of JP2006-106662A, the contents of which are incorporated herein by reference.

In addition, examples of an alignment control agent which forms or promotes homeotropic alignment include a boronic acid compound and an onium salt compound, and specifically, reference can be made to the compounds described in paragraphs [0023] to [0032] of JP2008-225281A, paragraphs [0052] to [0058] of JP2012-208397A, paragraphs [0024] to [0055] of JP2008-026730A, paragraphs [0043] to [0055] of JP2016-193869A, and the like, the contents of which are incorporated herein by reference.

In a case where the alignment control agent is contained, the content thereof is preferably 0.01% to 10% by mass and more preferably 0.05% to 5% by mass, with respect to the total solid content in the composition.

(Other Components)

The composition for forming an optically anisotropic layer may contain components other than the above-mentioned components, and examples thereof include a surfactant, a tilt angle controlling agent, an alignment aid, a plasticizer, and a crosslinking agent.

(Method for Manufacturing Optically Anisotropic Layer)

A method for manufacturing the optically anisotropic layer is not particularly limited, and well-known methods are mentioned.

For example, a cured coating film (optically anisotropic layer) can be manufactured by applying the composition for forming an optically anisotropic layer to a predetermined substrate (for example, a support layer which will be described later) to form a coating film, and subjecting the obtained coating film to a curing treatment (irradiation with active energy rays (light irradiation treatment) and/or heating treatment). Moreover, an alignment film, which will be described later, may be used, as needed.

Application of the composition can be carried out by well-known methods (for example, a wire bar coating method, an extrusion coating method, a direct gravure coating method, a reverse gravure coating method, and a die-coating method).

In the method for manufacturing the optically anisotropic layer, it is preferable that an alignment treatment for a liquid crystalline compound contained in the coating film is performed before the curing treatment for the coating film.

The alignment treatment can be performed by drying at room temperature (for example, 20° C. to 25° C.) or heating. In a case of a thermotropic liquid crystalline compound, a liquid crystal phase formed by the alignment treatment can be generally transitioned by a change in a temperature or a pressure. In a case of a liquid crystalline compound having lyotropic properties, the transition can be performed also by a compositional ratio such as an amount of a solvent.

In a case where the alignment treatment is a heating treatment, a heating time (heat-aging time) is preferably 10 seconds to 5 minutes, more preferably 10 seconds to 3 minutes, and still more preferably 10 seconds to 2 minutes.

The above-mentioned curing treatment (irradiation with active energy rays (light irradiation treatment) and/or heating treatment) for the coating film can also be referred to as a fixing treatment for fixing the alignment of the liquid crystalline compound.

The fixing treatment is preferably performed by irradiation with active energy rays (preferably, ultraviolet rays), and the liquid crystal is fixed by polymerization of the liquid crystalline compound.

(Characteristics of Optically Anisotropic Layer)

The optically anisotropic layer is a film formed of the above-mentioned composition.

Optical characteristics of the optically anisotropic layer are not particularly limited, but it is preferable that the optically anisotropic layer functions as a $\lambda/4$ plate.

The $\lambda/4$ plate is a plate having a function of converting linearly polarized light having a specific wavelength to circularly polarized light (or converting circularly polarized light to linearly polarized light), and refers to a plate (optically anisotropic layer) whose in-plane retardation $Re(\lambda)$ at a specific wavelength of $\lambda$ nm satisfies $Re(\lambda)=\lambda/4$.

This expression may be achieved at any wavelength (for example, 550 nm) in the visible light range, but the in-plane retardation $Re(550)$ at a wavelength of 550 nm preferably satisfies a relationship of 110 nm≤$Re(550)$≤160 nm and more preferably satisfies 110 nm≤$Re(550)$≤150 nm.

It is preferable that $Re(450)$ which is an in-plane retardation of the optically anisotropic layer measured at a wavelength of 450 nm, $Re(550)$ which is an in-plane retardation of the optically anisotropic layer measured at a wavelength of 550 nm, and $Re(650)$ which is an in-plane retardation of the optically anisotropic layer measured at a wavelength of 650 nm have a relationship of $Re(450)$≤Re (550)≤Re(650). That is, this relationship can be said to be a relationship indicating reciprocal wavelength dispersibility.

The optically anisotropic layer may be an A-plate or a C-plate, and is preferably a positive A-plate.

The positive A-plate can be obtained, for example, by horizontally aligning the polymerizable liquid crystalline compound represented by Formula (4).

A thickness of the optically anisotropic layer is not particularly limited, but is preferably 0.5 to 10 µm and more preferably 1.0 to 5 µm, from the viewpoint of reduction in the thickness.

[Alignment Layer]

The laminate according to the embodiment of the present invention may include an alignment layer.

Examples of a method for forming the alignment layer include methods such as a rubbing treatment of an organic compound (preferably, a polymer) on a film surface, oblique vapor deposition of an inorganic compound, formation of a layer having microgrooves, and accumulation of an organic compound (for example, ω-tricosanoic acid, dioctadecyl methylammonium chloride, methyl stearate, and the like) by a Langmuir-Blodgett method (LB film). Moreover, an alignment layer in which an alignment function is generated by application of an electric field, application of a magnetic field, or light irradiation is also known.

Among them, in the present invention, from the viewpoint of easy control of a pretilt angle of the alignment layer, an alignment layer formed by a rubbing treatment is preferable, but from the viewpoint of uniformity of alignment, which is important in the present invention, a photo-alignment layer formed by light irradiation is more preferable.

<Rubbing-Treated Alignment Layer>

Polymer materials used for the alignment layer formed by the rubbing treatment are described in many documents, and a large number of commercially available products can be acquired. In the present invention, polyvinyl alcohol or polyimide, and a derivative thereof are preferably used. Regarding the alignment layer, reference can be made to the descriptions on page 43, line 24 to page 49, line 8 of WO1/088574A1. A thickness of the alignment layer is preferably 0.01 to 10 µm and more preferably 0.01 to 2 µm.

[Curing-Type Adhesive Layer]

As described above, the laminate according to the embodiment of the present invention may include a curing-type adhesive layer.

The curing-type adhesive layer used in the present invention may be a generally used curing-type adhesive layer, examples thereof include a water-reactive curing-type adhesive layer, a heat curing-type adhesive layer, and an ultraviolet ray curing-type adhesive layer, and an ultraviolet ray curing-type adhesive layer is preferable.

In a case where the curing-type adhesive layer is formed directly adjacent to the light-absorbing anisotropic layer, from the viewpoint of suppression of coloring agent diffusion from the light-absorbing anisotropic layer, it is preferable to increase a degree of crosslinking of the curing-type adhesive layer. In order to increase the degree of crosslinking of the curing-type adhesive layer, a method for increasing a UV irradiation amount or increasing a proportion of a highly reactive monomer, or the like can be suitably used. The UV irradiation amount is preferably in a range of 100 mJ/cm$^2$ to 1,500 mJ/cm$^2$ and more preferably in a range of 600 mJ/cm$^2$ to 1,200 mJ/cm$^2$.

CEL2021P (produced by DAICEL CORPORATION), which is an example of the highly reactive monomer, is used as the solid content in a ratio of preferably 50% or greater and more preferably 90% or greater.

Furthermore, it is also preferable to make the curing-type adhesive layer thicker, and the thickness thereof is preferably in a range of 0.1 µm to 8 µm and more preferably in a range of 0.5 µm to 5 µm.

[Oxygen Shielding Layer]

The laminate according to the embodiment of the present invention may include an oxygen shielding layer for the purpose of improving the light resistance of the organic dichroic substance (particularly, the dichroic azo coloring agent compound) in the light-absorbing anisotropic layer.

The "oxygen shielding layer" refers to an oxygen shielding film having an oxygen shielding function, but in the present invention, refers to an oxygen shielding film having an oxygen permeability of 200 cc/m$^2$/day/atm or less.

Furthermore, the oxygen permeability is an index indicating an amount of oxygen passing through the film per unit time and unit area, and in the present invention, a value measured by an oxygen concentration device (for example, MODEL3600 manufactured by Hack Ultra Analytical, or the like) in an environment of 25° C. and a relative humidity of 50% is employed.

In the present invention, the oxygen permeability is preferably 100 cc/m$^2$/day/atm or less, more preferably 30 cc/m$^2$/day/atm or less, still more preferably 10 cc/m$^2$/day/atm or less, and most preferably 3 cc/m$^2$/day/atm or less.

Specific examples of the oxygen shielding layer include layers containing an organic compound such as polyvinyl alcohol, polyethylene vinyl alcohol, polyvinyl ether, polyvinyl pyrrolidone, polyacrylamide, polyacrylic acid, cellulose ether, polyamide, polyimide, a styrene-maleic acid copolymer, gelatin, vinylidene chloride, and a cellulose nanofiber. From the viewpoint of high oxygen shielding capacity, polyvinyl alcohol or polyethylene vinyl alcohol is preferable, and polyvinyl alcohol is particularly preferable.

Examples of a compound which has a high oxygen shielding function and is a polymerizable compound include a polymerizable compound having high hydrogen bonding properties, and a compound having a large number of polymerizable groups per molecular weight. Examples of the compound having a large number of polymerizable groups per molecular weight include pentaerythritol tetra(meth)acrylate and dipentaerythritol hexa(meth)acrylate.

Specific examples of the polymerizable compound having high hydrogen bonding properties include compounds represented by the following formulae, and among them, 3',4-epoxycyclohexylmethyl-3,4-epoxycyclohexane carboxylate represented by the following CEL2021P is preferable.

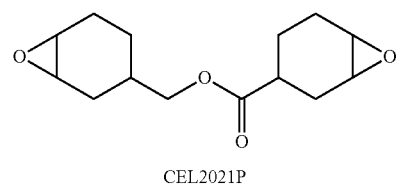

CEL2021P

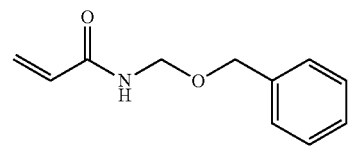

2-Phenoxyethyl acrylate

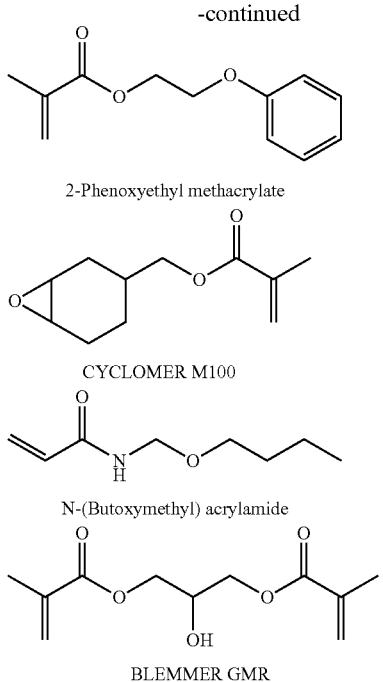

In addition, a thin layer (thin metal compound layer) consisting of a metal compound is also mentioned. As a method for forming the thin metal compound layer, any method can be used as long as a desired thin layer can be formed by the method. For example, a sputtering method, a vacuum deposition method, an ion plating method, and a plasma chemical vapor deposition (CVD) method are suitable, and specifically, the formation methods described in JP3400324B, JP2002-322561A, and JP2002-361774A can be employed.

A component contained in the thin metal compound layer is not particularly limited as long as the component exhibits the oxygen shielding function, and for example, an oxide, a nitride, an oxynitride, or the like which contains one or more kinds of metals selected from Si, Al, In, Sn, Zn, Ti, Cu, Ce, and Ta can be used. Among them, an oxide, nitride, or oxynitride of a metal selected from Si, Al, In, Sn, Zn, and Ti is preferable, and an oxide, nitride, or oxynitride of a metal selected from Si, Al, Sn, and Ti is particularly preferable. The oxide, nitride, or oxynitride may contain other elements as secondary components. A layer consisting of a reaction product of an aluminum compound and a phosphorus compound, as described in JP2016-040120A or JP2016-155255A, is also preferable.

In addition, the oxygen shielding layer may be in a form in which a layer containing the organic material and the thin metal compound layer are laminated, for example, as described in U.S. Pat. No. 6,413,645B, JP2015-226995A, JP2013-202971A, JP2003-335880A, JP1978-012953B (JP-S53-012953B), and JP1983-217344A (JP-S58-217344A), or may be a layer in which an organic compound and an inorganic compound are hybridized, as described in WO2011/011836A, JP2013-248832A, and JP3855004B.

In a case of the layer containing the organic compound, the film thickness of the oxygen shielding layer is preferably 0.1 to 10 μm and more preferably 0.5 to 5.5 μm. In a case of the thin metal compound layer, the film thickness of the oxygen shielding layer is preferably 5 nm to 500 nm and more preferably 10 nm to 200 nm.

For example, it is also preferable that the oxygen shielding function is imparted to other functional layers such as a refractive index-adjusting layer, an adhesive layer, and a surface protective layer, and the functions are integrated. It is particularly preferable that the adhesive layer between the refractive index-adjusting layer and the film of the surface protective layer has an oxygen shielding function.

[Cured Layer]

As described above, the laminate according to the embodiment of the present invention may include a cured layer.

The cured layer used in the present invention is preferably a layer disposed so as to be in contact with the light-absorbing anisotropic layer, and is more preferably a refractive index-adjusting layer which is for performing so-called index matching, is formed of a composition containing a compound having a crosslinkable group, and has an in-plane average refractive index of 1.55 to 1.70 at a wavelength of 550 un.

The in-plane average refractive index of the refractive index-adjusting layer may be within the above range, but is preferably 1.58 to 1.70 and more preferably 1.60 to 1.70.

A thickness of the refractive index-adjusting layer is not particularly limited, but is preferably 0.01 to 2.00 μm, more preferably 0.01 to 0.80 μm, and still more preferably 0.01 to 0.15 μm, from the viewpoint of reduction in thickness.

A type of a component constituting the refractive index-adjusting layer is not particularly limited as long as the component contains a compound having a crosslinkable group. The hardness in the layer can be ensured by the presence of the crosslinkable group. A compound cured by light or heat, for example, a polymerizable compound having a (meth)acryloyl group or an epoxy group is preferable. Moreover, from the viewpoint that a high in-plane average refractive index can be obtained, a polymerizable liquid crystalline compound is also preferable. Furthermore, the polymerizable liquid crystalline compound can control the anisotropy of the refractive index in the plane, and thus has a high potential for optimizing the refractive index with the light-absorbing anisotropic layer having the refractive index anisotropy in the plane.

The refractive index-adjusting layer may contain particles together with the compound having a crosslinkable group. Examples of the particles include organic particles, inorganic particles, and organic-inorganic composite particles containing an organic component and an inorganic component.

Examples of the organic particles include styrene resin particles, styrene-divinylbenzene copolymer particles, acrylic resin particles, methacrylic resin particles, styrene-acryl copolymer particles, styrene-methacryl copolymer particles, melamine resin particles, and resin particles containing two or more kinds thereof.

Examples of a component constituting the inorganic particles include a metal oxide, a metal nitride, a metal oxynitride, and a metal simple substance. Examples of a metallic atom contained in the above-mentioned metal oxide, metal nitride, metal oxynitride, and metal simple substance include a titanium atom, a silicon atom, an aluminum atom, a cobalt atom, and a zirconium atom. Specific examples of the inorganic particles include inorganic oxide particles such as alumina particles, hydrated alumina particles, silica particles, zirconia particles, and a clay mineral (for example, smectite). From the viewpoint that a high refractive index can be obtained, zirconia particles are preferable.

An average particle diameter of the particles is preferably 1 to 300 nm and more preferably 10 to 200 nm.

In a case where the average particle diameter is within the above range, a cured product (transparent resin layer) having excellent dispersibility of the particles and superior high-temperature durability, moisture-heat resistance, and transparency can be obtained.

Here, the average particle diameter of the particles can be obtained from a photograph obtained by observation with a transmission electron microscope (TEM) or a scanning electron microscope (SEM). Specifically, the projected area of the particle is obtained, and the corresponding circle-equivalent diameter (a diameter of a circle) is taken as the average particle diameter of the particles. Moreover, the average particle diameter in the present invention is an arithmetic mean value of circle-equivalent diameters obtained for 100 particles. The particles may have any shape such as a spherical shape, a needle shape, a fiber (fiber shape), a columnar shape, and a plate shape.

The content of the particles in the refractive index-adjusting layer is not particularly limited, but is preferably 1% to 50% by mass and more preferably 1% to 30% by mass, with respect to the total mass of the refractive index-adjusting layer, from the viewpoint that the in-plane average refractive index of the refractive index-adjusting layer is easily adjusted.

A method for forming the refractive index-adjusting layer is not particularly limited, but examples thereof include a method in which a composition for forming a refractive index-adjusting layer is applied onto a polarizer, and as needed, the coating film is subjected to a curing treatment.

The composition for forming a refractive index-adjusting layer contains components which can constitute the refractive index-adjusting layer, and examples thereof include a resin, a monomer, and particles. Examples of the resin and the particles are as described above.

Examples of the monomer include a photocurable compound and a thermosetting compound (for example, a thermosetting resin). As the monomer, a monofunctional polymerizable compound containing one polymerizable group in one molecule, and a polyfunctional polymerizable compound containing the same or different two or more polymerizable groups in one molecule are preferable. The polymerizable compound may be a monomer or a multimer such as an oligomer or a prepolymer.

Examples of the polymerizable group include a radically polymerizable group and a cationically polymerizable group, and a radically polymerizable group is preferable. Examples of the radically polymerizable group include an ethylenically unsaturated bond group. Examples of the cationically polymerizable group include an epoxy group and an oxetane group.

The composition for forming a refractive index-adjusting layer may contain at least one kind of an interface modifier, a polymerization initiator, or a solvent. Examples of these components include the compounds exemplified as the components which may be contained in the composition for forming a light-absorbing anisotropic layer.

A method for applying the composition for forming a refractive index-adjusting layer is not particularly limited, and examples thereof include the above-mentioned method for applying the composition for forming a light-absorbing anisotropic layer.

After the composition for forming a refractive index-adjusting layer is applied, as needed, the coating film may be subjected to a drying treatment.

Furthermore, in a case where the composition for forming a refractive index-adjusting layer contains a curable compound such as a monomer, after the composition for forming a refractive index-adjusting layer is applied, the coating film may be subjected to a curing treatment.

Examples of the curing treatment include a photo-curing treatment and a heat-curing treatment, and optimal conditions are selected according to the material used.

In a case where the polymerizable liquid crystalline compound is used as the compound having a crosslinkable group, the compound is not particularly limited.

In general, the liquid crystalline compound can be classified into a rod-like type and a disk-like type according to the shape thereof. Furthermore, each liquid crystalline compound has a low-molecular type and a high-molecular type. In general, the high-molecular indicates that a degree of polymerization is 100 or higher (Polymer Physics:Phase Transition Dynamics, written by Masao DOI, page 2, Iwanami Shoten, Publishers, 1992).

In the present invention, any liquid crystalline compound can be used, but it is preferable to use a rod-like liquid-crystalline compound (hereinafter, also simply abbreviated as "CLC") or a discotic liquid-crystalline compound (hereinafter, also simply abbreviated as "DLC"), and more preferable to use a rod-like liquid-crystalline compound. Moreover, two or more kinds of rod-like liquid-crystalline compounds, two or more kinds of disk-like liquid-crystalline compounds, or a mixture of a rod-like liquid-crystalline compound and a disk-like liquid-crystalline compound may be used.

In the present invention, in order to fix the above-mentioned liquid crystalline compounds, it is necessary to use a liquid crystalline compound having a polymerizable group, and the liquid crystalline compound more preferably has two or more polymerizable groups in one molecule. Moreover, in a case where a mixture of two or more kinds thereof is used as the liquid crystalline compound, it is preferable that at least one kind of liquid crystalline compound has two or more polymerizable groups in one molecule. Furthermore, after the liquid crystalline compound is fixed by polymerization, it is no longer necessary to exhibit liquid crystallinity.

In addition, a type of the polymerizable group is not particularly limited, and is preferably a functional group capable of an addition polymerization reaction and preferably a polymerizable ethylenically unsaturated group or a ring polymerizable group. More specifically, a (meth)acryloyl group, a vinyl group, a styryl group, an allyl group, and the like are preferably mentioned, and a (meth)acryloyl group is more preferable. Moreover, the (meth)acryloyl group is a notation representing a methacryloyl group or an acryloyl group.

As the rod-like liquid-crystalline compound, for example, the compounds described in claim 1 of JP1999-513019A (JP-H11-513019A) or paragraphs [0026] to [0098] of JP2005-289980A can be preferably used, and as the discotic liquid-crystalline compound, for example, the compounds described in paragraphs [0020] to [0067] of JP2007-108732A or paragraphs [0013] to [0108] of JP2010-244038A can be preferably used, but the present invention is not limited to these examples.

<Other Components>

Specific examples of other components contained in the composition for forming a refractive index-adjusting layer include the polymerization initiator, surfactant, and solvent described for the above-mentioned composition (composition for forming a light-absorbing anisotropic layer) containing the dichroic azo coloring agent compound.

<Formation Method>

A method for forming a refractive index-adjusting layer using the above-mentioned composition for forming a refractive index-adjusting layer is not particularly limited, and examples thereof include a method including a step (hereinafter, also referred to as a "coating film formation step") of applying the above-mentioned composition for forming a refractive index-adjusting layer onto the above-mentioned alignment layer or the above-mentioned light-absorbing anisotropic layer according to the layer configuration to form a coating film, and a step (hereinafter, also referred to as an "alignment step") of aligning liquid crystalline components contained in the coating film, in this order.

Here, as the coating film formation step and the alignment step, the same steps as those described for the above-mentioned method for forming a light-absorbing anisotropic layer are mentioned.

[Surface Protective Layer]

The laminate according to the embodiment of the present invention may include a surface protective layer at a position on a side of the pressure sensitive adhesive layer 1 opposite to a side where the light-absorbing anisotropic layer is provided, that is, the most visually recognized side in a case where the laminate is used as a part of a display device.

The surface protective layer is not limited as long as the layer has a function of protecting the surface, and may be a single layer or a plurality of layers. Not only high hardness is preferable, but also high recoverability is preferable. A low-reflection layer, which suppresses surface reflection occurring at an air interface, is also preferable.

As one of the preferred aspects, an aspect in which a support and/or a surface coating layer is provided is mentioned. The support and the surface coating layer will be described below.

<Support>

The surface protective layer preferably has a support, and more preferably has a transparent support.

Here, "transparent" in the present invention indicates that a transmittance of visible light is 60% or greater, preferably 80% or greater, and particularly preferably 90% or greater.

Specific examples of the transparent support include a glass substrate and a plastic substrate, and among them, a plastic substrate is preferable.

Examples of the plastic constituting the plastic substrate include polyolefin such as polyethylene, polypropylene, and a norbornene-based polymer; a cyclic olefin-based resin; polyvinyl alcohol; polyethylene terephthalate; polymethacrylic acid ester; polyacrylic acid ester; cellulose ester such as triacetyl cellulose (TAC), diacetyl cellulose, and cellulose acetate propionate; polyethylene naphthalate; polycarbonate; polysulfone; polyether sulfone; polyether ketone; polyphenylene sulfide; polyphenylene oxide; and a polyimide resin.

Among them, cellulose ester, a cyclic olefin-based resin, polyethylene terephthalate, and polymethacrylic acid ester are preferable from the viewpoint of easy availability from the market or excellent transparency, and a polyimide resin is preferable from the viewpoint of excellent flexibility.

The polyimide has a high refractive index and thus there is a possibility of a large refractive index gap, but it is also preferable to adjust the refractive index by a method such as mixing of silica particles. Details of the polyimide are described in WO2018/062296A or WO2018/062190A.

A thickness of the transparent support is preferably thin enough to maintain hardness and workability, from the viewpoint that the mass is sufficient for practical handling and the viewpoint that sufficient transparency can be ensured.

A thickness of the glass substrate is preferably 100 to 3,000 μm and more preferably 100 to 1,000 m.

A thickness of the plastic substrate is preferably 5 to 300 μm and more preferably 5 to 200 μm.

Furthermore, in a case where the laminate according to the embodiment of the present invention is used as a circularly polarizing plate (particularly, a case of being used as a circularly polarizing plate for a mobile device application), the thickness of the transparent support is preferably about 5 to 100 μm.

<Surface Coating Layer>

Examples of the surface coating layer include at least one selected from the group consisting of an antireflection layer, an antiglare layer, and a hard coat layer. Among them, a hard coat layer is preferable. Well-known layer materials are used for the layers. Furthermore, the layers may be laminated in a plurality of layers.

The antireflection layer refers to a structure which reduces reflection by a structure using light interference, unlike the above-mentioned antireflection plate of a so-called circularly polarizing plate which is configured with the optically anisotropic layer and the light-absorbing anisotropic layer. The antireflection layer may have a configuration consisting of only a layer of low refractive index, as the simplest configuration. Moreover, in order to further reduce a reflectivity, the antireflection layer is preferably configured by combining a layer of high refractive index having a high refractive index with a layer of low refractive index having a low refractive index. Examples of the configuration include a configuration including two layers of the layer of high refractive index/the layer of low refractive index in this order from a lower side and a configuration in which three layers having different refractive indices are laminated in the order of a layer of medium refractive index (layer having a refractive index which is higher than that of an underlayer and lower than that of the layer of high refractive index)/the layer of high refractive index/the layer of low refractive index, and a configuration in which more antireflection layers are laminated is also proposed. Among them, from the viewpoint of durability, optical characteristics, cost, or productivity, it is preferable that the layer of medium refractive index/the layer of high refractive index/the layer of low refractive index are provided in this order on a hard coat layer, and examples thereof include configurations described in JP1996-122504A (JP-H08-122504A), JP1996-110401A (JP-H08-110401A), JP1998-300902A (JP-H10-300902A), JP2002-243906A, JP2000-111706A, and the like. Moreover, an antireflection film having a three-layer configuration, which is excellent in robustness against a film thickness variation, is described in JP2008-262187A. In a case where the antireflection film having a three-layer configuration is installed on a surface of an image display device, an average value of the reflectivity can be 0.5% or less, reflected glare can be significantly reduced, and an image having an excellent stereoscopic effect can be obtained. Furthermore, other functions may be imparted to each layer, and examples thereof include a layer of low refractive index having antifouling properties, a layer of high refractive index having antistatic properties, a hard coat layer having antistatic properties, and a hard coat layer having anti-glare characteristics (for example, JP1998-206603A (JP-H10-206603A), JP2002-243906A, JP2007-264113A, and the like).

Meanwhile, as the hard coat layer, a hard coat formed of a silsesquioxane compound having the structure described in JP2015-212353A or JP2017-008148A can be suitably used.

[Photo-Alignment Layer]

In the laminate according to the embodiment of the present invention, from the viewpoint of improvement in the degree of alignment of the organic dichroic substance (particularly, the dichroic azo coloring agent compound), a photo-alignment layer containing a photoactive compound is preferably utilized.

The photo-alignment layer can also be removed in the step of adhering the optically anisotropic layer to the light-absorbing anisotropic layer, but it is also preferable that the photo-alignment layer is disposed to be left between the optically anisotropic layer and the light-absorbing anisotropic layer. In this case, from the viewpoint of the film hardness of the laminate, the photo-alignment layer is preferably formed of a compound having a crosslinkable group. As the crosslinkable group, a radically polymerizable group and a cationically polymerizable group are preferable, and a radically polymerizable group is more preferable. Examples of the radically polymerizable group include an ethylenically unsaturated bond group. Examples of the cationically polymerizable group include an epoxy group and an oxetane group.

The photo-alignment layer refers to an alignment layer to which alignment regulating force is imparted by applying a composition containing a compound having a photoreactive group and a solvent to a substrate and performing irradiation with polarized light (preferably, polarized UV). The photoreactive group refers to a group generating a liquid crystal alignment capability by irradiation with light. Specifically, the photoreactive group causes alignment induction of molecules (called a photoactive compound) generated by irradiation with light, or a photoreaction which is an origin of a liquid crystal alignment capability, such as an isomerization reaction, a dimerization reaction, a photocrosslinking reaction, or a photodegradation reaction. The photoreactive group preferably has an unsaturated bond, particularly a double bond, and a group having at least one bond selected from the group consisting of a carbon-carbon double bond (C=C bond), a carbon-nitrogen double bond (C=N bond), a nitrogen-nitrogen double bond (N=N bond), and a carbon-oxygen double bond (C=O bond) is more preferable.

Examples of the photoreactive group having a C=C bond include a vinyl group, a polyene group, a stilbene group, a stilbazole group, a stilbazolium group, a chalcone group, and a cinnamoyl group. Examples of the photoreactive group having a C=N bond include a group having a structure of an aromatic Schiff's base, an aromatic hydrazone, or the like. Examples of the photoreactive group having a C=O bond include a benzophenone group, a coumarin group, an anthraquinone group, and a maleimide group. Examples of the photoreactive group having an N=N bond include an azobenzene group, an azonaphthalene group, an aromatic heterocyclic azo group, a bisazo group, a formazan group, and a group having azoxybenzene as a basic structure. These groups may have a substituent such as an alkyl group, an alkoxy group, an aryl group, an allyloxy group, a cyano group, an alkoxycarbonyl group, a hydroxyl group, a sulfonic acid group, and a halogenated alkyl group. Among them, a cinnamoyl group or an azobenzene group is preferable since a polarization irradiation amount required for photo alignment is relatively small and a photo-alignment layer having excellent heat stability or temporal stability is easily obtained. Specific compounds are described in paragraphs [0211] to [0263] of JP5300776B, and are preferably used.

The photo-alignment layer formed of the above-mentioned materials is irradiated with a linearly polarized light or non-polarized light to manufacture a photo-alignment layer.

In the present specification, the "irradiation with linearly polarized light" and the "irradiation with non-polarized light" are operations for causing a photoreaction to occur in a photo-alignment material. A wavelength of the light to be used depends on the photo-alignment material to be used, and is not particularly limited as long as the wavelength is a wavelength necessary for the photoreaction. A peak wavelength of light used for light irradiation is preferably 200 nm to 700 nm, and ultraviolet light having a peak wavelength of light of 400 nm or less is more preferable.

As a light source used for light irradiation, a generally used light source can be used, for example, a lamp such as a tungsten lamp, a halogen lamp, a xenon lamp, a xenon flash lamp, a mercury lamp, a mercury xenon lamp, and a carbon arc lamp, various lasers [for example, a semiconductor laser, a helium neon laser, an argon ion laser, a helium cadmium laser, and an yttrium-aluminum-garnet (YAG) laser], a light emitting diode, and a cathode ray tube can be mentioned.

As a means for obtaining linearly polarized light, a method using a polarizing plate (for example, an iodine polarizing plate, a two-color coloring agent polarizing plate, and a wire grid polarizing plate), a method using a prism-based element (for example, a Glan-Thompson prism) or a reflective-type polarizer using Brewster's angle, or a method using light emitted from a laser light source having polarized light can be employed. Moreover, only light having a required wavelength may be selectively radiated using a filter, a wavelength conversion element, or the like.

In a case where the light to be radiated is linearly polarized light, a method for irradiating an alignment layer with light, from an upper surface or a back surface perpendicularly or obliquely to the surface of the alignment layer is employed. An incidence angle of the light varies depending on the photo-alignment material, but is preferably 0° to 90° (perpendicular) and more preferably 40° to 90°.

In a case of non-polarized light, the alignment layer is irradiated with non-polarized light obliquely. An incidence angle thereof is preferably 10° to 80°, more preferably 20° to 60°, and still more preferably 30° to 50°.

An irradiation time is preferably 1 minute to 60 minutes and more preferably 1 minute to 10 minutes.

In a case where patterning is necessary, a method for performing light irradiation using a photo mask as many times as necessary for pattern production or a method for writing a pattern by laser light scanning can be employed.

[Image Display Device]

The image display device according to the embodiment of the present invention is an image display device including the above-mentioned laminate according to the embodiment of the present invention, and an image display element, in which the image display element is disposed on a side of the pressure sensitive adhesive layer 2 opposite to a side where the light-absorbing anisotropic layer is provided.

The display element used in the image display device according to the embodiment of the present invention is not particularly limited, and examples thereof include a liquid crystal cell, an organic EL display panel, and a plasma display panel.

Among them, a liquid crystal cell or an organic EL display panel is preferable and a liquid crystal cell is more preferable. That is, as the image display device according to the embodiment of the present invention, a liquid crystal display device using a liquid crystal cell as a display element or an organic EL display device using an organic EL display panel as a display element is preferable, and an organic EL display device is more preferable.

[Organic EL Display Device]

As an organic EL display device which is an example of the image display device according to the embodiment of the present invention, for example, an aspect in which the above-mentioned laminate according to the embodiment of the present invention and an organic EL display panel are provided in this order from the visually recognized side is suitably mentioned. In this case, in the laminate, a surface protective layer, an adhesive layer or a pressure sensitive adhesive layer which is disposed as needed, an oxygen shielding layer, a refractive index-adjusting layer, a light-absorbing anisotropic layer, an adhesive layer or a pressure sensitive adhesive layer which is disposed as needed, and an optically anisotropic layer are disposed in this order from the visually recognized side.

In addition, the organic EL display panel is a display panel configured using an organic EL element in which an organic light emitting layer (organic electroluminescent layer) is sandwiched between electrodes (between a cathode and an anode). The configuration of the organic EL display panel is not particularly limited, and a well-known configuration is employed.

[Other Configurations]

The pressure sensitive adhesive layer or support used in the present invention may contain an ultraviolet absorber.

The ultraviolet absorber is not particularly limited, various well-known ultraviolet absorbers can be used, but it is preferable that a transmittance of the pressure sensitive adhesive layer is 0.1% or less in a wavelength range of 350 to 390 nm, 20% to 70% at 410 nm, and 90% or greater in a range of 450 nm or greater. The transmittance at a wavelength of 410 nm is more preferably 40% to 50%.

In the image display device according to the embodiment of the present invention, in a case where the curing-type adhesive layer is disposed closer to a visually recognized side than the light-absorbing anisotropic layer, in order to improve the light resistance of the light-absorbing anisotropic layer, it is preferable that the curing-type adhesive layer contains an ultraviolet absorber. In a case where the curing-type adhesive layer is an ultraviolet ray curing-type adhesive layer, it is preferable that a wavelength for curing the ultraviolet ray curing-type adhesive layer is shifted from an absorption wavelength of the ultraviolet absorber.

The oxygen shielding layer used in the present invention may contain a radical trapping agent. By incorporating the radical trapping agent into the oxygen shielding layer, the light resistance of the light-absorbing anisotropic layer can be improved.

As the radical trapping agent, a compound having a TEMPO structure is preferable, and a compound having a plurality of TEMPO structures is more preferable.

As commercially available compounds, Benzoloxy-TEMPO, Acetamide-TEMPO, and Isothiocyanate-TEMPO (Tokyo Chemical Industry Co., Ltd.) can be used.

The light-absorbing anisotropic layer included in the laminate according to the embodiment of the present invention is highly resistant to ammonia exposure by using the dichroic azo coloring agent compound, and thus is preferable.

A pressure sensitive adhesive layer having a small thickness and a high storage elastic modulus has a high pencil hardness, and thus is preferable. In particular, a pressure sensitive adhesive layer adjacent to the surface film is greatly influenced. From the viewpoint of the pencil hardness, it is preferable to use an adhesive having a high storage elastic modulus, such as a PVA adhesive, a UV adhesive, and a thermosetting adhesive, without using the pressure sensitive adhesive.

In the steps of manufacturing the laminate according to the embodiment of the present invention, a plurality of thin layers of several μm or less, including the light-absorbing anisotropic layer used in the present invention, is formed on a long substrate by coating, and in any of the subsequent steps, a step of peeling the long substrate may occur. As a result of stress generated at an end part during the peeling, cracks and the like are generated at the end part of a sample, which can be a generation source of dust. In order to solve this problem, it is effective to devise a peeling method for reducing bending stress during the peeling, which is applied to the laminate of the thin layers, but it is also effective to appropriately adjust the coating width and coating thickness of each layer. As an example of a preferred aspect, in the configuration of the long support, the alignment layer, the light-absorbing anisotropic layer, the cured layer, and the oxygen shielding layer, it is effective to make the coating width of the alignment layer wider than the coating widths of the other layers. That is, it is preferable that a region where only the alignment layer is present on the long support is at the end part. Furthermore, the thickness of the alignment layer is preferably 1 μm to 10 μm and more preferably 2 μm to 5 μm, from the viewpoint of cracks at the end part.

EXAMPLES

Hereinafter, the present invention will be described in more detail with reference to Examples. The materials, the amounts of materials used, the ratios, the treatment details, the treatment procedure, or the like shown in the following Examples can be appropriately modified without departing from the spirit of the present invention. Therefore, the scope of the present invention will not be restrictively interpreted by the following Examples.

Production Example 1

<Production of Cellulose Acylate Film 1>

(Production of Core Layer Cellulose Acylate Dope)

The following composition was introduced into a mixing tank and stirred to dissolve the respective components, thereby preparing a cellulose acetate solution used as a core layer cellulose acylate dope.

| Core layer cellulose acylate dope | |
| --- | --- |
| Cellulose acetate having acetyl substitution degree of 2.88 | 100 parts by mass |
| Polyester compound B described in Examples of JP2015-227955A | 12 parts by mass |
| The following compound F | 2 parts by mass |
| Methylene chloride (first solvent) | 430 parts by mass |
| Methanol (second solvent) | 64 parts by mass |

Core layer cellulose acylate dope

Compound F

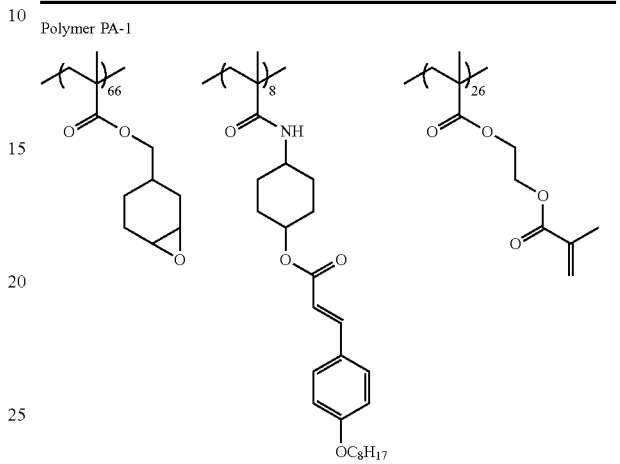

(Production of Outer Layer Cellulose Acylate Dope)

To 90 parts by mass of the core layer cellulose acylate dope was added 10 parts by mass of the following matting agent solution to prepare a cellulose acetate solution used as an outer layer cellulose acylate dope.

| Matting agent solution | |
|---|---|
| Silica particles having average particle size of 20 nm (AEROSIL R972, produced by NIPPON AEROSIL CO., LTD.) | 2 parts by mass |
| Methylene chloride (first solvent) | 76 parts by mass |
| Methanol (second solvent) | 11 parts by mass |
| The above core layer cellulose acylate dope | 1 part by mass |

(Production of Cellulose Acylate Film 1)

The core layer cellulose acylate dope and the outer layer cellulose acylate dope were filtered with filter paper having an average pore diameter of 34 μm and a sintered metal filter having an average pore diameter of 10 μm, and then three layers of the core layer cellulose acylate dope and the outer layer cellulose acylate dopes on both sides thereof were cast onto a drum at 20° C. from casting ports at the same time (band casting machine).

Subsequently, the film was peeled in the state where the solvent content reached approximately 20% by mass, the both ends of the film in the width direction were fixed with tenter clips, and the film was dried while being stretched at a stretching ratio of 1.1 times in the cross direction.

Thereafter, the film was transported between rolls in a heat treatment device and further dried to produce an optical film having a thickness of 40 μm, which was used as a cellulose acylate film 1. The in-plane retardation of the obtained cellulose acylate film 1 was 0 nm.

<Formation of Photo-Alignment Layer PA1>

A coating liquid PA1 for forming a photo-alignment layer, which will be described later, was continuously applied onto the cellulose acylate film 1 with a wire bar. The support on which the coating film was formed was dried with hot air at 140° C. for 120 seconds, and subsequently, the coating film was irradiated with polarized ultraviolet rays (10 mJ/cm², using an ultra-high-pressure mercury lamp) to form a photo-alignment layer PA1, whereby a TAC film with a photo-alignment layer was obtained.

The film thickness of the photo-alignment layer PA1 was 1.0 μm.

| (Coating liquid PA1 for forming photo-alignment layer) | |
|---|---|
| The following polymer PA-1 | 100.00 parts by mass |
| The following acid generator PAG-1 | 5.00 parts by mass |
| The following acid generator CPI-110TF | 0.005 parts by mass |
| Xylene | 1,220.00 parts by mass |
| Methyl isobutyl ketone | 122.00 parts by mass |

Polymer PA-1

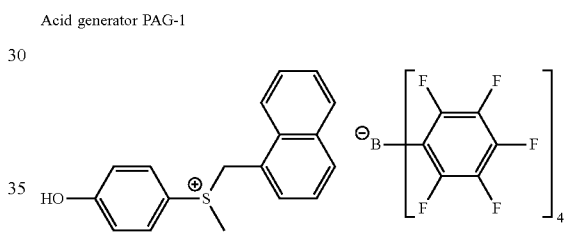

Acid generator PAG-1

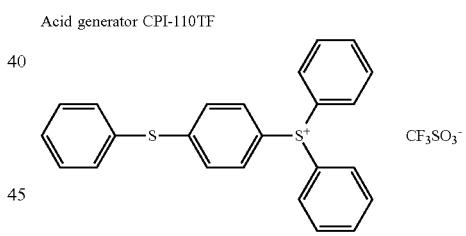

Acid generator CPI-110TF

<Formation of Light-Absorbing Anisotropic Layer P1>

The following composition P1 for forming a light-absorbing anisotropic layer was continuously applied onto the obtained photo-alignment layer PA1 with a wire bar to form a coating layer P1.

Next, the coating layer P1 was heated at 140° C. for 30 seconds, and the coating layer P1 was cooled to room temperature (23° C.).

Subsequently, the coating layer was heated at 90° C. for 60 seconds and cooled again to room temperature.

Thereafter, the coating layer was irradiated with light for 2 seconds under an irradiation condition of an illuminance of 200 mW/cm², using a LED lamp (center wavelength of 365 nm), to produce a light-absorbing anisotropic layer P1 on the photo-alignment layer PA1.

The film thickness of the light-absorbing anisotropic layer P1 was 0.4 μM.

| Composition of composition P1 for forming light-absorbing anistropic layer | |
|---|---|
| The following dichroic substance D-1 | 0.36 parts by mass |
| The following dichroic substance D-2 | 0.53 parts by mass |
| The following dichroic substance D-3 | 0.31 parts by mass |
| The following high-molecular liquid crystalline compound P-1 | 3.58 parts by mass |
| Polymerization initiator IRGACURE OXE-02 (produced by BASF SE) | 0.050 parts by mass |
| The following interface modifier F-1 | 0.026 parts by mass |
| The following interface modifier F-2 | 0.026 parts by mass |
| Cyclopentanone | 45.00 parts by mass |
| Tetrahydrofuran | 45.00 parts by mass |
| Benzyl alcohol | 5.00 parts by mass |

D-1

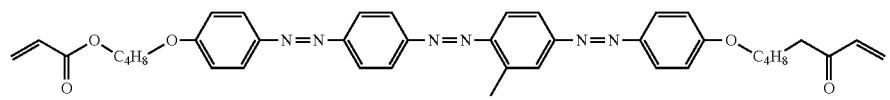

D-2

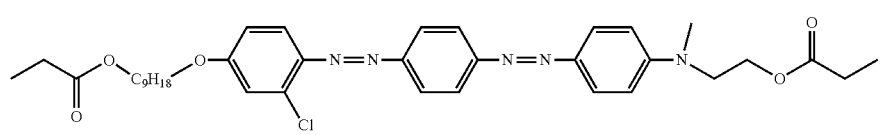

D-3

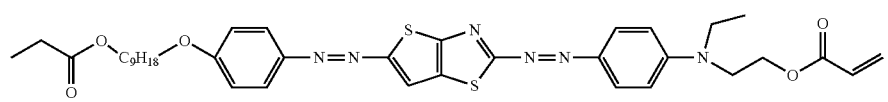

High-molecular liquid crystalline compound P-1

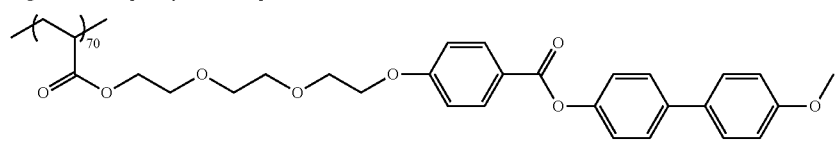

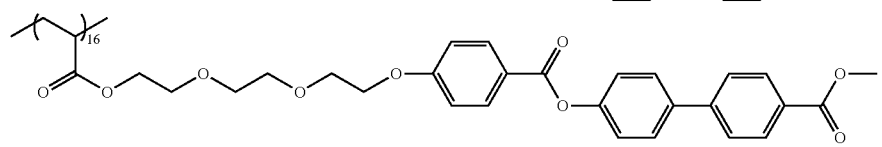

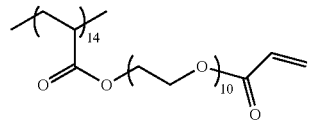

Interface modifier F-1

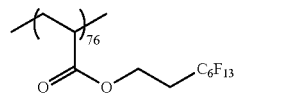

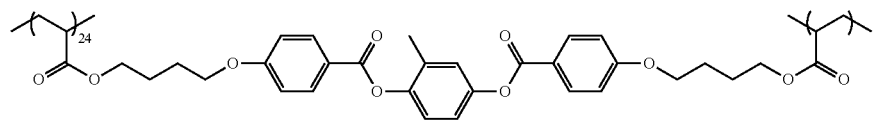 [SMILES: CCC(C)C(=O)OCCCCOc1ccc(C(=O)Oc2ccc(OC(=O)c3ccc(OCCCCOC(=O)C(C)CC)cc3)c(C)c2)cc1]

Interface modifier F-2 (molecular weight of 8,000)

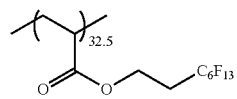

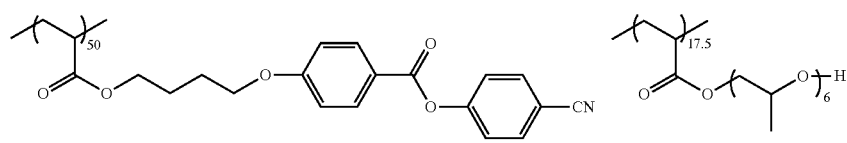 [SMILES: CCC(C)C(=O)OCCCCOc1ccc(C(=O)Oc2ccc(C#N)cc2)cc1 ; CCC(C)C(=O)OCC(C)O]

Formation of Cured Layer N1

The following composition N1 for forming a cured layer was continuously applied onto the obtained light-absorbing anisotropic layer P1 with a wire bar to form a cured layer N1.

Subsequently, the cured layer N1 was dried at room temperature and then irradiated with light for 15 seconds under an irradiation condition of an illuminance of 28 mW/cm², using a high-pressure mercury lamp, to produce the cured layer N1 on the light-absorbing anisotropic layer P1.

The film thickness of the cured layer N1 was 0.05 m (50 nm).

| Composition of composition N1 for forming cured layer | |
|---|---|
| The following mixture L1 of rod-like liquid-crystalline compounds | 2.61 parts by mass |
| The following modified trimethylol propane triacrylate | 0.11 parts by mass |
| The following photopolymerization initiator I-1 | 0.05 parts by mass |
| The following interface modifier F-3 | 0.21 parts by mass |
| Methyl isobutyl ketone | 297 parts by mass |

Mixture L1 of rod-like liquid-crystalline compounds (the numerical values in the following formulae represent % by mass, and R represents a group bonded with an oxygen atom.)

Modified Trimethylol Propane Triacrylate

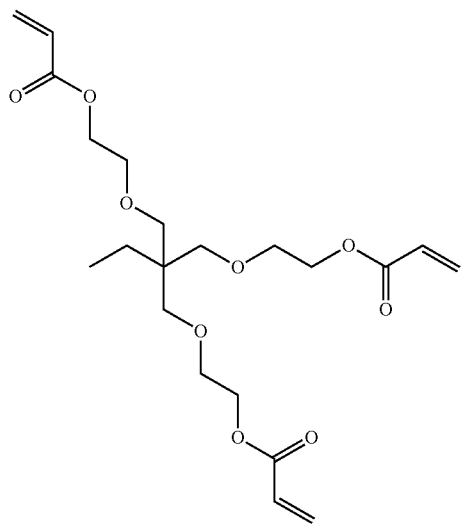

Modified trimethylol propane triacylate

The Following Photopolymerization Initiator 1-1

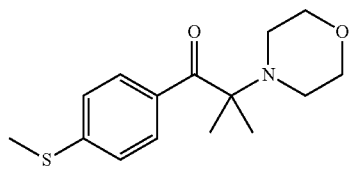 [SMILES: CSc1ccc(C(=O)C(C)(C)N2CCOCC2)cc1]

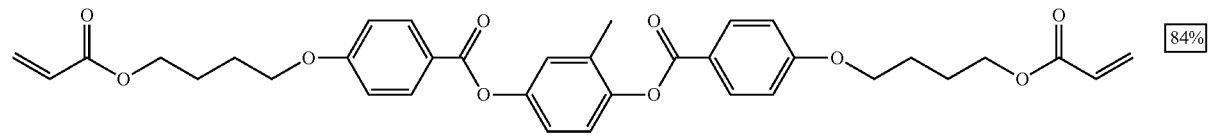

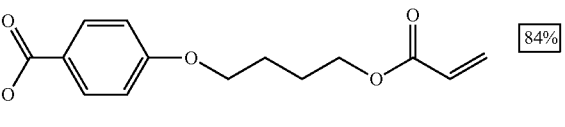

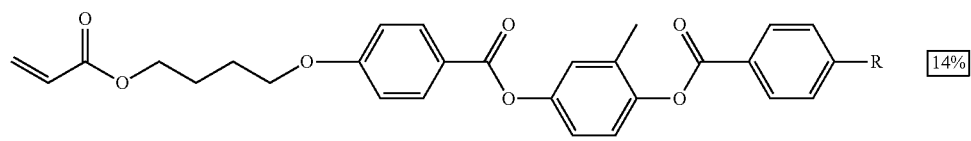

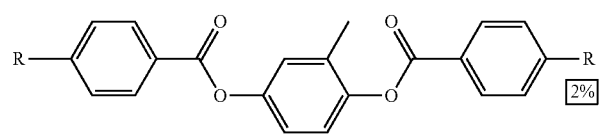

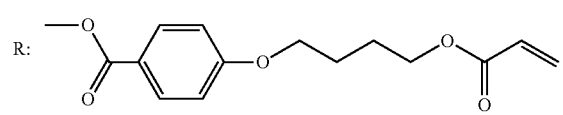

Interface Modifier F-3

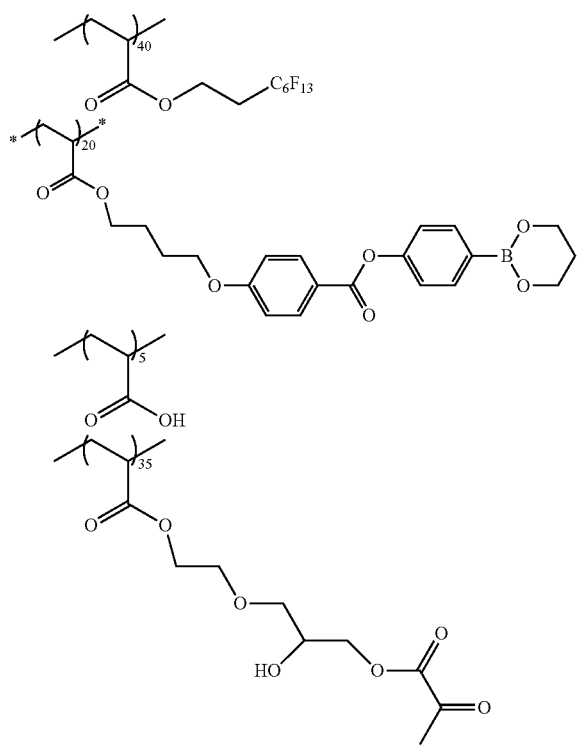

<Formation of Oxygen Shielding Layer B1>

A coating liquid having the following composition was continuously applied onto the cured layer N1 with a wire bar. Thereafter, the layer was dried with hot air at 100° C. for 2 minutes to produce a laminated film 1B in which a polyvinyl alcohol (PVA) layer having a thickness of 1.0 μm was formed on the cured layer N1.

| Composition of composition B1 for forming oxygen shielding layer | |
|---|---|
| The following modified polyvinyl alcohol | 3.80 parts by mass |
| Initiator Irg2959 | 0.20 parts by mass |
| Water | 70 parts by mass |
| Methanol | 30 parts by mass |

Modified polyvinyl alcohol

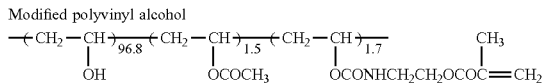

<Production of Surface Protective Layer H1>

As described below, a coating liquid for forming each layer was prepared, and each layer was formed to produce a surface protective layer H1.

(Preparation of Composition for Forming Hard Coat Layer)

Trimethylol propane triacrylate (VISCOAT #295 (produced by OSAKA ORGANIC CHEMICAL INDUSTRY LTD.)) (750.0 parts by mass), poly(glycidyl methacrylate) having a mass average molecular weight of 15,000 (270.0 parts by mass), methyl ethyl ketone (730.0 parts by mass), cyclohexanone (500.0 parts by mass), and a photopolymerization initiator (IRGACURE 184, produced by Ciba Specialty Chemicals Inc.) (50.0 parts by mass) were mixed. The obtained mixture was filtered with a polypropylene-made filter having a pore diameter of 0.4 μm to prepare a composition for forming a hard coat layer.

(Preparation of Composition a for Forming Layer of Medium Refractive Index)

A $ZrO_2$ fine particle-containing hard coating agent (DESOLITE Z7404 [refractive index of 1.72, concentration of solid content: 60% by mass, content of zirconium oxide fine particles: 70% by mass (with respect to the solid content), average particle diameter of zirconium oxide fine particles: about 20 nm, and solvent composition: methyl isobutyl ketone/methyl ethyl ketone=9/1, produced by JSR Corporation]) (5.1 parts by mass), a mixture (DPHA) of dipentaerythritol pentaacrylate and dipentaerythritol hexaacrylate (1.5 parts by mass), a photopolymerization initiator (IRGACURE 907, produced by Ciba Specialty Chemicals Inc.) (0.05 parts by mass), methyl ethyl ketone (66.6 parts by mass), methyl isobutyl ketone (7.7 parts by mass), and cyclohexanone (19.1 parts by mass) were mixed. The obtained mixture was sufficiently stirred and then filtered with a polypropylene-made filter having a pore diameter of 0.4 μm to prepare a composition A for forming a layer of medium refractive index.

(Preparation of Composition B for Forming Layer of Medium Refractive Index)

A mixture (DPHA) of dipentaerythritol pentaacrylate and dipentaerythritol hexaacrylate (4.5 parts by mass), a photopolymerization initiator (IRGACURE 184, produced by Ciba Specialty Chemicals Inc.) (0.14 parts by mass), methyl ethyl ketone (66.5 parts by mass), methyl isobutyl ketone (9.5 parts by mass), and cyclohexanone (19.0 parts by mass) were mixed. The obtained mixture was sufficiently stirred and then filtered with a polypropylene-made filter having a pore diameter of 0.4 μm to prepare a composition B for forming a layer of medium refractive index.

The composition A for forming a layer of medium refractive index and the composition B for forming a layer of medium refractive index were mixed in an appropriate amount so that the refractive index was 1.62, thereby producing a composition for forming a layer of medium refractive index.

(Preparation of Composition for Forming Layer of High Refractive Index)

A $ZrO_2$ fine particle-containing hard coating agent (DESOLITE Z7404 [refractive index of 1.72, concentration of solid content: 60% by mass, content of zirconium oxide fine particles: 70% by mass (with respect to the solid content), average particle diameter of zirconium oxide fine particles: about 20 nm, and solvent composition: methyl isobutyl ketone/methyl ethyl ketone=9/1, produced by JSR Corporation]) (15.7 parts by mass), methyl ethyl ketone (61.9 parts by mass), methyl isobutyl ketone (3.4 parts by mass), and cyclohexanone (1.1 parts by mass) were mixed. The obtained mixture was filtered with a polypropylene-made filter having a pore diameter of 0.4 μm to prepare a composition for forming a layer of high refractive index.

(Preparation of Composition for Forming Layer of Low Refractive Index)

(Synthesis of Perfluoroolefin Copolymer (1))

Perfluoroolefin copolymer (1)

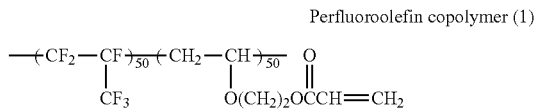

In the structural formula, 50:50 represents a molar ratio.

A stainless steel-made autoclave with a stirrer having an internal volume of 100 ml was charged with ethyl acetate (40 ml), hydroxy ethylvinyl ether (14.7 g), and dilauroyl peroxide (0.55 g), and the inside of the system was degassed and replaced with a nitrogen gas. Hexafluoropropylene (25 g) was further introduced into the autoclave, and the temperature was raised to 65° C. The pressure when the internal temperature of the autoclave reached 65° C. was 0.53 MPa (5.4 kg/cm$^2$). The reaction was continued for 8 hours while maintaining this temperature, and when the pressure reached 0.31 MPa (3.2 kg/cm$^2$), the heating was stopped and the mixture was allowed to cool. When the internal temperature was lowered to room temperature, the unreacted monomer was ejected, the autoclave was opened, and the reaction solution was taken out. The obtained reaction solution was introduced into a large excess of hexane, the solvent was removed by decantation, and the precipitated polymer was taken out. Furthermore, the obtained polymer was dissolved in a small amount of ethyl acetate and reprecipitated twice from hexane to completely remove residual monomers, and drying was performed to obtain a polymer (28 g).

Next, this polymer (20 g) was dissolved in N,N-dimethylacetamide (100 ml) to obtain a solution, and then acrylic acid chloride (11.4 g) was added dropwise to the solution under ice cooling, and the mixture was stirred at room temperature for 10 hours. Ethyl acetate was added to the reaction solution, the resultant was washed with water, an organic phase was extracted and then concentrated, and the obtained polymer was reprecipitated with hexane to obtain a perfluoroolefin copolymer (1) (19 g). The refractive index of the obtained polymer was 1.422.

(Preparation of Sol Liquid a)

Methyl ethyl ketone (120 parts by mass), acryloyloxypropyl trimethoxysilane (KBM-5103, produced by Shin-Etsu Chemical Co., Ltd.) (100 parts by mass), and diisopropoxy aluminum ethyl acetoacetate (trade name: CHELOPE EP-12, produced by Hope Chemical Co., LTD.) (3 parts by mass) were added to a reactor comprising a stirrer and a reflux condenser, and mixed. Thereafter, ion exchange water (31 parts by mass) was further added, and the obtained solution was reacted at 61° C. for 4 hours and then cooled to room temperature to obtain a sol liquid a.

The mass average molecular weight of compounds in the obtained sol liquid a was 1,620, and the proportion of components having a molecular weight of 1,000 to 20,000 in components higher than an oligomer component was 100%. Moreover, in gas chromatography analysis, acryloyloxypropyl trimethoxysilane as a raw material did not remain at all.

(Preparation of Hollow Silica Particle Dispersion Liquid)

Hollow silica particle sol (isopropyl alcohol silica sol, CS60-IPA produced by JGC Catalysts and Chemicals Ltd., average particle diameter of 60 nm, shell thickness of 10 nm, silica concentration of 20%, and refractive index of silica particles of 1.31) (500 parts by mass), acryloyloxypropyl trimethoxysilane (30.5 parts by mass), and diisopropoxy aluminum ethyl acetate (1.51 parts by mass) were mixed, and then ion exchange water (9 parts by mass) was further added.

Next, the obtained solution was reacted at 60° C. for 8 hours and then cooled to room temperature, and acetylacetone (1.8 parts by mass) was added to obtain a dispersion liquid. Thereafter, solvent substitution was performed by distillation under a reduced pressure at a pressure of 30 Torr while adding cyclohexanone so that the content of silica was almost constant, and finally, the concentration was adjusted to obtain a hollow silica particle dispersion liquid having a concentration of the solid content of 18.2% by mass. The residual amount of isopropyl alcohol (IPA) in the obtained dispersion liquid was analyzed by gas chromatography, and as a result, was 0.5% or less.

A composition having the following composition was mixed using the obtained hollow silica particle dispersion liquid and the sol liquid a, and the obtained solution was stirred and then filtered with a polypropylene-made filter having a pore diameter of 1 sum to prepare a composition for forming a layer of low refractive index.

| (Composition of composition for forming layer of low refractive index) | |
|---|---|
| DPHA | 14.5 g |
| PO-1 | 24.5 g |
| Hollow silica particle dispersion liquid | 302.2 g |
| RMS-033 | 5.0 g |
| IRGACURE 907 | 1.0 g |
| Methyl ethyl ketone | 1,750 g |
| Cyclohexanone | 223.0 g |

The respective compounds used in the composition for forming a layer of low refractive index are shown below.

PO-1: Perfluoroolefin copolymer (1)

DPHA: Mixture of dipentaerythritol pentaacrylate and dipentaerythritol hexaacrylate (produced by Nippon Kayaku Co., Ltd.)

RMS-033: Reactive silicone (produced by GELEST, INC.)

IRGACURE 907: Photopolymerization initiator (produced by BASF SE)

(Production of Hard Coat Layer)

A composition for forming a hard coat layer was applied onto a support S1 (TAC substrate having a thickness of 40 μm; and TG40 manufactured by FUJIFILM Corporation) with a gravure coater. The coating film was dried at 100° C., and then cured by performing irradiation with ultraviolet rays with an illuminance of 400 mW/cm$^2$ and an irradiation amount of 150 md/cm$^2$ using an air-cooled metal halide lamp (manufactured by EYE GRAPHICS Co., Ltd.) of 160 W/cm while performing nitrogen purging so that the atmosphere had an oxygen concentration of 1.0% by volume or less, thereby forming a hard coat layer having a thickness of 12 μm. The refractive index thereof was 1.52.

The composition for forming a layer of medium refractive index, the composition for forming a layer of high refractive index, and the composition for forming a layer of low refractive index, each of which the refractive index was adjusted to a desired refractive index, were applied onto the obtained hard coat layer with a gravure coater to produce an antireflection film.

Moreover, the refractive index of each layer was measured with a multi-wavelength abbe refractometer DR-M2 (manufactured by ATAGO CO., LTD.), after applying the composition for forming each layer to a glass plate so as to have a thickness of about 4 sm.

Furthermore, the refractive index measured using a filter of "interference filter for DR-M2 and M4, 546(e) nm, part number: RE-3523" was employed as a refractive index at a wavelength of 550 nm.

The film thickness of each layer was calculated using a reflection spectroscopic film thickness meter "FE-3000" (manufactured by OTSUKA ELECTRONICS Co., LTD.) after laminating the layer of medium refractive index, the layer of high refractive index, and the layer of low refractive index in this order. For the refractive index of each layer in the calculation, the value derived by the abbe refractive index meter was used.

For the layer of medium refractive index, the drying conditions were such that the temperature was 90° C. and the time was 30 seconds, and the ultraviolet ray-curing conditions were such that while performing nitrogen purging so that the atmosphere had an oxygen concentration of 1.0% by volume or less, an air-cooled metal halide lamp (manufactured by EYE GRAPHICS Co., Ltd.) of 180 W/cm was used, the illuminance was 300 mW/cm$^2$, and the irradiation amount was 240 mJ/cm$^2$.

In the cured layer of medium refractive index, the refractive index was 1.62 and the layer thickness was 60 nm.

For the layer of high refractive index, the drying conditions were such that the temperature was 90° C. and the time was 30 seconds, and the ultraviolet ray-curing conditions were such that while performing nitrogen purging so that the atmosphere had an oxygen concentration of 1.0% by volume or less, an air-cooled metal halide lamp (manufactured by EYE GRAPHICS Co., Ltd.) of 240 W/cm was used, the illuminance was 300 mW/cm$^2$, and the irradiation amount was 240 mJ/cm$^2$. In the cured layer of high refractive index, the refractive index was 1.72 and the layer thickness was 110 nm.

For the layer of low refractive index, the drying conditions were such that the temperature was 90° C. and the time was 30 seconds, and the ultraviolet ray-curing conditions were such that while performing nitrogen purging so that the atmosphere had an oxygen concentration of 0.1% by volume or less, an air-cooled metal halide lamp (manufactured by EYE GRAPHICS Co., Ltd.) of 240 W/cm was used, the illuminance was 600 mW/cm$^2$, and the irradiation amount was 600 mJ/cm$^2$. In the cured layer of low refractive index, the refractive index was 1.36 and the layer thickness was 90 nm.

Consequently, the surface protective layer H1 can be produced.

<Production of Pressure Sensitive Adhesive Sheets N1 to N4>

Next, an acrylate-based polymer was prepared according to the following procedure.

In a reaction vessel comprising a cooling pipe, a nitrogen introduction pipe, a thermometer, and a stirrer, 95 parts by weight of butyl acrylate and 5 parts by weight of acrylic acid were polymerized by a solution polymerization method to obtain an acrylate-based polymer A1 having an average molecular weight of 2,000,000 and a molecular weight distribution (Mw/Mn) of 3.0.

Subsequently, using the obtained acrylate-based polymer A1, a composition of an acrylate-based pressure sensitive adhesive was prepared so as to have each composition shown in Table 3 below.

The prepared composition was applied to a separate film (hereinafter, also simply referred to as a "peelable film") surface-treated with a silicone-based release agent with a die coater, and dried for 1 minute in an environment of 90° C., and irradiation with ultraviolet rays (UV) under the following conditions was performed for the composition containing a polyfunctional acrylate monomer and a photopolymerization initiator, whereby each of acrylate-based pressure sensitive adhesive sheets N1 to N4 was obtained.

The compositions of the acrylate-based pressure sensitive adhesives, and the film thicknesses and storage elastic moduli of the pressure sensitive adhesive sheets are shown in Table 3 below.

(UV Irradiation Conditions)

Electrodeless lamp H BULB of Fusion Corporation

Illuminance of 600 mW/cm$^2$ and light quantity of 150 mJ/cm$^2$

The illuminance and light quantity of UV were measured using "UVPF-36" manufactured by EYE GRAPHICS Co., Ltd.

TABLE 3

| | Composition of pressure sensitive adhesive | | | | | | |
|---|---|---|---|---|---|---|---|
| | Acrylate-based polymer A1 | (A) Polyfunctional acrylate-based monomer | (B) Photopolymerization initiator | (C) Isocyanate-based crosslinking agent | (D) Silane coupling agent | Film thickness (μm) | Storage elastic modulus (MPa) |
| Pressure sensitive adhesive sheet N1 | 100 | 11.1 | 1.1 | 1 | 0.2 | 15 | 0.7 |
| Pressure sensitive adhesive sheet N2 | 100 | 11.1 | 1.1 | 1 | 0.2 | 5 | 0.7 |
| Pressure sensitive adhesive sheet N3 | 100 | — | — | 1 | 0.2 | 15 | 0.1 |
| Pressure sensitive adhesive sheet N4 | 100 | — | — | 1 | 0.2 | 25 | 0.1 |

(A) Polyfunctional acrylate-based monomer: Tris(acryloyloxyethyl) isocyanurate, molecular weight = 423, and trifunctional type (produced by TOAGOSEI CO., LTD., trade name "ARONIX M-315")
(B) Photopolymerization initiator: Mixture of benzophenone and 1-hydroxycyclohexyl phenyl ketone in mass ratio of 1:1, and "IRGACURE 500" produced by Ciba Specialty Chemicals Inc.
(C) Isocyanate-based crosslinking agent: Trimethylol propane-modified tolylene diisocyanate ("CORONATE L" produced by Nippon Polyurethane Industry Co., Ltd.)
(D) Silane coupling agent: 3-Glycidoxypropyl trimethoxysilane ("KBM-403" produced by Shin-Etsu Chemical Co., Ltd.)

<Production of Laminate of Production Example 1>

The oxygen shielding layer side of the laminated film 1B was adhered to the support side of the surface protective layer H1, using the pressure sensitive adhesive sheet N1 as the pressure sensitive adhesive layer 1. Moreover, only the cellulose acylate film 1 was removed, the pressure sensitive adhesive sheet N1 as the pressure sensitive adhesive layer 2 was adhered to the surface obtained by the removal to obtain a laminate of Production Example 1.

Production Example 2

The oxygen shielding layer side of the laminated film 1B was adhered to the support side of the surface protective layer H1, using the pressure sensitive adhesive sheet N2 as the pressure sensitive adhesive layer 1. Moreover, only the cellulose acylate film 1 was removed, the pressure sensitive adhesive sheet N2 as the pressure sensitive adhesive layer 2 was adhered to the surface obtained by the removal to obtain a laminate of Production Example 2.

Production Example 3

The oxygen shielding layer side of the laminated film 1B was adhered to the support side of the surface protective layer H1, using the pressure sensitive adhesive sheet N2 as the pressure sensitive adhesive layer 1. Moreover, only the cellulose acylate film 1 was removed, the pressure sensitive adhesive sheet N1 as the pressure sensitive adhesive layer 2 was adhered to the surface obtained by the removal to obtain a laminate of Production Example 3.

Production Example 4

A laminate of Production Example 4 was obtained in the same manner as in Production Example 3, except that the thickness was changed from 1 μm to 2 μm in the formation of the photo-alignment layer of the laminated film 1B of Production Example 3.

In a case where only the cellulose acylate film 1 was removed, the cellulose acylate film side was grabbed, and peeled without bending the other layers, and as a result, peeling with few notches at the end part was possible. Moreover, it was confirmed that by expanding only the coating region of the alignment layer and narrowing the coating regions of the other layers, a region where only the alignment layer was applied onto the cellulose acylate film 1 was caused to be present at an end part in a direction parallel to the peeling direction, and thus the notches at the end part were ameliorated and a smooth end surface was obtained.

Production Example 5

A laminate of Production Example 5 was obtained in the same manner as in Production Example 4, except that the composition P1 for forming a light-absorbing anisotropic layer was changed to the following composition P2 for forming a light-absorbing anisotropic layer and the thickness was changed from 0.4 μm to 0.8 μm, in the formation of the light-absorbing anisotropic layer of the laminated film 1B of Production Example 4.

| Composition of composition P2 for forming light-absorbing anisotropic layer | |
|---|---|
| The following dichroic substance D-4 | 0.36 parts by mass |
| The following dichroic substance D-5 | 0.53 parts by mass |
| The following dichroic substance D-6 | 0.31 parts by mass |
| The following high-molecular liquid crystalline compound P-1 | 3.58 parts by mass |
| Polymerization initiator IRGACURE OXE-02 (manufactured by BASF SE) | 0.050 parts by mass |
| The above interface modifier F-1 | 0.026 parts by mass |
| Cyclopentanone | 45.00 parts by mass |
| Tetrahydrofuran | 45.00 parts by mass |
| Benzyl alcohol | 5.00 parts by mass |

D-4

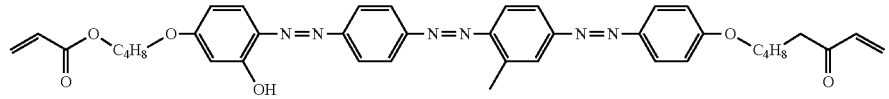

D-5

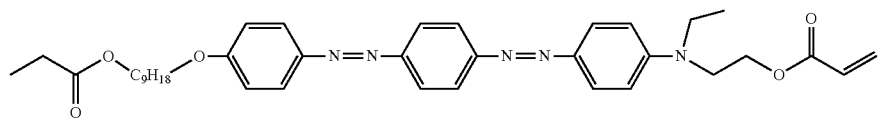

D-6

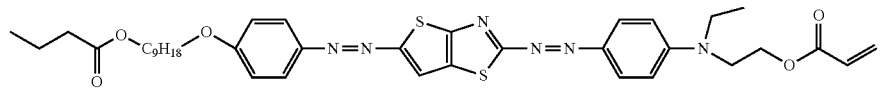

High-molecular liquid crystalline compound P-1

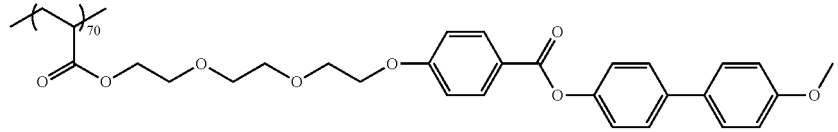 [SMILES: CCC(C)C(=O)OCCOCCOCCOc1ccc(C(=O)Oc2ccc(-c3ccc(OC)cc3)cc2)cc1]

| Composition of composition P2 for forming light-absorbing anisotropic layer |
|---|
| 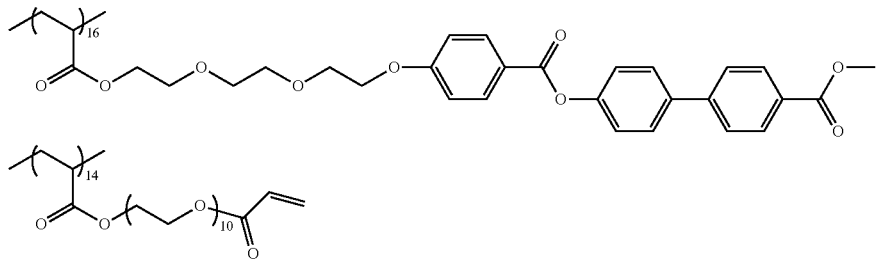 |

Production Example 6

A laminate of Production Example 6 was obtained in the same manner as in Production Example 1, except that the composition P1 for forming a light-absorbing anisotropic layer was changed to the following composition P2 for forming a light-absorbing anisotropic layer and the thickness was changed from 0.4 μm to 0.8 μm, in the formation of the light-absorbing anisotropic layer of the laminated film 1B of Production Example 1.

Production Example 7

A laminate of Production Example 7 was obtained in the same manner as in Production Example 4, except that the pressure sensitive adhesive sheet as the pressure sensitive adhesive layer 2 of Production Example 4 was changed from N1 to N3.

Production Example 8

A laminate of Production Example 8 was obtained in the same manner as in Production Example 3, except that the thickness was changed from 1 μm to 2 μm in the formation of the oxygen shielding layer of the laminated film 1B of Production Example 3.

Production Example 9

<Formation of Photo-Alignment Layer PA2>

A coating liquid PA2 for forming a photo-alignment layer, which will be described later, was continuously applied onto the cellulose acylate film 1 with a wire bar. The support on which the coating film was formed was dried with hot air at 140° C. for 120 seconds, and subsequently, the coating film was irradiated with polarized ultraviolet rays (10 mJ/cm², using an ultra-high-pressure mercury lamp) to form a photo-alignment layer PA2 having a thickness of 0.2 μm, whereby a TAC film with a photo-alignment layer was obtained.

| (Coating liquid PA2 for forming photo-alignment layer) | |
|---|---|
| The following polymer PA-2 | 100.00 parts by mass |
| The following acid generator PAG-1 | 1.00 part by mass |
| Isopropyl alcohol | 16.50 parts by mass |
| Butyl acetate | 1,072.00 parts by mass |
| Methyl ethyl ketone | 268.00 parts by mass |

Polymer PA-2

| (Coating liquid PA2 for forming photo-alignment layer) |
|---|
| 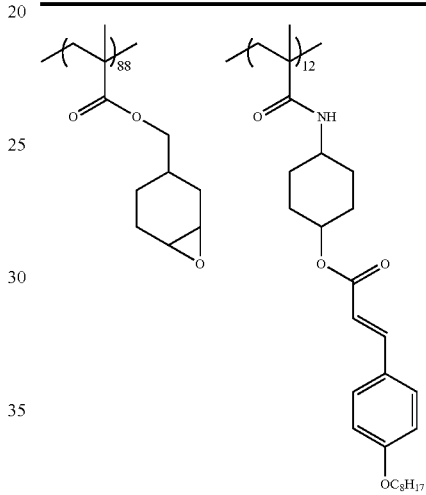 |
| Acid generator PAG-1 |
| 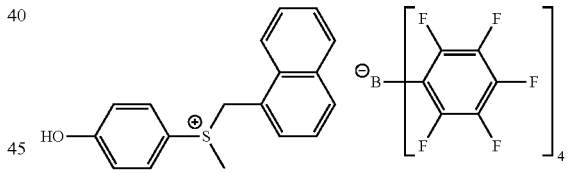 |

<Production of Optically Anisotropic Layer (Positive A-Plate A1)>

A composition A-1 having the following composition was applied onto the photo-alignment layer PA2 using a bar coater. A coating film formed on the photo-alignment layer PA2 was heated to 120° C. with hot air and then cooled to 60° C., and the alignment of the liquid crystalline compound was fixed by irradiating the coating film with ultraviolet rays at 100 mJ/cm² at a wavelength of 365 nm using a high-pressure mercury lamp in a nitrogen atmosphere, and subsequently irradiating the coating film with ultraviolet rays at 500 mJ/cm² while heating to 120° C., thereby producing a TAC film A1 having a positive A-plate A1.

In the positive A-plate A1, the thickness was 2.5 μm and Re(550) was 144 nm. Moreover, the positive A-plate A1 satisfied a relationship of Re(450) S Re(550) S Re(650). Re(450)/Re(550) was 0.82.

| (Composition A1) | |
|---|---:|
| The following polymerizable liquid crystalline compound L-1 | 43.50 parts by mass |
| The following polymerizable liquid crystalline compound L-2 | 43.50 parts by mass |
| The following polymerizable liquid crystalline compound L-3 | 8.00 parts by mass |
| The following polymerizable liquid crystalline compound L-4 | 5.00 parts by mass |
| The following polymerizable liquid initiator PI-1 | 0.55 parts by mass |
| The following leveling agent T-1 | 0.20 parts by mass |
| Cyclopentanone | 235.00 parts by mass |

Polymerizable liquid crystalline compound L-1

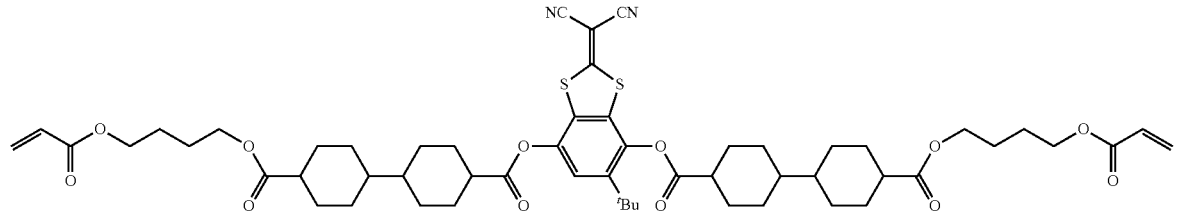 [SMILES: C=CC(=O)OCCCCOC(=O)C1CCC(C2CCC(C(=O)Oc3cc(C(C)(C)C)c(OC(=O)C4CCC(C5CCC(C(=O)OCCCCOC(=O)C=C)CC5)CC4)c4c3SC(=C(C#N)C#N)S4)CC2)CC1]

Polymerizable liquid crystalline compound L-2

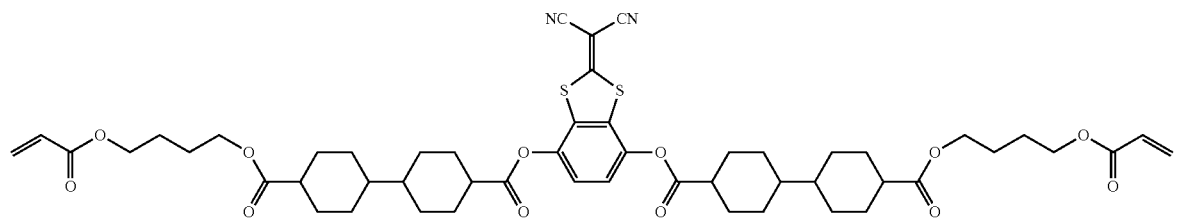 [SMILES: C=CC(=O)OCCCCOC(=O)C1CCC(C2CCC(C(=O)Oc3ccc(OC(=O)C4CCC(C5CCC(C(=O)OCCCCOC(=O)C=C)CC5)CC4)c4c3SC(=C(C#N)C#N)S4)CC2)CC1]

Polymerizable liquid crystalline compound L-3

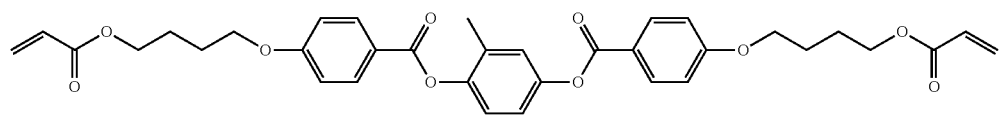 [SMILES: C=CC(=O)OCCCCOc1ccc(C(=O)Oc2ccc(OC(=O)c3ccc(OCCCCOC(=O)C=C)cc3)c(C)c2)cc1]

Polymerizable liquid crystalline compound L-4

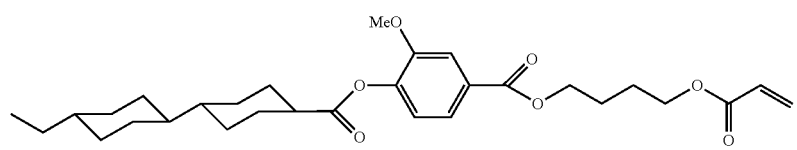 [SMILES: C=CC(=O)OCCCCOC(=O)c1ccc(OC(=O)C2CCC(C3CCC(CC)CC3)CC2)c(OC)c1]

Polymerizable initiator PI-1

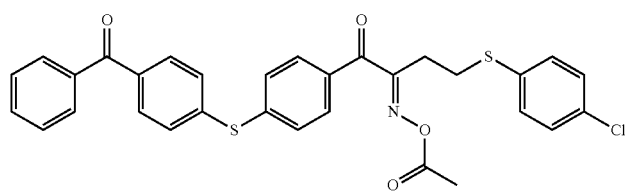 [SMILES: CC(=O)O/N=C(\CCSc1ccc(Cl)cc1)C(=O)c1ccc(Sc2ccc(C(=O)c3ccccc3)cc2)cc1]

Leveling agent T-1

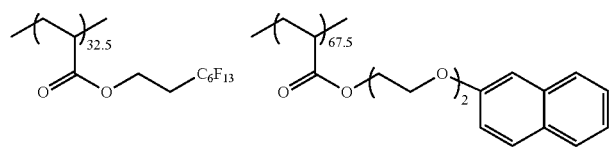

<Production of Optically Anisotropic Layer (Positive C-Plate C1)>

The cellulose acylate film 1 was used as a temporary support.

The cellulose acylate film 1 was allowed to pass through a dielectric heating roll at a temperature of 60° C., the film surface temperature was raised to 40° C., then an alkali solution having the following composition was applied onto one surface of the film at an application amount of 14 m/m² using a bar coater, and the film was heated to 110° C. and transported for 10 seconds under a steam-type far infrared heater manufactured by NORITAKE CO., LIMITED.

Next, pure water was applied onto the film at 3 m/m² with the same bar coater.

Subsequently, water-washing using a fountain coater and drainage using an air knife were repeated three times, and then the film was transported to a drying zone at 70° C. for 10 seconds for drying to produce a cellulose acylate film 1 which had been subjected to an alkali saponification treatment.

| (Alkali solution) | |
| --- | --- |
| Potassium hydroxide | 4.7 parts by mass |
| Water | 15.8 parts by mass |
| Isopropanol | 63.7 parts by mass |
| Surfactant SF-1 ($C_{14}H_{29}O(CH_2CH_2O)_{20}H$) | 1.0 part by mass |
| Propylene glycol | 14.8 parts by mass |

A coating liquid 3 for forming an alignment layer having the following composition was continuously applied onto the cellulose acylate film 1, which had been subjected to an alkali saponification treatment, with a wire bar of #8. The obtained film was dried with hot air at 60° C. for 60 seconds, and further dried with hot air at 100° C. for 120 seconds to form an alignment layer having a thickness of 0.5 sm.

| (Coating liquid 3 for forming alignment layer) | |
| --- | --- |
| Polyvinyl alcohol (produced by KURARAY CO., LTD., PVA 103) | 2.4 parts by mass |
| Isopropyl alcohol | 1.6 parts by mass |
| Methanol | 36 parts by mass |
| Water | 60 parts by mass |

A coating liquid C1 for forming a positive C-plate, which will be described later, was applied onto the alignment layer, the obtained coating film was aged at 60° C. for 60 seconds, and then irradiated with ultraviolet rays at 1,000 mJ/cm² in air using an air-cooled metal halide lamp (manufactured by EYE GRAPHICS Co., Ltd.) at 70 mW/cm², and the alignment state was fixed to vertically align a liquid crystalline compound, thereby producing a positive C-plate 1 having a thickness of 0.5 μm.

The Rth (550) of the obtained positive C-plate was −60 nm.

| (Coating liquid C1 for forming positive C-plate) | |
| --- | --- |
| The following liquid crystalline compound L-11 | 80 parts by mass |
| The following liquid crystalline compound L-12 | 20 parts by mass |
| The following vertical alignment agent (S01) for liquid crystalline compound | 1 part by mass |
| Ethylene oxide-modified trimethylol propane triacrylate (V#360, produced by OSAKA ORGANIC CHEMICAL INDUSTRY LTD.) | 8 parts by mass |
| IRGACURE 907 (produced by BASF SE) | 3 parts by mass |
| KAYACURE DETX (produced by Nippon Kayaku Co., Ltd.) | 1 part by mass |
| The following compound B03 | 0.4 parts by mass |
| Methyl ethyl ketone | 170 parts by mass |
| Cyclohexanone | 30 parts by mass |

L-11

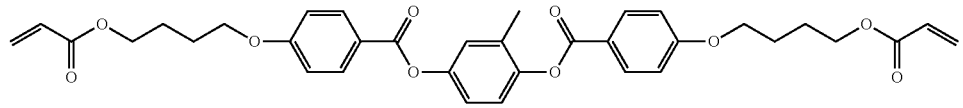

L-12

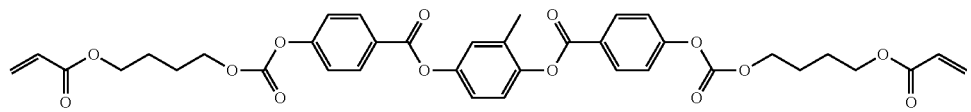 [SMILES: C=CC(=O)OCCCCOC(=O)Oc1ccc(C(=O)Oc2ccc(OC(=O)c3ccc(OC(=O)OCCCCOC(=O)C=C)cc3)c(C)c2)cc1]

S01

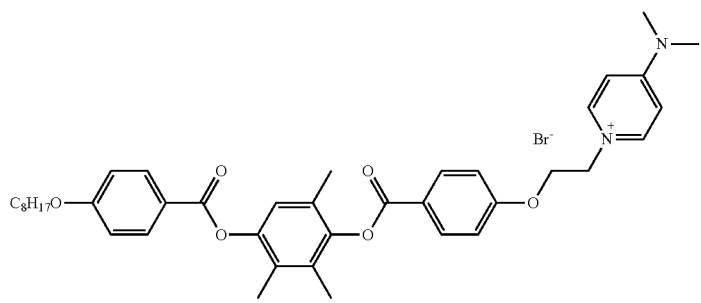

(Coating liquid C1 for forming positive C-plate)

B03

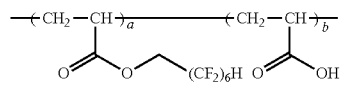

<Production of UV Adhesive>

The following UV adhesive composition was prepared.

| UV adhesive composition | |
|---|---|
| CEL2021P (produced by DAICEL CORPORATION) | 70 parts by mass |
| 1,4-Butanediol diglycidyl ether | 20 parts by mass |
| 2-Ethylhexyl glycidyl ether | 10 parts by mass |
| The following CPI-100P | 2.25 parts by mass |

CPI-100P

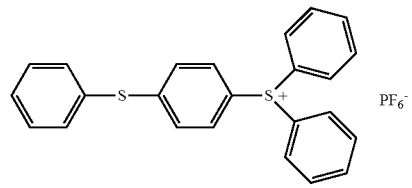

<Production of Laminate of Production Example 9>

The oxygen shielding layer side of the laminated film 1B was adhered to the support side of the surface protective layer H1, using the pressure sensitive adhesive sheet N2 as the pressure sensitive adhesive layer 1. Next, only the cellulose acylate film 1 was removed, and the surface obtained by the removal was adhered to the phase difference side of the positive A-plate A1 through UV irradiation at 600 mJ/cm$^2$ using the UV adhesive. Hereinafter, the UV adhesive was used under the same conditions.

At this time, the adhesion was performed so that the angle formed by the absorption axis of the light-absorbing anisotropic layer and the slow axis of the positive A-plate A1 was 45°. The thickness of the UV adhesive layer was 3 μm. Moreover, the surfaces to be adhered with the UV adhesive were each subjected to a corona treatment (The same applies to the following).

Next, the alignment layer on the positive A-plate side and the cellulose acylate film 1 were removed, and the surface obtained by the removal was adhered to the phase difference side of the positive C-plate C1 by forming a UV adhesive layer B using the UV adhesive. The thickness of the UV adhesive layer B was 3 μm. The laminate of the positive A-plate A1, the UV adhesive layer B, and the positive C-plate C1 was an optically anisotropic layer, and had a thickness of 6.0 μm.

Furthermore, the alignment layer on the positive C-plate C1 side and the cellulose acylate film 1 were removed, and the pressure sensitive adhesive sheet N4 as the pressure sensitive adhesive layer 2 was adhered to the surface obtained by the removal to obtain a laminate of Production Example 9.

Production Example 10

<Production of Laminated Film 2B>

A laminated film 2B was obtained in the same manner as the laminated film 1B, except that in the laminated film 1B, the coating liquid PA1 for forming a photo-alignment layer was changed to the coating liquid PA2 for forming a photo-alignment layer to form a photo-alignment layer having a thickness of 0.2 μm.

<Production of Laminate of Production Example 10>

The oxygen shielding layer side of the laminated film 2B was adhered to the support side of the surface protective layer H1, using the pressure sensitive adhesive sheet N2 as the pressure sensitive adhesive layer 1. Next, the cellulose acylate film 1 and the photo-alignment layer were removed, and the surface obtained by the removal was adhered to the phase difference side of the positive A-plate A1 using the UV adhesive.

At this time, the adhesion was performed so that the angle formed by the absorption axis of the light-absorbing anisotropic layer and the slow axis of the positive A-plate A1 was 45°. The thickness of the UV adhesive layer was 3 μm.

Next, the alignment layer on the positive A-plate A1 side and the cellulose acylate film 1 were removed, and the surface obtained by the removal was adhered to the phase difference side of the positive C-plate C1 by forming a UV adhesive layer B using the UV adhesive. The thickness of the UV adhesive layer B was 3 μm. The laminate of the positive A-plate A1, the UV adhesive layer B, and the positive C-plate C1 was an optically anisotropic layer, and had a thickness of 6.0 μm.

Furthermore, the alignment layer on the positive C-plate side and the cellulose acylate film 1 were removed, and the pressure sensitive adhesive sheet N4 as the pressure sensitive adhesive layer 2 was adhered to the surface obtained by the removal to obtain a laminate of Production Example 10.

Production Example 11

A laminate of Production Example 11 was obtained in the same manner as in Production Example 10, except that in Production Example 10, the pressure sensitive adhesive sheet as the pressure sensitive adhesive layer 2 of Production Example 10 was changed from N4 to N2.

Production Example 12

<Production of Optically Anisotropic Layer (Positive C-Plate C2)>

A positive C-plate C2 was obtained in the same manner as the positive C-plate C1, except that in the positive C-plate C1, the coating liquid 3 for forming an alignment layer was changed to the following coating liquid 4 for forming an alignment layer.

(Preparation of Coating Liquid 4 for Forming Alignment Layer)

| Composition of coating liquid 4 for forming alignment layer | |
|---|---|
| The following modified polyvinyl alcohol | 3.80 parts by mass |
| Initiator Irg2959 | 0.20 parts by mass |

-continued

| Composition of coating liquid 4 for forming alignment layer | |
|---|---|
| Water | 70 parts by mass |
| Methanol | 30 parts by mass |

Modified polyvinyl alcohol

—(CH$_2$—CH)$_{96.8}$(CH$_2$—CH)$_{1.5}$(CH$_2$—CH)$_{1.7}$
           |                    |                    |                         CH$_3$
           OH                  OCOCH$_3$      OCONHCH$_2$CH$_2$OCOC=CH$_2$

<Production of Laminate of Production Example 12>

The oxygen shielding layer side of the laminated film 2B was adhered to the support side of the surface protective layer H1, using the pressure sensitive adhesive sheet N2 as the pressure sensitive adhesive layer 1. Next, the cellulose acylate film 1 and the photo-alignment layer were removed, and the surface obtained by the removal was adhered to the phase difference side of the positive A-plate A1 using the UV adhesive.

At this time, the adhesion was performed so that the angle formed by the absorption axis of the light-absorbing anisotropic layer and the slow axis of the positive A-plate A1 was 45°. The thickness of the UV adhesive layer was 3 µm.

Next, the alignment layer on the positive A-plate side and the cellulose acylate film 1 were removed, and the surface obtained by the removal was adhered to the phase difference side of the positive C-plate C2 by forming a UV adhesive layer B using the UV adhesive. The thickness of the UV adhesive layer B was 3 µm. The laminate of the positive A-plate A1, the UV adhesive layer B, and the positive C-plate C2 was an optically anisotropic layer, and had a thickness of 6.0 µm. Furthermore, the pressure sensitive adhesive sheet N4 as the pressure sensitive adhesive layer 2 was adhered to the surface of the cellulose acylate film 1 on the positive C-plate side to obtain a laminate of Production Example 12.

Production Example 13

<Production of Laminated Film 3B>

A laminated film 3B was obtained in the same manner as the laminated film 1B, except that in the laminated film 1B, the coating liquid PA1 for forming a photo-alignment layer was changed to the following coating liquid PA3 for forming a photo-alignment layer to form a photo-alignment layer having a thickness of 0.3 µm.

(Preparation of Coating Liquid PA3 for Forming Photo-Alignment Layer)

| (Coating liquid PA3 for forming photo-alignment layer) | |
|---|---|
| The above polymer PA-1 | 100.00 parts by mass |
| The above acid generator PAG-1 | 5.00 parts by mass |
| The above acid generator CPI-110TF | 0.005 parts by mass |
| Isopropyl alcohol | 16.50 parts by mass |
| Butyl acetate | 1,072.00 parts by mass |
| Methyl ethyl ketone | 268.00 parts by mass |

<Production of Laminate of Production Example 13>

The oxygen shielding layer side of the laminated film 3B was adhered to the support side of the surface protective layer H1, using the pressure sensitive adhesive sheet N1 as the pressure sensitive adhesive layer 1. Moreover, the pressure sensitive adhesive sheet N1 as the pressure sensitive adhesive layer 2 was adhered to the surface of the cellulose acylate film 1 to obtain a laminate of Production Example 13.

Production Example 14

<Formation of Oxygen Shielding Layer>

A surface of a TAC substrate (TG40, manufactured by FUJIFILM Corporation) having a thickness of 40 µm was subjected to a saponification treatment, and then coated with the composition B1 for forming an oxygen shielding layer prepared above with a wire bar. Thereafter, the composition liquid was dried with hot air at 100° C. for 2 minutes to obtain a transparent support 1 in which an oxygen shielding layer having a thickness of 1.0 µm was formed on the TAC substrate.

<Formation of Photo-Alignment Layer>

The coating liquid PA3 for forming a photo-alignment layer was continuously applied onto the oxygen shielding layer of the transparent support 1 with a wire bar. The support on which the coating film was formed was dried with hot air at 140° C. for 120 seconds, and subsequently, the coating film was irradiated with polarized ultraviolet rays (10 mJ/cm$^2$, using an ultra-high-pressure mercury lamp) to form a photo-alignment layer PA3, whereby a TAC film 1 with a photo-alignment layer was obtained. The film thickness thereof was 0.2 sm.

<Formation of Cured Layer>

The composition N1 for forming a cured layer was continuously applied onto the obtained photo-alignment layer PA3 with a wire bar to form a cured layer N1.

Subsequently, the cured layer N1 was dried at room temperature and then irradiated with light for 15 seconds under an irradiation condition of an illuminance of 28 mW/cm$^2$, using a high-pressure mercury lamp, to produce the cured layer N1 on the photo-alignment layer PA3.

The film thickness of the cured layer N1 was 0.05 µm (50 nm).

<Formation of Light-Absorbing Anisotropic Layer>

The following composition P1 for forming a light-absorbing anisotropic layer was continuously applied onto the obtained cured layer N1 with a wire bar to form a coating layer P1.

Next, the coating layer P1 was heated at 140° C. for 30 seconds, and the coating layer P1 was cooled to room temperature (23° C.).

Subsequently, the coating layer was heated at 90° C. for 60 seconds and cooled again to room temperature.

Thereafter, the coating layer was irradiated with light for 2 seconds under an irradiation condition of an illuminance of 200 mW/cm$^2$, using a LED lamp (center wavelength of 365 nm), to produce a light-absorbing anisotropic layer P1 on the cured layer N1. The film thickness thereof was 0.4 µm.

<Formation of Barrier Layer>

The following composition H1 for forming a barrier layer was continuously applied onto the obtained light-absorbing anisotropic layer P1 with a wire bar to form a barrier layer H1.

Subsequently, the barrier layer H1 was dried at room temperature and then irradiated with light for 10 seconds under an irradiation condition of an illuminance of 28 mW/cm$^2$, using a high-pressure mercury lamp, to produce the barrier layer H1 on the light-absorbing anisotropic layer P1, whereby a laminated film 1A was obtained. The film thickness of the barrier layer H1 was 1.0 µm.

| Composition of composition H1 for forming barrier layer | |
|---|---|
| CEL202 IP (produced by DAICEL CORPORATION) | 32 parts by mass |
| Polymerization initiator IRGACURE 819 (produced by BASF SE) | 1 part by mass |
| CPI-100P (50% propylene carbonate solution) | 2 parts by mass |
| Methyl ethyl ketone (MEK) | 65 parts by mass |

<Production of Laminate of Production Example 14>

A TG40 side of the laminated film 1A was adhered to the support side of the surface protective layer H1, using the pressure sensitive adhesive sheet N2 as the pressure sensitive adhesive layer 1. Moreover, the pressure sensitive adhesive sheet N1 as the pressure sensitive adhesive layer 2 was adhered to the surface of the barrier layer H1 to obtain a laminate of Production Example 14.

Production Example 15

<Formation of Oxygen Shielding Layer>

The composition B1 for forming an oxygen shielding layer prepared above was applied onto a surface of a TAC substrate (TG40, manufactured by FUJIFILM Corporation) having a thickness of 40 μm with a wire bar. Thereafter, the composition liquid was dried with hot air at 100° C. for 2 minutes to obtain a transparent support 2 in which an oxygen shielding layer having a thickness of 1.0 μm was formed on the TAC substrate.

<Formation of Photo-Alignment Layer>

The coating liquid PA3 for forming a photo-alignment layer was continuously applied onto the oxygen shielding layer of the transparent support 2 with a wire bar. The support on which the coating film was formed was dried with hot air at 140° C. for 120 seconds, and subsequently, the coating film was irradiated with polarized ultraviolet rays (10 mJ/cm$^2$, using an ultra-high-pressure mercury lamp) to form a photo-alignment layer PA3. The film thickness thereof was 0.2 μm.

<Formation of Cured Layer>

The composition N1 for forming a cured layer was continuously applied onto the obtained photo-alignment layer PA3 with a wire bar to form a cured layer N1.

Subsequently, the cured layer N1 was dried at room temperature and then irradiated with light for 15 seconds under an irradiation condition of an illuminance of 28 mW/cm$^2$, using a high-pressure mercury lamp, to produce the cured layer N1 on the photo-alignment layer PA3.

The film thickness of the cured layer N1 was 0.05 μm (50 nm).

<Formation of Light-Absorbing Anisotropic Layer>

The following composition P1 for forming a light-absorbing anisotropic layer was continuously applied onto the obtained cured layer N1 with a wire bar to form a coating layer P1.

Next, the coating layer P1 was heated at 140° C. for 30 seconds, and the coating layer P1 was cooled to room temperature (23° C.).

Subsequently, the coating layer was heated at 90° C. for 60 seconds and cooled again to room temperature.

Thereafter, the coating layer was irradiated with light for 2 seconds under an irradiation condition of an illuminance of 200 mW/cm$^2$, using a LED lamp (center wavelength of 365 nm), to produce a light-absorbing anisotropic layer P1 having a film thickness of 0.4 μm on the cured layer N1, whereby a laminated film 2A was obtained.

<Production of Laminate of Production Example 15>

A surface of the light-absorbing anisotropic layer side of the laminated film 2A was adhered to the phase difference side of the positive A-plate A1 using the UV adhesive.

At this time, the adhesion was performed so that the angle formed by the absorption axis of the light-absorbing anisotropic layer and the slow axis of the positive A-plate A1 was 45°. The thickness of the UV adhesive layer was 3 μm. Moreover, the surfaces to be adhered with the UV adhesive were each subjected to a corona treatment (The same applies to the following).

Next, the alignment layer on the positive A-plate side and the cellulose acylate film 1 were removed, and the surface obtained by the removal was adhered to the phase difference side of the positive C-plate C1 by forming a UV adhesive layer B using the UV adhesive. The thickness of the UV adhesive layer B was 3 μm. The laminate of the positive A-plate A1, the UV adhesive layer B, and the positive C-plate C2 was an optically anisotropic layer, and had a thickness of 6.0 μm.

Furthermore, the TG40 was removed from the obtained laminate, and a surface on the support side of the surface protective layer H1 was adhered to the surface obtained by the removal, using the pressure sensitive adhesive sheet N2 as the pressure sensitive adhesive layer 1.

Finally, the alignment layer on the positive C-plate side and the cellulose acylate film 1 were removed, and the pressure sensitive adhesive sheet N4 as the pressure sensitive adhesive layer 2 was adhered to the surface obtained by the removal to obtain a laminate of Production Example 15.

Production Example 16

<Formation of Oxygen Shielding Layer>

The composition B1 for forming an oxygen shielding layer prepared above was applied onto a surface of a TAC substrate (TG40, manufactured by FUJIFILM Corporation) having a thickness of 40 μm with a wire bar. Thereafter, the composition liquid was dried with hot air at 100° C. for 2 minutes to obtain a transparent support 2 in which an oxygen shielding layer having a thickness of 1.0 μm was formed on the TAC substrate.

<TAC Film 2 with Alignment Layer>

A surface of the oxygen shielding layer of the transparent support 2 produced above was subjected to a rubbing treatment to obtain a TAC film 2 with an alignment layer.

<Formation of Cured Layer>

The composition N1 for forming a cured layer was continuously applied onto the alignment layer of the obtained TAC film 2 with an alignment layer with a wire bar to form a cured layer N1.

Subsequently, the cured layer N1 was dried at room temperature and then irradiated with light for 15 seconds under an irradiation condition of an illuminance of 28 mW/cm$^2$, using a high-pressure mercury lamp, to produce the cured layer N1 on the photo-alignment layer PA3.

The film thickness of the cured layer N1 was 0.05 μm (50 nm).

<Formation of Light-Absorbing Anisotropic Layer>

The following composition P1 for forming a light-absorbing anisotropic layer was continuously applied onto the obtained cured layer N1 with a wire bar to form a coating layer P1.

Next, the coating layer P1 was heated at 140° C. for 30 seconds, and the coating layer P1 was cooled to room temperature (23° C.).

Subsequently, the coating layer was heated at 90° C. for 60 seconds and cooled again to room temperature.

Thereafter, the coating layer was irradiated with light for 2 seconds under an irradiation condition of an illuminance of 200 mW/cm², using a LED lamp (center wavelength of 365 nm), to produce a light-absorbing anisotropic layer P1 having a film thickness of 0.4 μM on the cured layer N1, whereby a laminated film 3A was obtained.

<Production of Laminate of Production Example 16>

The laminate of Production Example 16 was obtained in the same manner as in Production Example 15, except that the laminated film 2A of the laminate of Production Example 15 was changed to the laminated film 3A.

[Evaluation]
[Moisture-Heat Resistance]

The obtained laminate was cut into a size of 50 mm×50 mm, a peelable film was peeled, and the pressure sensitive adhesive layer 2 was press-bonded onto a glass substrate (Corning Incorporated, Eagle XG). This sample press-bonded onto the glass substrate was subjected to a durability test at 60° C. and 90%, and the sample was visually observed, and evaluated according to the following standard. The results are shown in Table 4 below.

Furthermore, the cutting was performed by punching, but peeling between layers was not observed at the end part, and the shape was linearly smooth.

AA: No wrinkles were generated even in 400 hours or longer
A: Wrinkles were generated in 100 hours or longer and shorter than 400 hours
B: Wrinkles were generated in 50 hours or longer and shorter than 100 hours
C: Wrinkles were generated in shorter than 50 hours

TABLE 4

| | Pressure sensitive adhesive layer 2 | | Intermediate laminate | | | | | | | |
|---|---|---|---|---|---|---|---|---|---|---|
| | Kind | Thickness (μm) | Storage elastic modulus (MPa) | Support Thickness (μm) | Alignment layer Thickness (μm) | Optically anisotropic layer Thickness (μm) | UV adhesive layer Thickness (μm) | Support Thickness (μm) | Barrier layer Thickness (μm) | Photo-alignment layer Thickness (μm) | Light-absorbing anisotropic layer Composition liquid |
| Production Example 1 | N1 | 15 | 0.7 | — | — | — | — | — | — | 1 | P1 |
| Production Example 2 | N2 | 5 | 0.7 | — | — | — | — | — | — | 1 | P1 |
| Production Example 3 | N1 | 15 | 0.7 | — | — | — | — | — | — | 1 | P1 |
| Production Example 4 | N1 | 15 | 0.7 | — | — | — | — | — | — | 2 | P1 |
| Production Example 5 | N1 | 15 | 0.7 | — | — | — | — | — | — | 2 | P2 |
| Production Example 6 | N1 | 15 | 0.7 | — | — | — | — | — | — | 1 | P2 |
| Production Example 7 | N3 | 15 | 0.1 | — | — | — | — | — | — | 2 | P1 |
| Production Example 8 | N1 | 15 | 0.7 | — | — | — | — | — | — | 1 | P1 |
| Production Example 9 | N4 | 25 | 0.1 | — | — | 6 | 3 | — | — | 1 | P1 |
| Production Example 10 | N4 | 15 | 0.1 | — | — | 6 | 3 | — | — | — | P1 |
| Production Example 11 | N2 | 5 | 0.7 | — | — | 6 | 3 | — | — | — | P1 |
| Production Example 12 | N4 | 25 | 0.1 | 40 | 0.5 | 6 | 3 | — | — | — | P1 |
| Production Example 13 | N1 | 15 | 0.7 | — | — | — | — | 40 | — | 0.3 | P1 |
| Production Example 14 | N1 | 15 | 0.7 | — | — | — | — | — | 1 | — | P1 |
| Production Example 15 | N4 | 25 | 0.1 | — | — | 6 | 3 | — | — | — | P1 |
| Production Example 16 | N4 | 25 | 0.1 | — | — | 6 | 3 | — | — | — | P1 |

| | Intermediate laminate | | | | | Pressure sensitive adhesive layer 1 | | | | |
|---|---|---|---|---|---|---|---|---|---|---|
| | Light-absorbing anisotropic layer Thickness (μm) | Cured layer Thickness (μm) | Photo-alignment layer Thickness (μm) | Oxygen shielding layer Thickness (μm) | Support Thickness (μm) | Kind | Thickness (μm) | H value | Moisture-heat resistance | Note |
| Production Example 1 | 0.4 | 0.05 | — | 1 | — | N1 | 15 | 12.2 | C | Comparative Example |
| Production Example 2 | 0.4 | 0.05 | — | 1 | — | N2 | 5 | 4.1 | A | Example |
| Production Example 3 | 0.4 | 0.05 | — | 1 | — | N2 | 5 | 8.2 | B | Example |

TABLE 4-continued

| | | | | | | | | | | |
|---|---|---|---|---|---|---|---|---|---|---|
| Production Example 4 | 0.4 | 0.05 | — | 1 | — | N2 | 5 | 5.8 | A | Example |
| Production Example 5 | 0.8 | 0.05 | — | 1 | — | N2 | 5 | 5.2 | A | Example |
| Production Example 6 | 0.8 | 0.05 | — | 1 | — | N1 | 15 | 10.5 | C | Comparative Example |
| Production Example 7 | 0.4 | 0.05 | — | 1 | — | N2 | 5 | 5.8 | B | Example |
| Production Example 8 | 0.4 | 0.05 | — | 2 | — | N2 | 5 | 5.8 | A | Example |
| Production Example 9 | 0.4 | 0.05 | — | 1 | — | N2 | 5 | 2.6 | AA | Example |
| Production Example 10 | 0.4 | 0.05 | — | 1 | — | N2 | 5 | 2.9 | AA | Example |
| Production Example 11 | 0.4 | 0.05 | — | 1 | — | N2 | 5 | 1.0 | AA | Example |
| Production Example 12 | 0.4 | 0.05 | — | 1 | — | N2 | 5 | 0.6 | AA | Example |
| Production Example 13 | 0.4 | 0.05 | — | 1 | — | N2 | 5 | 0.5 | AA | Example |
| Production Example 14 | 0.4 | 0.05 | 0.2 | 1 | 40 | N2 | 5 | 0.5 | AA | Example |
| Production Example 15 | 0.4 | 0.05 | 0.2 | 1 | — | N2 | 5 | 2.8 | AA | Example |
| Production Example 16 | 0.4 | 0.05 | — | 1 | — | N2 | 5 | 2.9 | AA | Example |

From the results shown in Table 4, it was found that in a case where the H value was greater than 10, the moisture-heat resistance of the laminate was inferior (Production Examples 1 and 6).

On the other hand, it was found that in a case where the H value was 10 or less, the moisture-heat resistance of the laminate was favorable (Production Examples 2 to 5 and 7 to 16). In particular, from the comparison among these Production Examples, it was found that in a case where the H value was 4.0 or less, the moisture-heat resistance was improved.

Production Examples 17 to 26

<Production of Laminate of Production Example 17>

In the laminate of Production Example 1, the pressure sensitive adhesive layer 2 was adhered to the phase difference side of the positive A-plate A1.

At this time, the adhesion was performed so that the angle formed by the absorption axis of the light-absorbing anisotropic layer and the slow axis of the positive A-plate A1 was 45°.

Next, the alignment layer on the positive A-plate side and the cellulose acylate film 1 were removed, and the surface obtained by the removal was bonded to the phase difference side of the positive C-plate C1 using the UV adhesive. The thickness of the UV adhesive layer was 3 μm.

Furthermore, the alignment layer on the positive C-plate side and the cellulose acylate film 1 were removed, and the pressure sensitive adhesive sheet N1 was adhered to the surface obtained by the removal to obtain a laminate of Production Example 17.

<Production of Laminates of Production Examples 18 to 26>

Laminates of Production Examples 18 to 26 were produced by performing the same operations as in Production Example 17 for the laminates of Production Examples 2 to 8, 13, and 14.

Production Examples 27 and 28

A laminate of Production Example 27 was obtained by adhering the pressure sensitive adhesive sheet N1 instead of the pressure sensitive adhesive sheet N2 as the pressure sensitive adhesive layer 1 in the laminate of Production Example 4. This laminate of Production Example 27 satisfied H=8.7, which was within the scope of the present invention, and was evaluated as B as a result of the above-mentioned durability evaluation.

In the laminate of Production Example 27, the pressure sensitive adhesive layer 2 was adhered to the cellulose acylate film 1 to obtain a laminate 27B.

Meanwhile, the phase difference side of the positive A-plate A1 was bonded to the phase difference side of the positive C-plate C1 using the UV adhesive. The thickness of the UV adhesive layer was 3 μm.

Next, the alignment layer on the positive A-plate A1 side and the cellulose acylate film 1 were removed, and a surface on the cellulose acylate film 1 side of the laminate 27B was adhered to the surface obtained by the removal, using the pressure sensitive adhesive sheet N1.

At this time, the adhesion was performed so that the angle formed by the absorption axis of the light-absorbing anisotropic layer and the slow axis of the positive A-plate A1 was 450.

Subsequently, the alignment layer on the positive C-plate C1 side and the cellulose acylate film 1 were removed, and the pressure sensitive adhesive sheet N1 was adhered to the surface obtained by the removal to obtain a laminate of Production Example 28.

<Production of Organic EL Display Device>

GALAXY S4 manufactured by SAMSUNG, having an organic EL panel (organic EL display element) installed therein, was disassembled, the touch panel with a circularly polarizing plate was peeled from the organic EL display device, the circularly polarizing plate was further peeled from the touch panel, and the organic EL display element, the touch panel, and the circularly polarizing plate were each isolated. Subsequently, the isolated touch panel was adhered again to the organic EL display element, and each of the laminates of Production Examples 9 to 12, 15 to 26, and 28 was adhered onto the touch panel so that the pressure sensitive adhesive layer side was the panel side, to produce an organic EL display device, and it was confirmed that an antireflection effect was exhibited.

Production Examples 29 to 32

<Production of Pressure Sensitive Adhesive Sheets N5 to N7>

Next, an acrylate-based polymer was prepared according to the following procedure.

A reaction vessel comprising a cooling pipe, a nitrogen introduction pipe, a thermometer, and a stirrer was charged with a mixed solution of ethyl acetate (81.8 parts by mass) as a solvent, 2-ethylhexyl acrylate (69.0 parts by mass), 2-methoxyethyl acrylate (29.0 parts by mass), 2-hydroxybutyl acrylate (1.0 part by mass), and acrylic acid (1.0 part by mass), and the mixture was polymerized by the solution polymerization method to prepare an ethyl acetate solution of an acrylate-based polymer A2.

The obtained acrylate-based polymer A2 had a weight-average molecular weight Mw of 2,000,000 and an Mw/Mn of 5.8, in terms of polystyrene by GPC.

Subsequently, using the obtained acrylate-based polymer A1 or acrylate-based polymer A2, a composition of an acrylate-based pressure sensitive adhesive was prepared so as to have each composition shown in Table 5 below.

The prepared composition was applied to a separate film (hereinafter, also simply referred to as a "peelable film") surface-treated with a silicone-based release agent with a die coater, and dried for 1 minute in an environment of 90° C. to obtain each of acrylate-based pressure sensitive adhesive sheets N5 to N7.

The compositions of the acrylate-based pressure sensitive adhesives, and the film thicknesses and storage elastic moduli of the pressure sensitive adhesive sheets are shown in Table 5 below.

<Production of Laminate of Production Example 30>

A laminate of Production Example 30 was obtained by adhering the pressure sensitive adhesive sheet N6 instead of the pressure sensitive adhesive sheet N2 as the pressure sensitive adhesive layer 2 in the laminate of Production Example 2.

<Production of Laminate of Production Example 31>

A laminate of Production Example 31 was obtained by adhering the pressure sensitive adhesive sheet N7 instead of the pressure sensitive adhesive sheet N1 as the pressure sensitive adhesive layer 2 in the laminate of Production Example 1.

<Production of Laminate of Production Example 32>

A laminate of Production Example 32 was obtained by adhering the pressure sensitive adhesive sheet N7 instead of the pressure sensitive adhesive sheet N4 as the pressure sensitive adhesive layer 2 in the laminate of Production Example 9.

Evaluation

[Moisture-Heat Resistance]

Each of the obtained laminates 29 to 32 was cut into a size of 50 mm×50 mm, a peelable film was peeled, and the pressure sensitive adhesive layer 2 was press-bonded onto a glass substrate (Corning Incorporated, Eagle XG). This sample press-bonded onto the glass substrate was subjected to a durability test at 60° C. and 90%, and the sample was visually observed and evaluated in the same manner as described above. The results are shown in Table 6 below.

TABLE 5

| | Composition of pressure sensitive adhesive | | | | | |
| --- | --- | --- | --- | --- | --- | --- |
| | Acrylate-based polymer A1 | Acrylate-based polymer A2 | (C) Isocyanate-based crosslinking agent | (D) Silane coupling agent | Film thickness (μm) | Storage elastic modulus (MPa) |
| Pressure sensitive adhesive sheet N5 | 100 | — | 1 | 0.2 | 5 | 0.1 |
| Pressure sensitive adhesive sheet N6 | — | 100 | 1 | 0.2 | 5 | 0.1 |
| Pressure sensitive adhesive sheet N7 | — | 100 | 1 | 0.2 | 15 | 0.1 |

(C) Isocyanate-based crosslinking agent: Trimethylol propane-modified tolylene diisocyanate ("CORONATE L" produced by Nippon Polyurethane Industry Co., Ltd.)
(D) Silane coupling agent: 3-Glycidoxypropyl trimethoxysilane ("KBM-403" produced by Shin-Etsu Chemical Co., Ltd.)

TABLE 6

| | Pressure sensitive adhesive layer 2 | | | Intermediate laminate | | | | | | | Pressure sensitive adhesive layer 1 | | | Moisture-heat resistance | Note |
|---|---|---|---|---|---|---|---|---|---|---|---|---|---|---|---|
| | | | | Optically anisotropic layer | UV adhesive layer | Photo-alignment layer | Light-absorbing anisotropic layer | | Cured layer | Oxygen shielding layer | | | | | |
| Kind | Kind | Thickness (μm) | Storage elastic modulus (MPa) | Thickness (μm) | Thickness (μm) | Thickness (μm) | Composition liquid | Thickness (μm) | Thickness (μm) | Thickness (μm) | Kind | Thickness (μm) | H value | | |
| Production Example 29 | N5 | 5 | 0.1 | | | 1 | P1 | 0.4 | 0.05 | 1 | N2 | 5 | 4.1 | A | Example |
| Production Example 30 | N6 | 5 | 0.1 | | | 1 | P1 | 0.4 | 0.05 | 1 | N2 | 5 | 4.1 | B | Example |
| Production Example 31 | N7 | 15 | 0.1 | | | 1 | P1 | 0.4 | 0.05 | 1 | N1 | 15 | 12.2 | C | Com-Example |
| Production Example 32 | N7 | 15 | 0.1 | 6 | 3 | 1 | P1 | 0.4 | 0.05 | 1 | N2 | 5 | 1.7 | AA | Example |

From the results shown in Table 6, it was found that in a case where the H value was greater than 10, the moisture-heat resistance of the laminate was inferior (Production Example 31).

On the other hand, it was found that in a case where the H value was 10 or less, the moisture-heat resistance of the laminate was favorable (Production Examples 29, 30, and 32). In particular, from the comparison between Production Example 29 and Production Example 30, it was found that in a case where the pressure sensitive adhesive constituting the pressure sensitive adhesive layer 2 contained the polymer having the repeating unit represented by Formula (A), the durability was improved.

Production Examples 33 to 36

<Production of Pressure Sensitive Adhesive Sheets N8 to N10>

Using the above-mentioned acrylate-based polymer A1, a composition of an acrylate-based pressure sensitive adhesive was prepared so as to have each composition shown in Table 7 below.

The prepared composition was applied to a separate film (hereinafter, also simply referred to as a "peelable film") surface-treated with a silicone-based release agent with a die coater, dried for 1 minute in an environment of 90° C., and irradiated with ultraviolet rays (UV) under the same conditions as the pressure sensitive adhesive sheet N1, to obtain each of acrylate-based pressure sensitive adhesive sheets N8 to N10.

The compositions of the acrylate-based pressure sensitive adhesives, and the film thicknesses and storage elastic moduli of the pressure sensitive adhesive sheets are shown in Table 7 below.

TABLE 7

| | Composition of pressure sensitive adhesive | | | | | | |
|---|---|---|---|---|---|---|---|
| | Acrylate-based polymer A1 | (A) Polyfunctional acrylate-based monomer | (B) Photopolymerization initiator | (C) Isocyanate-based crosslinking agent | (D) Silane coupling agent | Film thickness (μm) | Storage elastic modulus (MPa) |
| Pressure sensitive adhesive sheet N8 | 100 | 10 | 1 | 1 | 0.2 | 5 | 0.6 |
| Pressure sensitive adhesive sheet N9 | 100 | 10 | 1 | 1 | 0.2 | 8 | 0.6 |
| Pressure sensitive adhesive sheet N10 | 100 | 10 | 1 | 1 | 0.2 | 15 | 0.6 |

<Production or Pressure Sensitive Adhesive Sheet n1>

70 parts of butyl acrylate, 30 parts of methyl acrylate, 4 parts of acrylic acid, 2 parts of N,N-dimethyl methacrylamide, 0.1 parts of azobisisobutyronitrile, and 120 parts of ethyl acetate were added. These components were polymerized by the solution polymerization method to obtain a solution of an acryl copolymer 1 having a weight-average molecular weight of 1,500,000.

A solution obtained by mixing 3 parts of CORONATE L (polyisocyanate, produced by Nippon Polyurethane Industry Co., Ltd.), 0.2 parts of ALUMINUM CHELATE A (aluminum trisacetylacetonate, produced by Kawaken Fine Chemicals Co., Ltd.), and 0.1 parts of KBM-803 (γ-mercaptopropyl methyl dimethoxy silane, produced by Shin-Etsu Chemical Co., Ltd.), with respect to 100 parts of the solid content of the copolymer solution 1, was used as a pressure sensitive adhesive composition N11.

The composition was applied to a separate film (hereinafter, also simply referred to as a "peelable film") surface-treated with a silicone-based release agent with a die coater, and dried for 1 minute in an environment of 90° C. to produce a pressure sensitive adhesive sheet N11 having a pressure sensitive adhesive layer having a thickness of 15 sm. The storage elastic modulus of the pressure sensitive adhesive layer was 0.3 MPa.

<Production of Laminate of Production Example 33>

A laminate of Production Example 33 was obtained by adhering the pressure sensitive adhesive sheet N8 instead of the pressure sensitive adhesive sheet N2 as the pressure sensitive adhesive layer 1 in the laminate of Production Example 2.

<Production of Laminate of Production Example 34>

A laminate of Production Example 34 was obtained by adhering the pressure sensitive adhesive sheet N9 instead of the pressure sensitive adhesive sheet N2 as the pressure sensitive adhesive layer 1 in the laminate of Production Example 2.

<Production of Laminate of Production Example 35>

A laminate of Production Example 35 was obtained by adhering the pressure sensitive adhesive sheet N10 instead of the pressure sensitive adhesive sheet N2 as the pressure sensitive adhesive layer 1 in the laminate of Production Example 2.

<Production of Laminate of Production Example 36>

A laminate of Production Example 36 was obtained by adhering the pressure sensitive adhesive sheet N11 instead of the pressure sensitive adhesive sheet N2 as the pressure sensitive adhesive layer 1 in the laminate of Production Example 2.

Evaluation

[Moisture-Heat Resistance]

Each of the obtained laminates 33 to 36 was cut into a size of 50 mm×50 mm, a peelable film was peeled, and the pressure sensitive adhesive layer 2 was press-bonded onto a glass substrate (Corning Incorporated, Eagle XG). This sample press-bonded onto the glass substrate was subjected to a durability test at 60° C. and 90%, the sample was visually observed and evaluated in the same manner as described above, and as a result, all evaluations were B or higher and the effect of the present invention was exhibited.

[Pencil Hardness]

The pencil hardness evaluation described in JIS K-5400 was performed as an index of the scratch resistance. Each of the obtained laminates 33 to 36 was cut into a size of 50 mm×50 mm, a peelable film was peeled, and the pressure sensitive adhesive layer 2 was press-bonded onto a glass substrate (Corning Incorporated, Eagle XG).

The humidity of the resultant was adjusted at a temperature of 25° C. and a humidity of 60% RH for 2 hours, then the surface on which the hard coat layer was laminated was rubbed with a load of 4.9 N using an HB test pencil, and evaluation was performed according to the following standard. The results are shown in Table 8 below.

A: There were no scratches in all the evaluations of n=5
B: There were no scratches in 3 to 4 evaluations among the evaluations of n=5

TABLE 8

| | Pressure sensitive adhesive layer 2 | | | Intermediate laminate | | | | | Pressure sensitive adhesive layer 1 | | | |
|---|---|---|---|---|---|---|---|---|---|---|---|---|
| | | | Storage elastic | Optically anisotropic layer | Light-absorbing anisotropic layer | | Cured layer | Oxygen shielding layer | | | Storage elastic modulus | Thickness | Pencil |
| | Kind | Thickness (μm) | modulus (MPa) | Thickness (μm) | Composition liquid | Thickness (μm) | Thickness (μm) | Thickness (μm) | Kind | modulus (MPa) | Thickness (μm) | hardness |
| Production Example 33 | N2 | 5 | 0.7 | 1 | P1 | 0.4 | 0.05 | 1 | N8 | 0.6 | 5 | A |
| Production Example 34 | N2 | 5 | 0.7 | 1 | P1 | 0.4 | 0.05 | 1 | N9 | 0.6 | 8 | A |
| Production Example 35 | N2 | 5 | 0.7 | 1 | P1 | 0.4 | 0.05 | 1 | N10 | 0.6 | 15 | B |
| Production Example 36 | N2 | 5 | 0.7 | 1 | P1 | 0.4 | 0.05 | 1 | N11 | 0.3 | 8 | B |

As shown in Table 8, from the comparison between Production Example 34 and Production Example 36, it was found that in a case where the storage elastic modulus of the pressure sensitive adhesive layer 1 was 0.5 MPa or greater, the pencil hardness was improved.

Moreover, from the comparison among Production Examples 33 to 35, it was found that in a case where the thickness of the pressure sensitive adhesive layer 1 was 8 μm or less, the pencil hardness was improved.

EXPLANATION OF REFERENCES

100, 200: Laminate
1: Pressure sensitive adhesive layer 1
2: Light-absorbing anisotropic layer
3: Pressure sensitive adhesive layer 2

4: Surface protective layer
5: Oxygen shielding layer
6: Cured layer
7: Curing-type adhesive layer
8: Optically anisotropic layer
9: Pressure sensitive adhesive layer

What is claimed is:

1. A laminate comprising, in the following order:
a pressure sensitive adhesive layer 1;
a light-absorbing anisotropic layer;
a pressure sensitive adhesive layer 2; and
an optically anisotropic layer,
wherein the light-absorbing anisotropic layer contains an organic dichroic substance,
a thickness of the light-absorbing anisotropic layer is 5 µm or less,
the pressure sensitive adhesive layer 1 and the pressure sensitive adhesive layer 2 are each a pressure sensitive adhesive layer at a closest position as viewed from the light-absorbing anisotropic layer in the laminate, and
H represented by Expression (I) is 10.0 or less, $H$=(thickness of pressure sensitive adhesive layer 1+thickness of pressure sensitive adhesive layer 2)/total thickness of layers on inner side than pressure sensitive adhesive layer 1 and pressure sensitive adhesive layer 2    Expression (I).

2. The laminate according to claim 1,
wherein H represented by Expression (I) is 6.0 or less.
3. The laminate according to claim 1,
wherein H represented by Expression (I) is 4.0 or less.
4. The laminate according to claim 1,
wherein a storage elastic modulus of at least one of the pressure sensitive adhesive layer 1 or the pressure sensitive adhesive layer 2 is 0.1 MPa or greater.
5. The laminate according to claim 4,
wherein the storage elastic moduli of both the pressure sensitive adhesive layer 1 and the pressure sensitive adhesive layer 2 are each 0.1 MPa or greater.
6. The laminate according to claim 4,
wherein the storage elastic modulus of at least one of the pressure sensitive adhesive layer 1 or the pressure sensitive adhesive layer 2 is 0.5 MPa or greater.
7. The laminate according to claim 6,
wherein the storage elastic modulus of the pressure sensitive adhesive layer 1 is 0.5 MPa or greater.
8. The laminate according to claim 6,
wherein the storage elastic moduli of both the pressure sensitive adhesive layer 1 and the pressure sensitive adhesive layer 2 are each 0.5 MPa or greater.
9. The laminate according to claim 1,
wherein the thickness of the pressure sensitive adhesive layer 1 is 8 µm or less.
10. The laminate according to claim 1,
wherein the thickness of the light-absorbing anisotropic layer is 0.8 µm or less.
11. The laminate according to claim 1,
wherein at least one of the pressure sensitive adhesive layer 1 or the pressure sensitive adhesive layer 2 contains a polymer having a repeating unit represented by Formula (A),

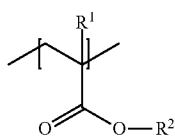

(A)

in Formula (A), $R^1$ represents a hydrogen atom or a methyl group, and $R^2$ represents an alkyl group having 1 to 6 carbon atoms.

12. The laminate according to claim 1,
wherein the pressure sensitive adhesive layer 1, the light-absorbing anisotropic layer, a curing-type adhesive layer, an optically anisotropic layer, and the pressure sensitive adhesive layer 2 are provided in this order.
13. The laminate according to claim 1,
wherein the pressure sensitive adhesive layer 1, an oxygen shielding layer, a cured layer, the light-absorbing anisotropic layer, a curing-type adhesive layer, an optically anisotropic layer, and the pressure sensitive adhesive layer 2 are provided in this order.
14. The laminate according to claim 13,
wherein the pressure sensitive adhesive layer 1, the oxygen shielding layer, the cured layer, the light-absorbing anisotropic layer, the curing-type adhesive layer, the optically anisotropic layer, and the pressure sensitive adhesive layer 2 are adjacently provided in this order.
15. The laminate according to claim 13,
wherein the curing-type adhesive layer is an ultraviolet ray curing-type adhesive layer.
16. The laminate according to claim 1, further comprising:
a surface protective layer which is provided on a side of the pressure sensitive adhesive layer 1 opposite to a side where the light-absorbing anisotropic layer is provided.
17. An image display device comprising:
the laminate according to claim 1; and
an image display element,
wherein the image display element is disposed on a side of the pressure sensitive adhesive layer 2 opposite to a side where the light-absorbing anisotropic layer is provided.
18. The image display device according to claim 17,
wherein the image display element is an organic EL display element.
19. The laminate according to claim 2,
wherein H represented by Expression (I) is 4.0 or less.
20. The laminate according to claim 2,
wherein a storage elastic modulus of at least one of the pressure sensitive adhesive layer 1 or the pressure sensitive adhesive layer 2 is 0.1 MPa or greater.
21. A laminate comprising, in the following order:
a pressure sensitive adhesive layer 1;
a light-absorbing anisotropic layer;
a curing-type adhesive layer;
an optically anisotropic layer; and
a pressure sensitive adhesive layer 2,
wherein the light-absorbing anisotropic layer contains an organic dichroic substance,
a thickness of the light-absorbing anisotropic layer is 5 µm or less,
the pressure sensitive adhesive layer 1 and the pressure sensitive adhesive layer 2 are each a pressure sensitive adhesive layer at a closest position as viewed from the light-absorbing anisotropic layer in the laminate, and
H represented by Expression (I) is 10.0 or less, $H$=(thickness of pressure sensitive adhesive layer 1+thickness of pressure sensitive adhesive layer 2)/total thickness of layers on inner side than pressure sensitive adhesive layer 1 and pressure sensitive adhesive layer 2    Expression (I).

* * * * *